US006751562B1

(12) United States Patent
Blackett et al.

(10) Patent No.: US 6,751,562 B1
(45) Date of Patent: Jun. 15, 2004

(54) COMMUNICATIONS ARCHITECTURE FOR INTELLIGENT ELECTRONIC DEVICES

(75) Inventors: Andrew W. Blackett, Victoria (CA); Bryan J. Gilbert, Victoria (CA); John C. Van Gorp, Sidney (CA); Michael E. Teachman, Victoria (CA); Jeffrey W. Yeo, Saanichton (CA)

(73) Assignee: Power Measurement Ltd. (CA)

( * ) Notice: Subject to any disclaimer, the term of this patent is extended or adjusted under 35 U.S.C. 154(b) by 203 days.

(21) Appl. No.: 09/814,436

(22) Filed: Mar. 22, 2001

Related U.S. Application Data

(63) Continuation-in-part of application No. 09/723,564, filed on Nov. 28, 2000.

(51) Int. Cl.[7] .......................... G06F 19/00; G01R 21/00
(52) U.S. Cl. ..................... 702/61; 340/635; 340/637; 700/286; 700/292
(58) Field of Search ..................... 702/61, 59, 62, 702/65, 188; 700/286, 291, 292, 293, 294, 295; 361/62, 64, 66, 68; 340/870.02, 635, 637, 638, 657

(56) References Cited

U.S. PATENT DOCUMENTS

| | | | |
|---|---|---|---|
| 4,589,075 A | 5/1986 | Buennagel | 364/492 |
| 4,641,248 A | 2/1987 | Suzuki et al. | 364/492 |
| 5,448,229 A | 9/1995 | Lee, Jr. | 340/870.02 |
| 5,459,459 A | 10/1995 | Lee, Jr. | 340/870.02 |
| 5,477,216 A | 12/1995 | Lee, Jr. et al. | 340/870.02 |
| 5,495,239 A | 2/1996 | Ouellette | 340/870.02 |
| 5,517,423 A | 5/1996 | Pomatto | 364/492 |
| 5,572,438 A | 11/1996 | Ehlers et al. | 364/492 |
| 5,576,700 A | 11/1996 | Davis et al. | 340/825.16 |
| 5,680,324 A | 10/1997 | Schweitzer, III et al. | 364/514 |
| 5,699,276 A | 12/1997 | Roos | |

(List continued on next page.)

OTHER PUBLICATIONS

Peterson et al., "Tapping IED Data to Find Transmission Faults", IEEE, Apr. 1999.*

Connect One "Automatic Meter Reading via the Internet", pp. 1–2. Jul. 11, 2001.

iModem™ "The Fastest Way to Internet–Enable any Device", pp. 1–3. Jul. 11, 2001.

ConnectOne™ Connecting your Device to the Internet™ iChip™ The Internet in your palm™, pp. 1–6, Jul. 11, 2001.

Engage Networks Inc. "D–Gen" Distributed Generation Management brochure, pp. 1–4. Link present as of Dec. 2, 1998 according to web archive at http://web.archive.org/web/19981205200934/www.engagenet.com/products.htm.

(List continued on next page.)

*Primary Examiner*—Patrick Assouad
(74) *Attorney, Agent, or Firm*—Brinks Hofer Gilson & Lione

(57) ABSTRACT

A power management architecture for an electrical power distribution system, or portion thereof, is disclosed. The architecture includes multiple intelligent electronic devices ("IED's") distributed throughout the power distribution system to manage the flow and consumption of power from the system. The IED's are linked via a network to back-end servers. Power management application software and/or hardware components operate on the IED's and the back-end servers and inter-operate via the network to implement a power management application. The communications between the IED's and the back-end servers are facilitated through network security devices such as firewalls. The architecture provides a scalable and cost effective framework of hardware and software upon which such power management applications can operate to manage the distribution and consumption of electrical power by one or more utilities/suppliers and/or customers which provide and utilize the power distribution system.

96 Claims, 17 Drawing Sheets

U.S. PATENT DOCUMENTS

| | | | |
|---|---|---|---|
| 5,736,847 A | 4/1998 | Van Doorn et al. | 324/142 |
| 5,764,155 A | 6/1998 | Kertesz et al. | |
| 5,862,391 A | 1/1999 | Salas et al. | |
| 5,897,607 A | 4/1999 | Jenney et al. | |
| 5,963,734 A * | 10/1999 | Ackerman et al. | 703/18 |
| 6,005,759 A * | 12/1999 | Hart et al. | 361/66 |
| 6,035,285 A | 3/2000 | Schlect et al. | |
| 6,088,659 A | 7/2000 | Kelley et al. | |
| 6,115,393 A | 9/2000 | Engel et al. | 370/469 |
| 6,118,269 A | 9/2000 | Davis | |
| 6,167,389 A | 12/2000 | Davis et al. | |
| 6,169,979 B1 | 1/2001 | Johnson | |
| 6,178,362 B1 | 1/2001 | Woolard et al. | 700/295 |
| 6,259,972 B1 * | 7/2001 | Sumic et al. | 700/286 |
| 6,301,527 B1 | 10/2001 | Butland et al. | 700/286 |
| 6,313,752 B1 | 11/2001 | Corrigan et al. | |
| 6,327,541 B1 * | 12/2001 | Pitchford et al. | 702/62 |
| 6,535,797 B1 | 3/2003 | Bowles et al. | 700/286 |
| 6,549,880 B1 | 4/2003 | Willoughby et al. | 703/13 |
| 6,553,418 B1 | 4/2003 | Collins et al. | 709/224 |
| 2001/0010032 A1 | 7/2001 | Ehlers et al. | 702/62 |
| 2001/0039837 A1 | 8/2001 | Carpenter et al. | 705/400 |
| 2002/0010801 A1 * | 1/2002 | Meagher et al. | 709/251 |
| 2002/0077729 A1 | 6/2002 | Anderson | 700/291 |
| 2002/0091784 A1 | 7/2002 | Baker et al. | 709/208 |
| 2002/0116550 A1 | 8/2002 | Hansen | 709/330 |
| 2002/0120723 A1 | 8/2002 | Forth et al. | 709/221 |
| 2002/0161536 A1 | 10/2002 | Suh et al. | 702/62 |
| 2002/0162014 A1 | 10/2002 | Przydatek et al. | 713/200 |
| 2002/0165677 A1 | 11/2002 | Lightbody et al. | 702/62 |
| 2003/0176952 A1 | 9/2003 | Collins et al. | 700/286 |

OTHER PUBLICATIONS

Engage Networks Inc. "Internet Protocol Card for Revenue Meters" brochure, pp. 1–2. Link present as of Mar. 3, 2000 on http:web.archive.org/web/20010306005433/www.engagenet.com/content/products.shtml. Original document archived at http://web.archive.org/web/20030520161648/http://www.engagenet.com/datasheets/ipcard.pdf.

Engage Networks Inc. "AEM" (Active Energy Management) brochure, pp. 1–2. Link present as of Mar. 3, 2000 on http://web.archive.org/web/20010306005433/www.engagenet.com/content/products.shtml. Original document archived at http://www.archive.org/web/20030520161850/http://www.engagenet.com/datasheets/aem.pdf.

Year 2000 Rediness Disclosure Arcom Control Systems, "Apex", obtained at internet address http://www.arcomcontrols.com/products/pcp/pcp10.htm. Document archived at http://web.archive.org/web/20000530063150/www.arcomcontrols.com/products/pcp/pcp10.htm on May 30, 2000.

Dranetz BMI, Signature System™ "Information, Knowledge, Power" brochure. Applicants believe this reference was published prior to Jan. 9, 2003.

Questra A2B.Platform™ brochure, "Enabling conversation through universal connectivity", pp. 1–4, located at http://www.questra.com/h1 products/Questra A2platform. Applicants believe this reference was published prior to Jan. 9, 2003.

Questra A2B.Sales™ brochure, "Conversation to help you win", pp. 1–2, located at http://www.questra.com/h1 products/Questra A2Bsales. Applicants believe this reference was published prior to Jan. 9, 2003.

webGate™ IRIS Technology, products brochure pp. 1–9. Applicants believe this reference was published prior to Jan. 9, 2003.

WebGate™ IRIS™ "Internet Residential Information System," p. 1 of 1 Published in Energy IT Nov./Dec. 2000 Technology Info Center. See http://www.platts.com/infotech/issues/0011/eittic0011.shtml for this reference—search for munet.com.

WebGate™ ICIS1™ "Internet Commercial Information System," p. 1 of 1 published in Energy IT Nov./Dec. 2000 Technology Info Center. See http://www.platts.com/infotech/issues/0011.eittic0011.shtml for this reference—search for munet.com.

F. Momal, C. Pinto–Pereira, "Using World–Wide–Web for Control Systems" Abstract, AT Division CERN, 1211 Geneva 23, 6 pages. Published 1995.

Distributed.Net, http://n0cgi.distributed.net/faq/cache/178.html, printed Jun. 10, 2003. Link archived at http://web.archive.org/web/20000901052607/n0cgi.distributed.net/faq/cache/178.html on Sep. 01,/2000.

Questra, Security overview, obtained http://www.questra.com/products/security.asp, printed Jun. 10, 2003. 2 pages. Applicants believe this reference was published prior Jan. 9, 2003.

Questra Mastering Smart Security brochure, 2 pages Copyright 2002 Questra Corporation, obtained http://www.questra.com/collateral_files/SecurityOverview.pdf, printed Jun. 10, 2003. Applicants believe this reference was published prior to Jan. 9, 2003.

Questra Total Access brochure, 2 pages, Copyright 2003 Questra Corporation, obtained http://www.questra.com/collateral/collateral_files/TotalAccess.pdf, printed Jun. 10, 2003. Applicants believe this reference was published prior to Jan. 9, 2003.

Axeda DRM System Overview, 2 pages, obtained http://www.axeda.com/solutions/overview.html, printed Jun. 9, 2003. Applicants believe this reference was published prior to Jan. 9, 2003.

Axeda Access, 3 pages, obtained http://www.axeda.com/solutions/portals/portal_access.html, printed Jun. 9, 2003. Applicants believe this reference was published prior Jan. 9, 2003.

Axeda DRM Technology Overview, 1 page, obtained http://www.axeda.com/solutions/tech_challenges/firewallfriendly.html, printed Jun. 9, 2003. Applicants believe this reference was published prior to Jan. 9, 2003.

Axeda DRM Technology Overview, 1 page, obtained http://www.axeda.com/solutions/tech_challenges/index.html, printed Jun. 9, 2003. Applicants believe this reference was published prior to Jan. 9, 2003.

Axeda DRM Technology Overview, 1 page, obtained http://www.axeda.com/solutions/tech_challenges/standards.html, printed Jun. 9, 2003. Applicants believe this reference was published prior to Jan. 9, 2003.

Axeda Solutions for Industry, 1 page, obtained http://www.axeda.com/solutions/industries/industrial.html, printed Jun. 9, 2003. Archived at http://web.archive.org/web/20020221165907/http://axeda.com/industries/industrial.html on Feb. 21, 2002.

Axeda Agents, 2 pages, obtained http://www.axeda.com/solutions/device_servers/index.html, printed Jun. 9, 2003. Applicants believe this reference was published prior Jan. 9, 2003.

Axeda Case Studies, "Axeda Prevents Power Failures at a Leading Microprocessor Plant in Israel", 2 pages, obtained http://www.axeda.com/industies/casestudies_microprocessor.html, printed Jun. 9, 2003. Applicants believe this reference was published prior Jan. 9, 2003.

F. Momal, C. Pinto–Pereira, "Using World–Wide–Web for Control Systems" Abstract, AT Division CERN, 1211 Geneva 23, 6 pages.

P. M. Corcoran, J. Desbonnet and K. Lusted THPM 14.2 "CEBus Network Access via the World–Wide–Web" Abstract, ©1996 IEEE, pp. 236 & 237.

ATI Systems, "Technical Overview Ethernet SCAN II™ Module" specification, Oct. 1994, 2 pages.

J. Hofman, "The Consumer Electronic Bus: An Integrated Multi–Media LAN for the Home", International Journal of Digital and Analog Communication Systems, vol. 4, 77–86 (1991), ©1991 by John Wiley & Sons, Ltd.

Lucent Technologies AT&T Forms Expert Team to Design Utility Industry Solutions, press release, Monday, Jan. 23, 1995, pp. 1&2.

Newsbytes Inc., Tampa, FLA, Apr. 13, 1995 pNEW04130013 "TECO & IBM—The "Smart House" Is Here" Press release, obtained at http://filebox.vt.edu/users/mikemike/smart–house/infotrac/article4.txt, Jul. 11, 2002, pp. 1&2.

Questra Applications Summary Data Sheet, pp. 1–2, Jul. 2, 2002.

Tridium™ Vykon™ Energy "JACE–401™" Product Data Sheet, pp. 1–2, Sep. 16, 2002.

Tridium™ "Vykon1™ Energy Profiler" Product Data Sheet, pp. 1–4, Oct. 16, 2001.

Schneider Electric Square D "Web–Enabled Power Management Solutions" brochure, pp. 1–8, Jan. 2002.

Tridium™ Vykon™ Building "Vykon™ Alarm Service" Product Data Sheet, pp. 1–2, Jun. 20, 2002.

Tridium™ Vykon™ Building "JACE–512™" Product Data Sheet, pp. 1–2, May 15, 2002.

Tridium™ Vykon™ Building "JACE–511™" Product Data Sheet, pp. 1–2, May 28, 2002.

Vykon™ By Tridium "JACE–NP–1®" Product Data Sheet, pp. 1–2, May 28, 2002.

Vykon™ By Tridium "WorkPlace Pro™" Product Data Sheet, pp. 1–2, Jan. 12, 2001.

Vykon™ Building "Web Supervisor™" Product Data Sheet, pp. 1–2, Nov. 30, 2001.

A8800–1 AcquiSuite Data Acquisition System specification, pp. 1–2, Sep. 24, 2001.

LiveData® Real–Time Data Management For Energy and Utility Companies brochure, pp. 1–4, ©copyright 2002, Rev. Jan. 2002.

Tridium™ Vykon™ Energy "With the Right Tools Energy Costs are Controllable . . . " brochure, pp. 1–8, Nov. 1, 2001.

EnergyView™ "Energy Aggregation & Information System (EAIS) for Monitoring and Analysis of Electric and Gas Demand", selected pages from an EnergyView website http://66.64.38.69/energyview, pp. 1–4, Oct. 30, 2001.

Power Monitoring home page, obtained from http://www/parijat.com/Power_Monitoring.htm, Oct. 9, 2002. one page.

Electro Industries Press Release "Nexus 1250 High–Performance Power Monitor Gains Ethernet TCP/IP Capabilities," obtained at internet address http://www.electroindustries.com/feb5.html, Feb. 5, 2001 pp. 1–2.

Electro Industries "Nexus 1250 for Industry and Utilities," brochure, obtained at internet address http://www.electroindustries.com/pdf/nxsbrochure.pdf pp. 1–14 printed Jun. 1, 2001.

NetSilicon Solutions on Chip "Net+Arm™ Ethernet Processors" brochure, obtained at internet address http://www.netsilicon.com/EmbWeb/products/netarm.asp, pp. 1–2, Copyright© 2001 NetSilicon, Inc.

EmWare® "Solutions Device Link," brochure, obtained at internet address http://www.emware.com/solutions/devicelink/, pp. 1–3, printed Jun. 1, 2001.

IReady® "Technology iReady's Hardwired TCP/IP Stack," homepage, obtained at internet address http://www.iready.com/, p. 1, ©2000–2001 iReady corporation, printed Jun. 1, 2001.

muNet News & Events Press Release "muNet makes cable industry debut with its WebGate™ Internet Residential and Commercial Information Systems, and HomeHeartBeat", http://www.munet.com, pp. 1–2, Dec. 15, 1999.

muNet News & Events Press Releases "muNet's WebGate™ Systems Finds a Home on the Internet!" http://www.munet.com, pp. 1–2, Mar. 18, 1999.

MuNet News & Events Press Release "muNet Demonstrates End–to–Enc IP–Based Energy Management System at DistribuTECH," Feb. 5, 2000, pp. 1–2.

Press Release 24 Aug. 2000 "Connect One Announces Industry's First Wireless Chip to Connect Mobile Devices to the Internet", pp. 1–2.

Press Release, "Connect One and NAMS Create the World's First Dial–up Energy Meter that Sends and Receives E–Mail Without a Gateway", Sep. 5, 2000, pp. 1–2.

NAMS Metals by Nisko, NMM–AKB Specifications p 1 of 1, Sep. 5, 2000.

Engage Networks Launches Energy Management Venture, obtained at internet address http://www.engagenet.com/content/business_journal.shtml, Sep. 9, 2000.

David W. Giles, "Direct–Access Metering Via the Web", 1998 CEA Conference, Toronto, Canada, pp. 1–19, ©1998 Power Measurement Ltd.

GE Industrial Systems "EnerVista.com" brochure, Sep. 2000.

Press release, Santa Clara, CA Sep. 25, 2000 "Connect One Reduces Time, Cost and Complexity to Connect Internet Appliances to Ethernet Lans", obtained at internet address http://www.connectone.com/html/prlsep25_2000.htm.

Signature System™ Basics, obtained at internet address http://www.signaturesystem.com/sigbasics.html, Mar. 26, 2001, pp. 1–2.

Signature System™ InfoNodes, obtained at internet address http://www.signaturesystem.com/infonode.html, Mar. 26, 2001. pp. 1–2.

Power Point Presentation: Presented at "Metering Europe 2000," Sep. 5–7, 2000, source http://www.energyict.com/fh/media/Presentation_Metering2000Munchen5.zip, pp. 1–37.

Brochure, RTU+Server, source http://www.energyict.com/fh/media/tru_plus_server.pdf, pp. 1–3, Apr. 6, 2001.

Brochure, EiServer, The Energy Information server, source http://www.energyict.com/fh/media/EiServer.pdf, pp. 1–7, Jul. 14, 2000.

Advertisement, EiServer and RTU+Server, source, Metering International—2001 Issue 1, p. 19, published date $1^{st}$ Quarter 2001, p. 1.

Article, "Providing Tomorrow's Energy Management and Metering Tools Today," source, Metering International—2001 Issue 1, p. 18, publish date $1^{st}$ Quarter 2001, p. 1.

David Mueller and Sandy Smith, Electrotek Concepts, "Using Web–based Power Quality Monitoring for Problem Solving and Improving Customer Relations". proceedings of the $4^{th}$ Annual Latin American Power 99 Conference, Jun. 29, 1999, pp. 263–271.

* cited by examiner

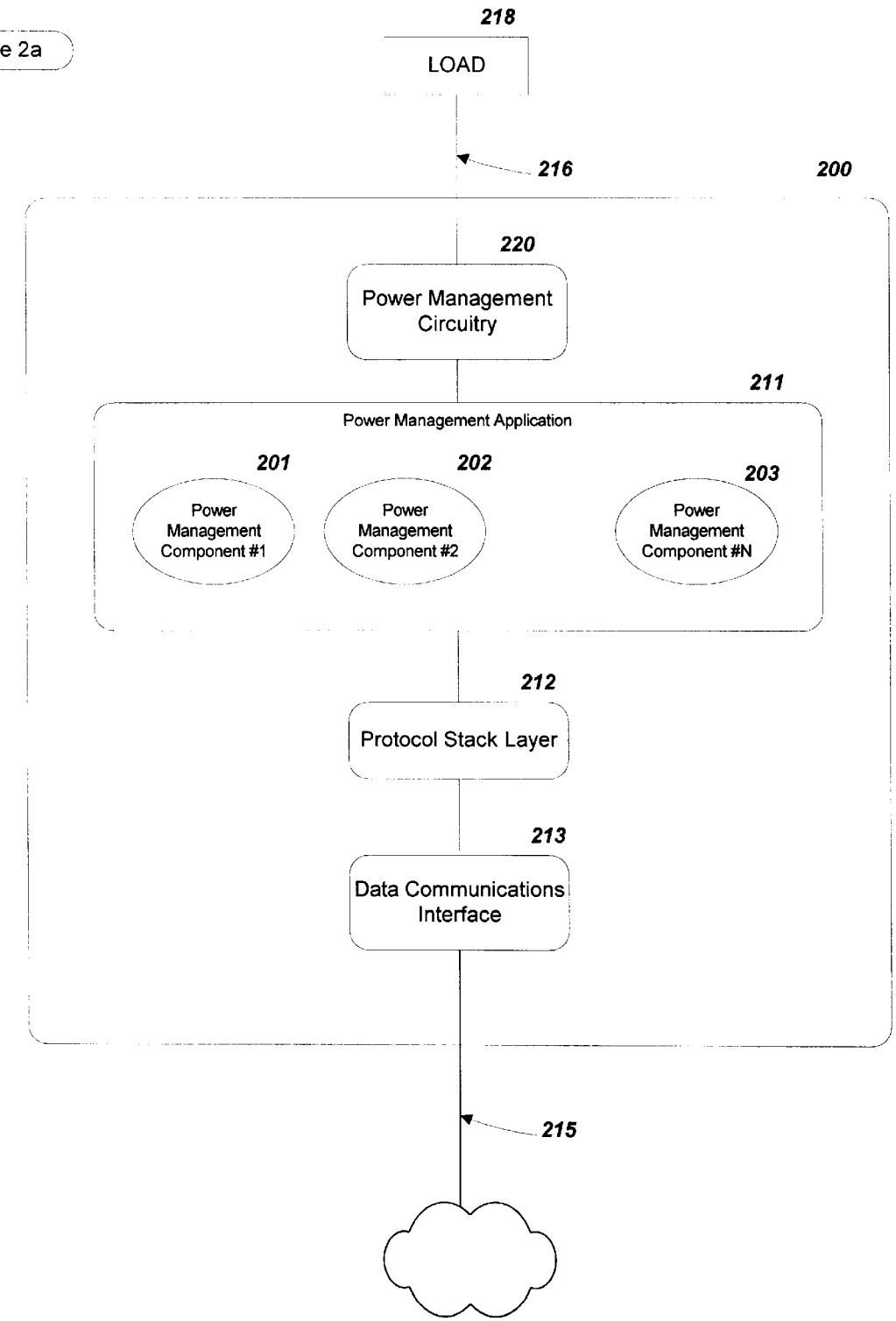

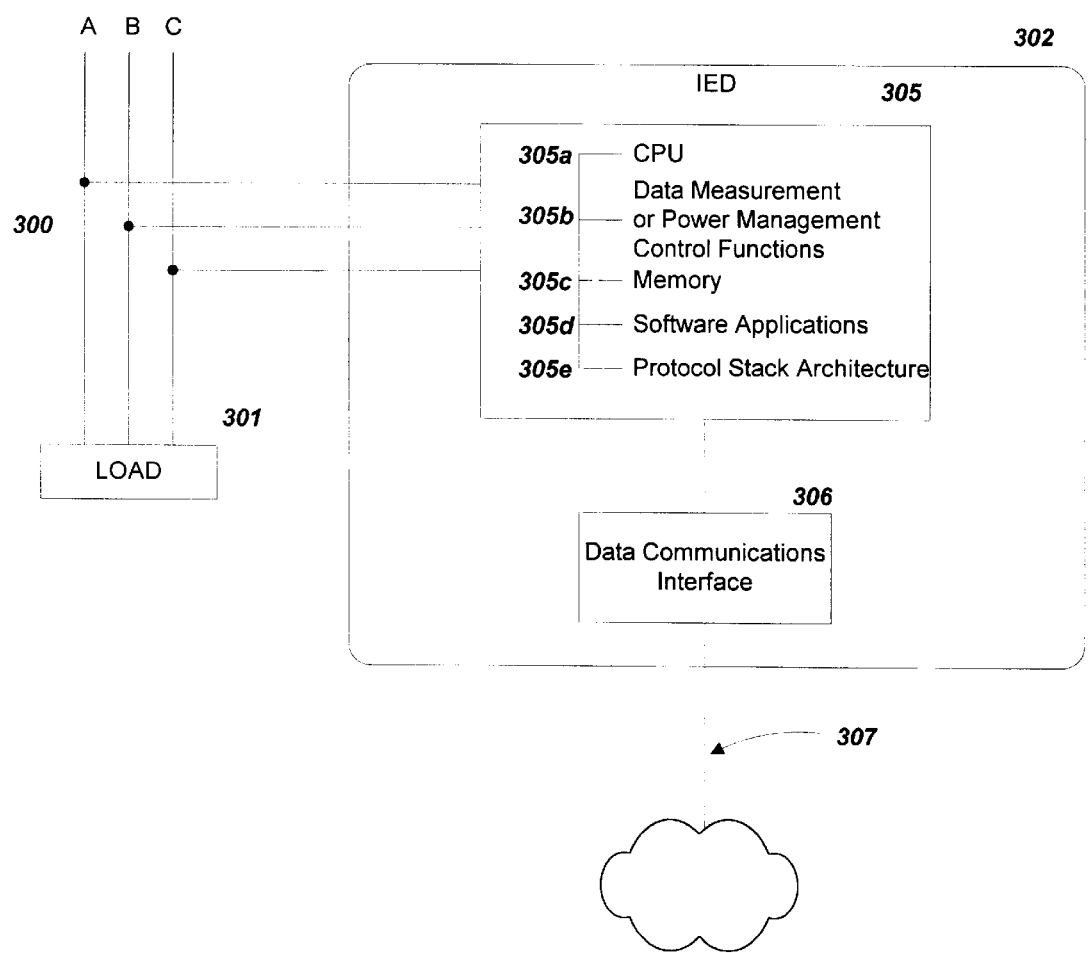

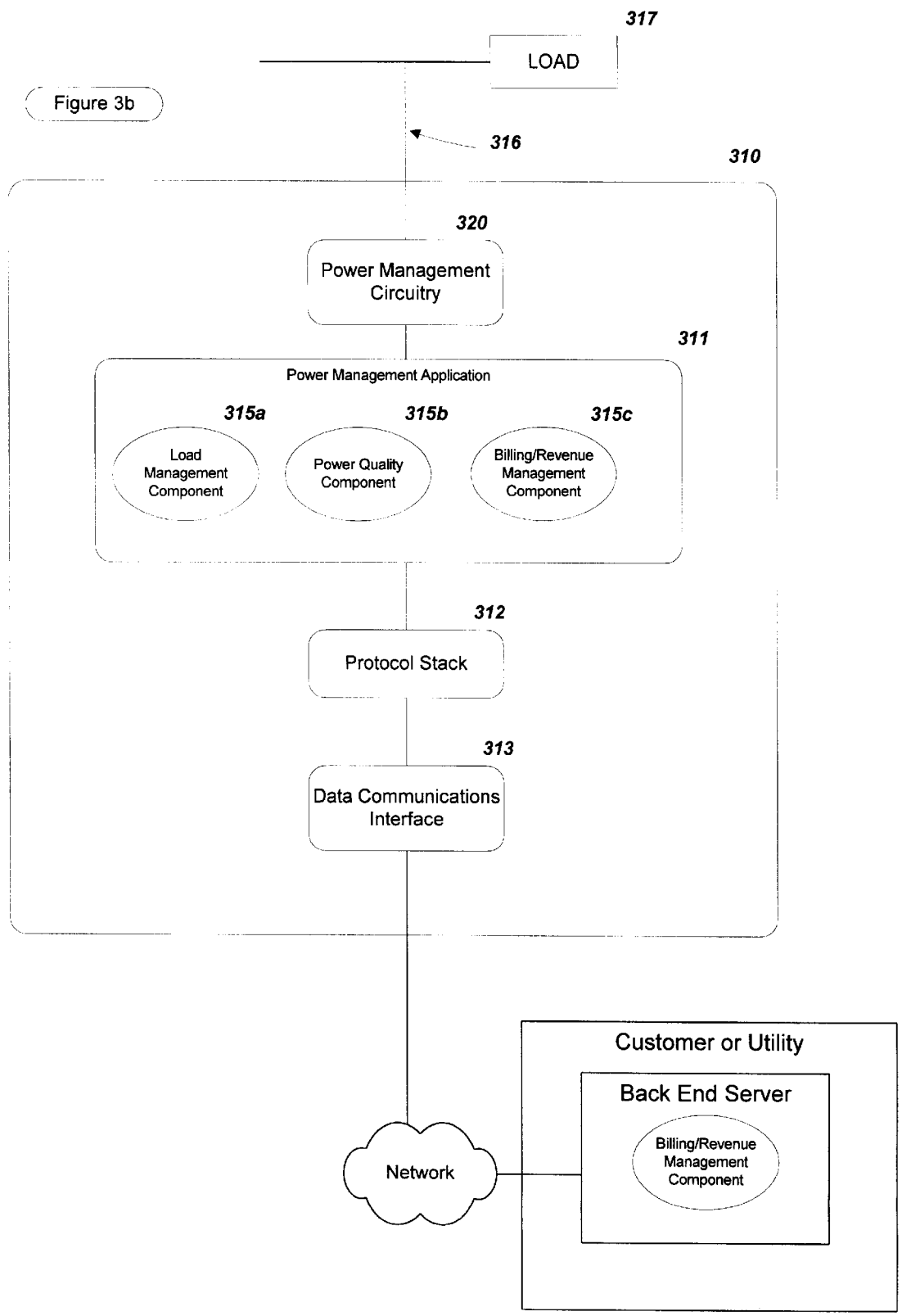

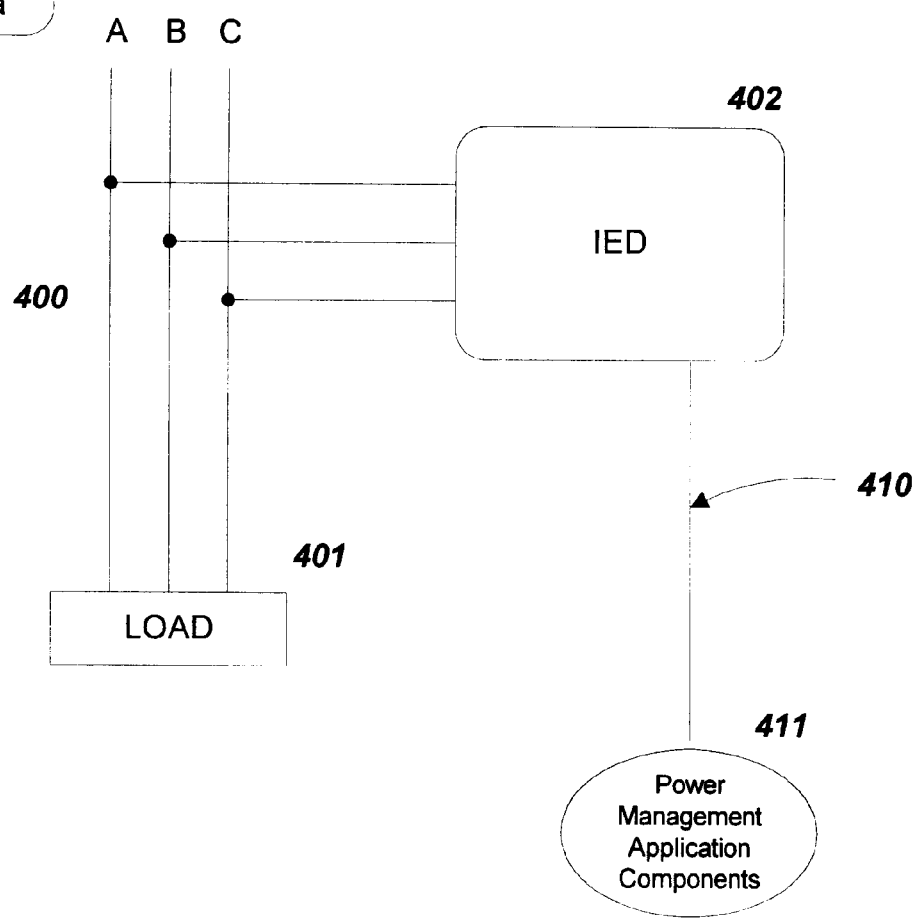

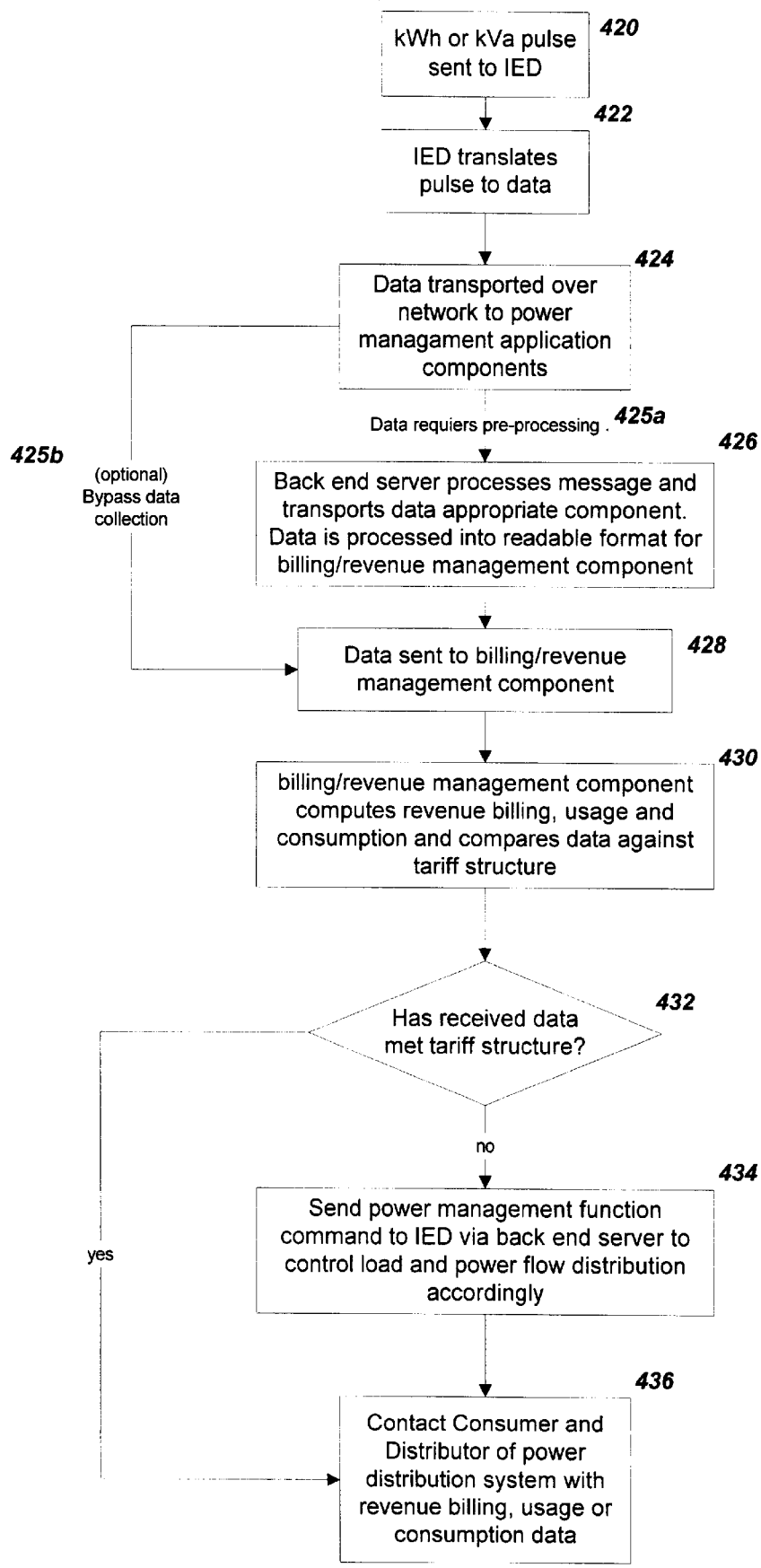

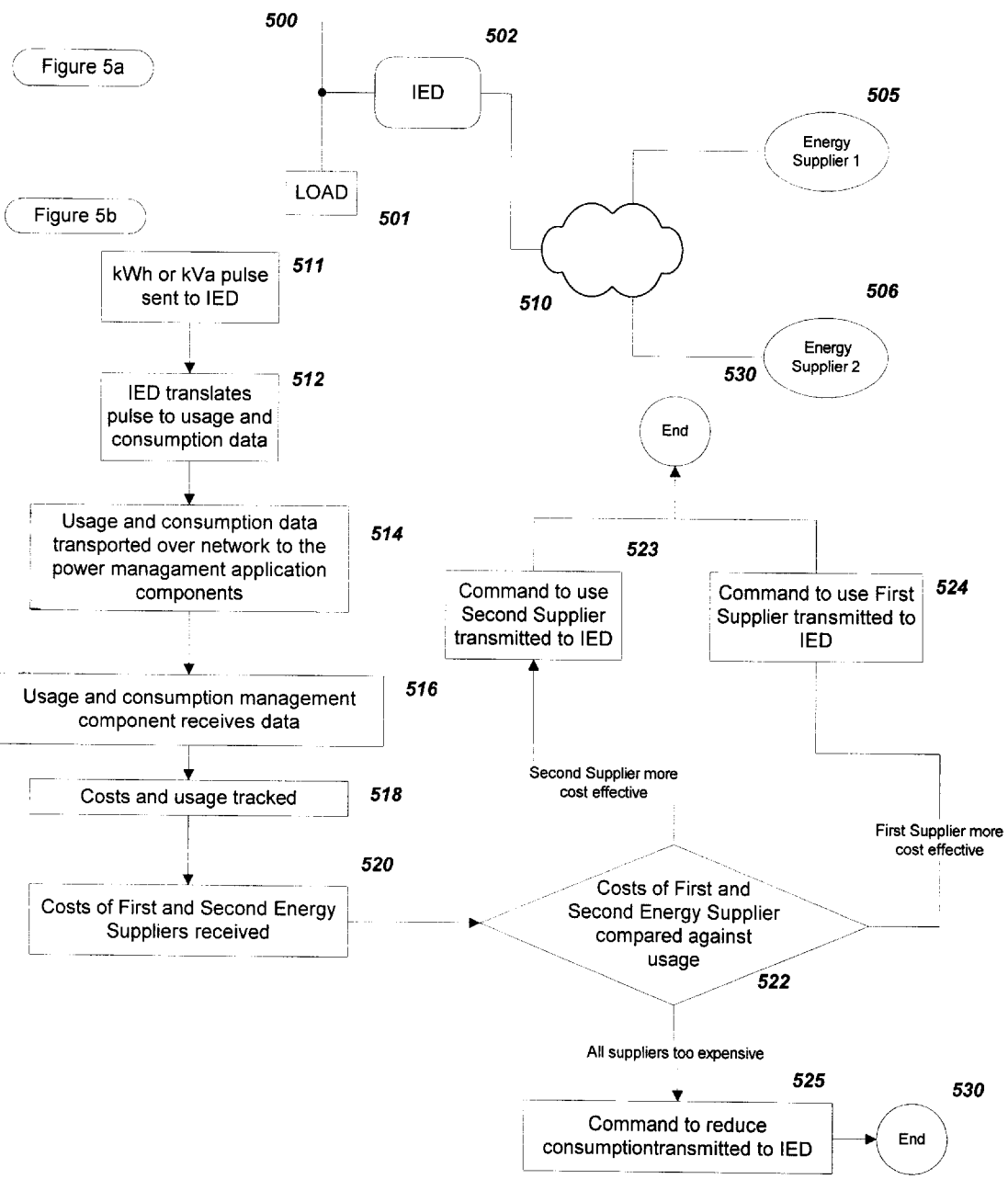

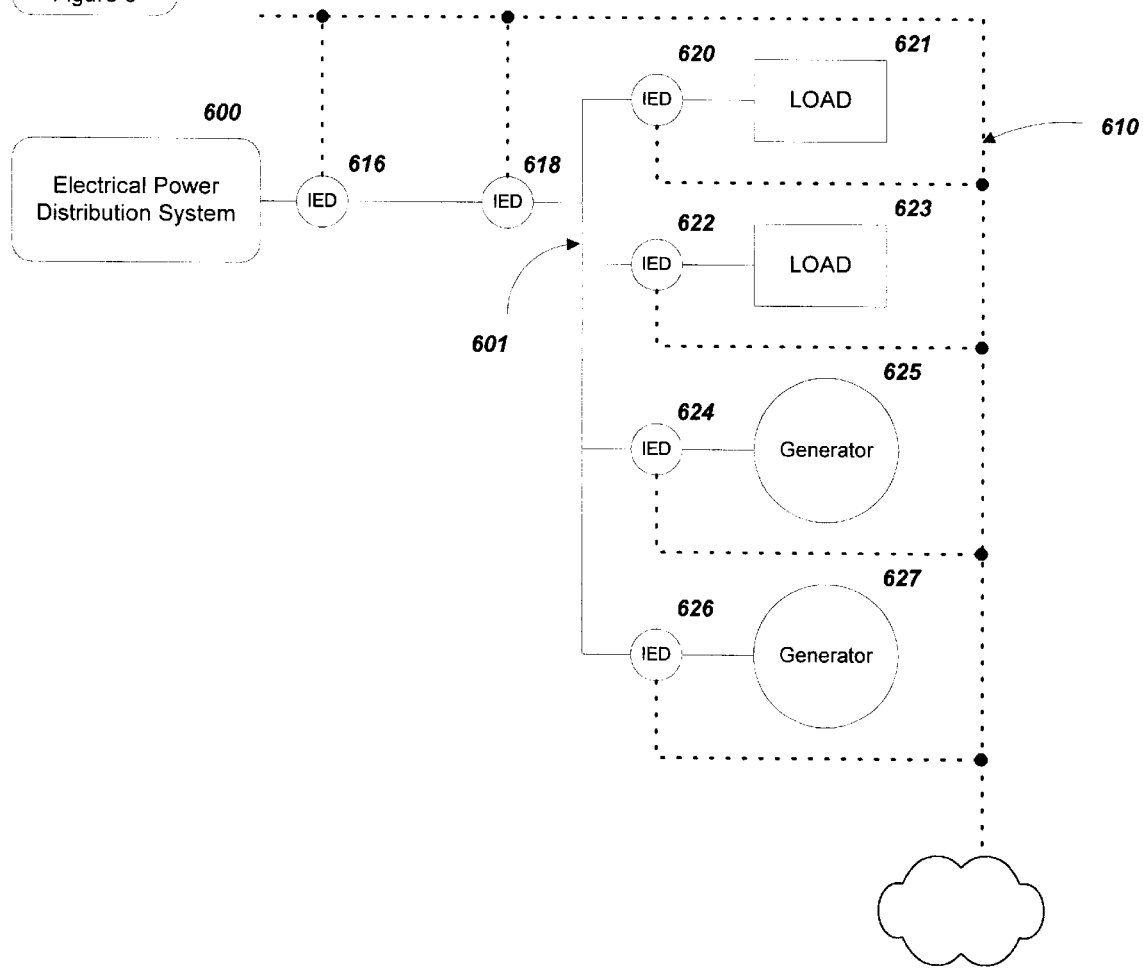

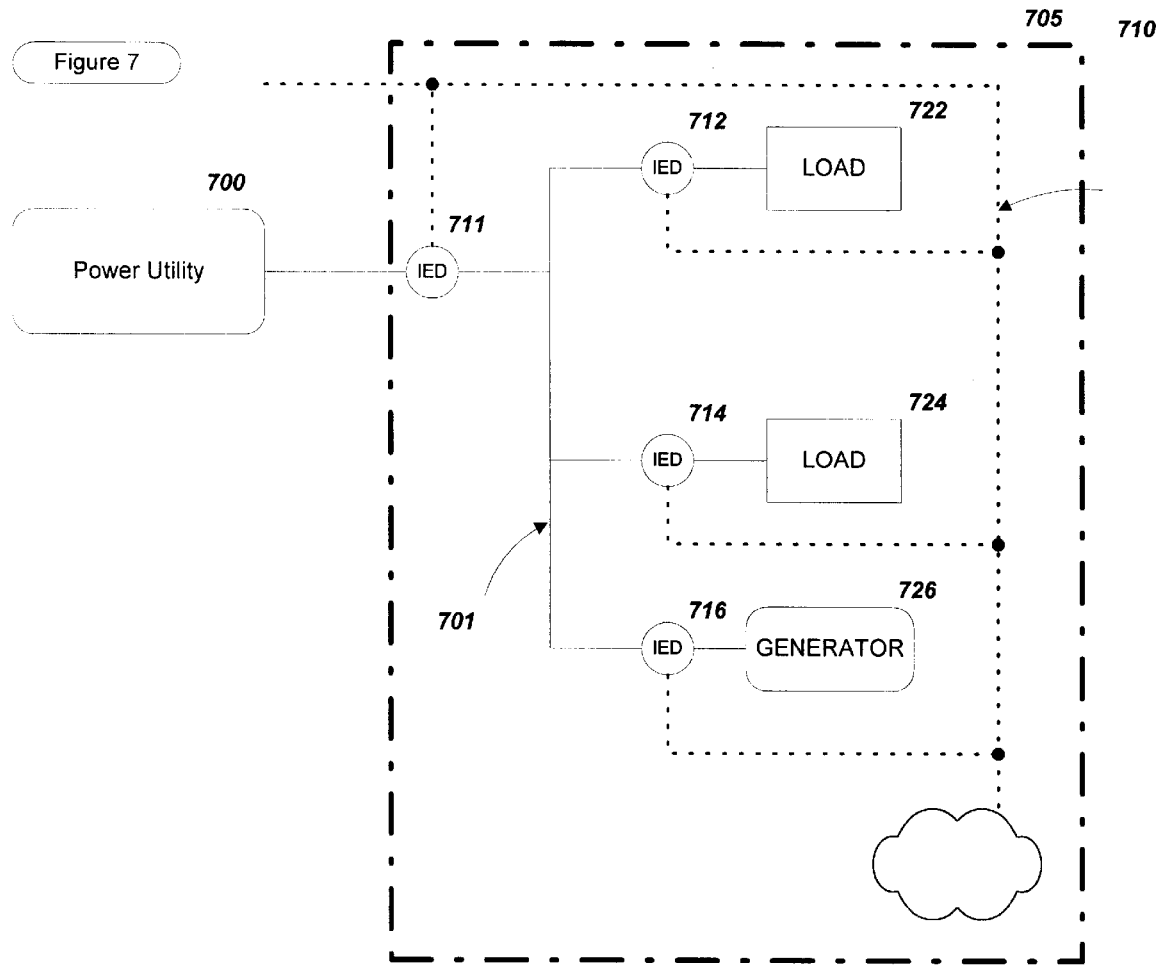

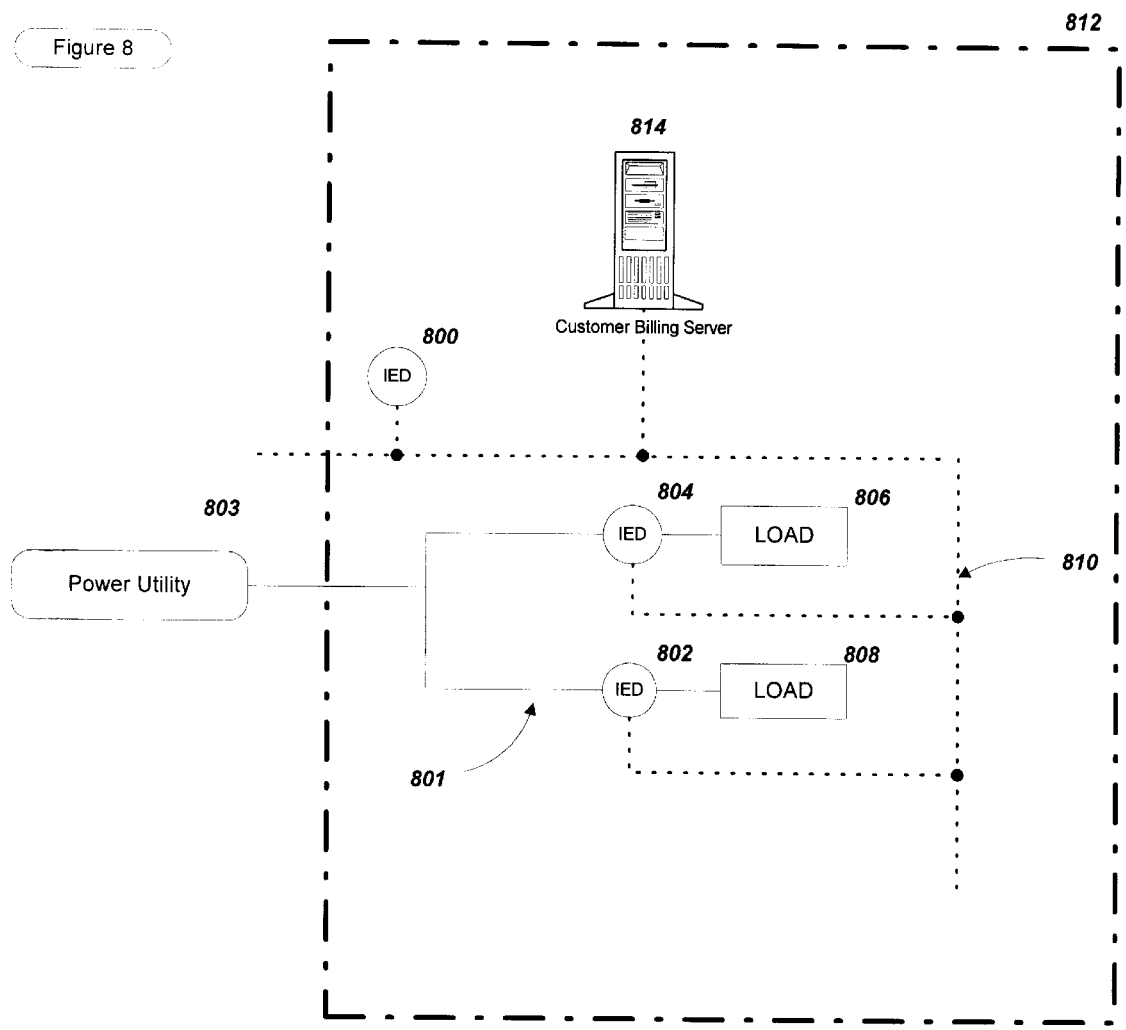

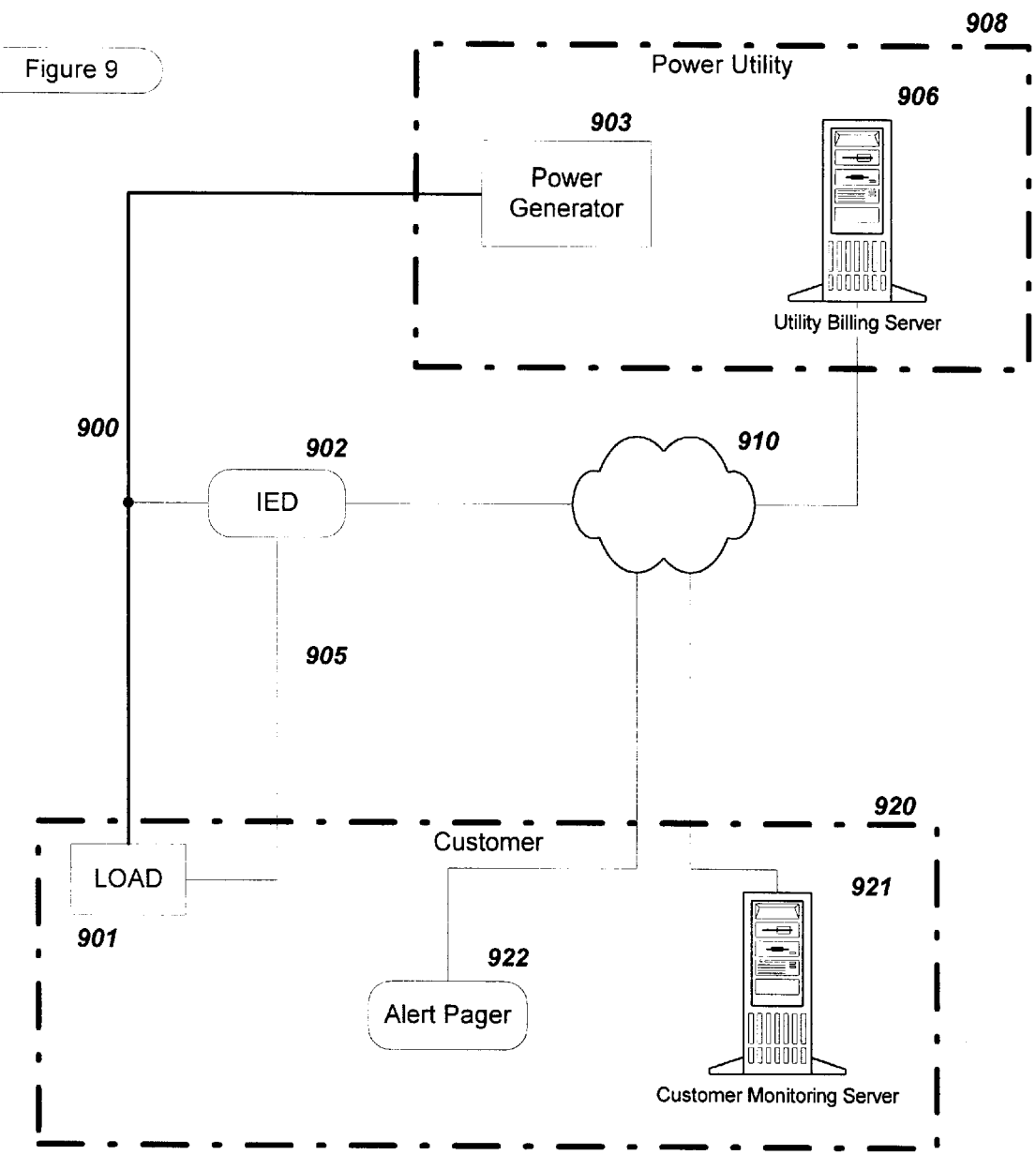

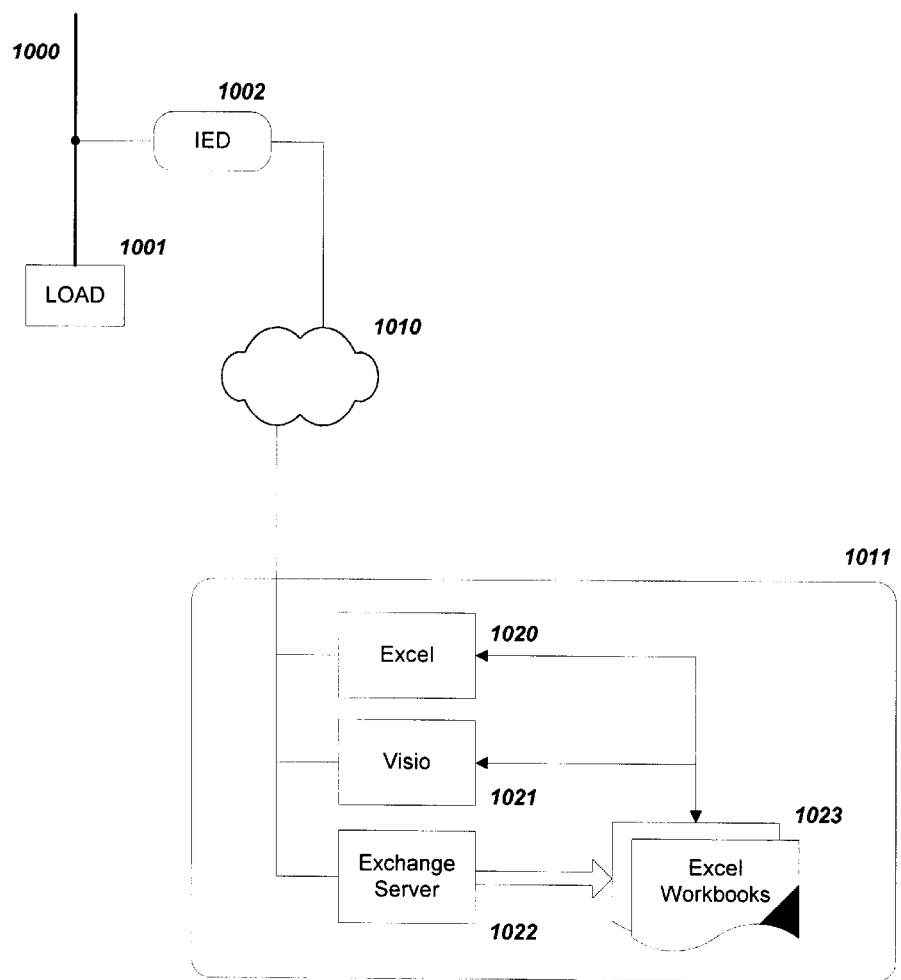

Figure 11

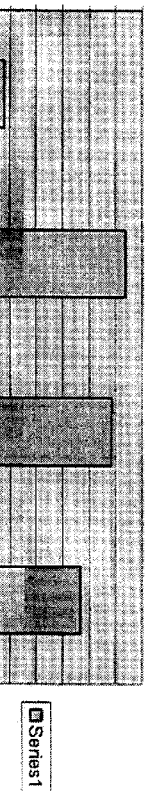

Site1.a8500

Default Diagram

| LABEL | VALUE |
|---|---|
| I a | 197.97 |
| I b | 207.52 |
| I c | 237.82 |
| Vin c | 479.28 |
| Vin b | 371.46 |
| Vll ca | 580.46 |
| Vll ab | 589.1 |
| Vll bc | 586.28 |
| Vll avg | 585.28 |
| Vin avg | 357.23 |
| I avg | 214.44 |
| PF sign tot | -.94 |
| Freq | 59 |
| CL1 LocalTime | 08:32.9 |

Sum of Currents: 643.31

Formula-based Setpoint: OVER 550 Volts

Change Update Rate
Type in the number of seconds you would like between page updates and hit <RETURN>    10

Some features to implement:
Auto-detection: Excel could automatically add a worksheet (a "tab" below) when it detects a new device on the network
Complex Aggregation: Because it is Excel, you can do anything you want, easily
Logging: You could write simple scripts to log the values on the left to an Access DB
Animation: Charts, warnings, etc
Onboard logs could be displayed easily
Default diagrams: we just need to create an excel template for each device

GRAPHICAL VOLTAGES

COMMUNICATIONS ARCHITECTURE FOR INTELLIGENT ELECTRONIC DEVICES

RELATED APPLICATIONS

This application is a continuation-in-part under 37 C.F.R. §1.53(b) of U.S. patent application Ser. No. 09/723,564 filed Nov. 28, 2000, the entire disclosure of which is hereby incorporated by reference. U.S. patent application Ser. No. 09/723,564 filed Nov. 28, 2000 is a continuation-in-part under 37 C.F.R. §1.53(b) of U.S. patent application Ser. No. 08/798,723 filed Feb. 12, 1997, abandoned, the entire disclosure of which is hereby incorporated by reference, which is a continuation-in-part under 37 C.F.R. §1.53(b) of U.S. patent application Ser. No. 08/369,849 filed Dec. 30, 1994 now U.S. Pat. No. 5,650,936, the entire disclosure of which was incorporated by reference.

BACKGROUND

With the advent of high technology needs and market deregulation, today's energy market has become very dynamic. High technology industries have increased their demands on the electrical power supplier, requiring more power, increased reliability and lower costs. A typical computer data center may use 100 to 300 watts of energy per square foot compared to an average of 15 watts per square foot for a typical commercial building. Further, an electrical outage, whether it is a complete loss of power or simply a drop in the delivered voltage, can cost these companies millions of dollars in down time and lost business.

In addition, deregulation of the energy industry is allowing both industrial and individual consumers the unprecedented capability to choose their supplier which is fostering a competitive supply/demand driven market in what was once a traditionally monopolistic industry.

The requirements of increased demand and higher reliability are burdening an already overtaxed distribution network and forcing utilities to invest in infrastructure improvements at a time when the deregulated competitive market is forcing them to cut costs and lower prices. Accordingly, there is a need for a system of managing the distribution and consumption of electrical power which meets the increased demands of users and allows the utility supplier to compete in a deregulated competitive marketplace.

SUMMARY

The present invention is defined by the following claims, and nothing in this section should be taken as a limitation on those claims. By way of introduction, the preferred embodiments described below relate to an electrical power management architecture comprising at least one intelligent electronic device ("IED") coupled with a portion of an electrical power system and further coupled with an internal network. The architecture further includes a firewall, the firewall operative to securely couple an external network with the internal network. In addition, the architecture includes a network interface operative to couple the IED with the internal network and facilitate a communications, initiated by the IED, of first power management data through the firewall from the internal network to the external network.

The preferred embodiments further relate to a method of communicating power management data in an electrical power management architecture between an internal network and an external network, the internal network being coupled with the external network by a firewall. The method comprises: monitoring a portion of an electrical power distribution system with at least one intelligent electronic device ("IED"), the at least one IED further being coupled with the internal network; generating power management data by the at least one IED corresponding to said monitoring; initiating a first communications of the power management data to a receiver, said receiver being coupled with the external network; and facilitating the initiated first communications through the firewall to the external network for delivery to the receiver.

Further aspects and advantages of the invention are discussed below in conjunction with the preferred embodiments.

BRIEF DESCRIPTION OF THE DRAWINGS

FIG. 2a illustrates an IED, for use with the embodiment of FIG. 1, containing several power management components.

FIG. 3a illustrates an IED, for use with the embodiment of FIG. 1, connected to a power system.

FIG. 3b illustrates the internal components of an IED for use with the embodiment of FIG. 1.

FIG. 4a illustrates an IED, for use with the embodiment of FIG. 1, coupled with power management components.

FIG. 4b illustrates the use of a power management application component.

FIG. 5a illustrates a preferred embodiment with multiple energy suppliers.

FIG. 5b illustrates a preferred method of managing multiple suppliers for use with the embodiment of FIG. 1.

FIG. 6 illustrates a second embodiment using a distributed power management component.

FIG. 7 illustrates a third embodiment using a power reliability component.

FIG. 8 illustrates a fourth embodiment using a peer to peer component.

FIG. 9 illustrates an IED, for use with the embodiment of FIG. 1, transmitting data to multiple recipients.

FIG. 10 illustrates a monitoring server, for use with the embodiment of FIG. 1, receiving data from an IED.

FIG. 11 illustrates an exemplary display generated by the embodiment of FIG. 10.

DETAILED DESCRIPTION OF THE PRESENTLY PREFERRED EMBODIMENTS

Figure 1:
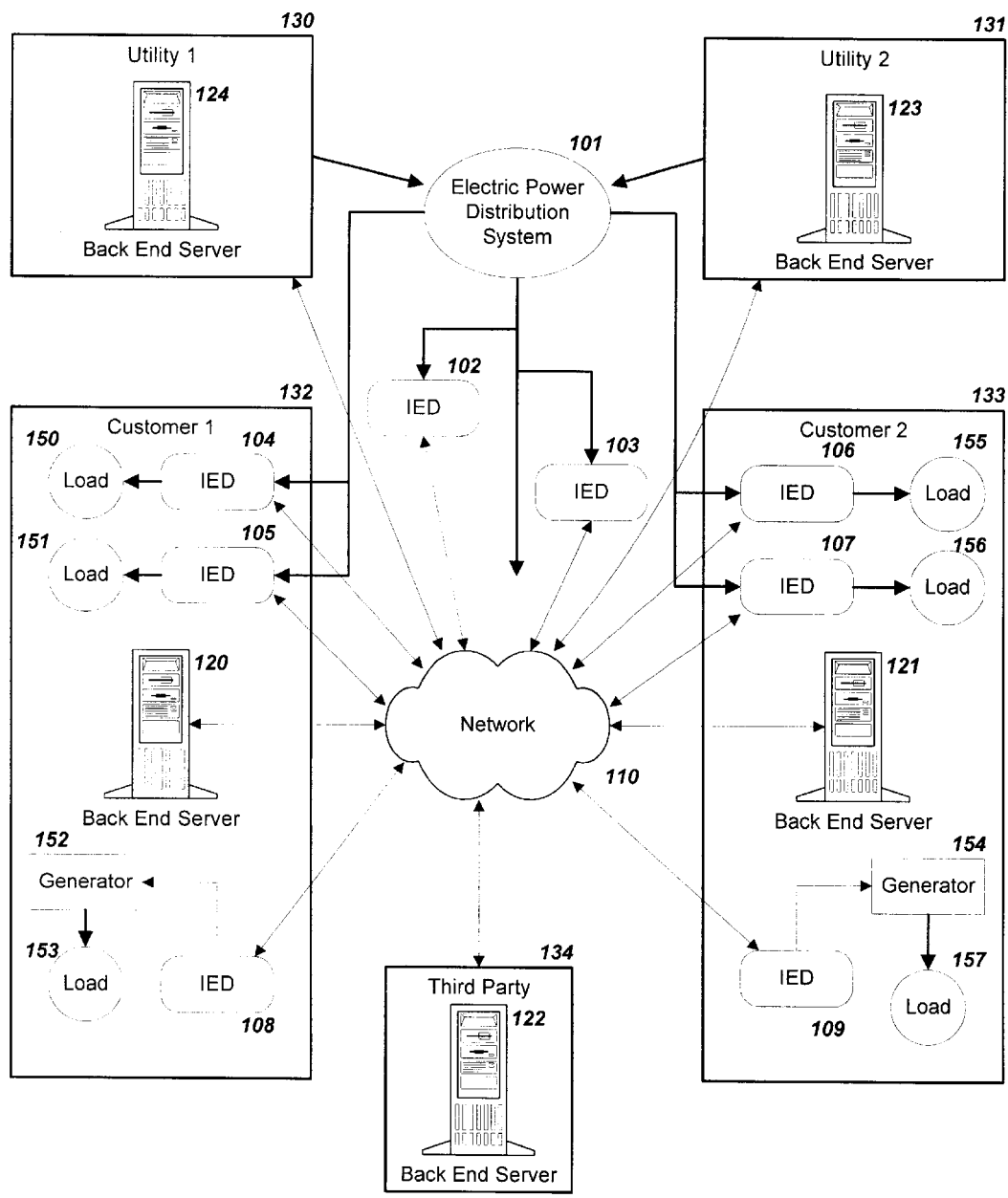
FIG. 1 illustrates a first embodiment of the Power Management Architecture.

Intelligent electronic devices ("IED's") such as programmable logic controllers ("PLC's"), Remote Terminal Units ("RTU's"), electric/watt hour meters, protection relays and fault recorders are widely available that make use of memory and microprocessors to provide increased versatility and additional functionality. Such functionality includes the ability to communicate with remote computing systems, either via a direct connection, e.g. modem or via a network. For more detailed information regarding IED's capable of network communication, please refer to U.S. patent application Ser. No. 08/798,723, captioned above. In particular, the monitoring of electrical power, especially the measuring and calculating of electrical parameters, provides valuable information for power utilities and their customers. Monitoring of electrical power is important to ensure that the electrical power is effectively and efficiently generated, distributed and utilized. Various different arrangements are presently available for monitoring, measuring, and controlling power parameters. Typically, an IED, such as an individual power measuring device, is placed on a given branch or line proximate to one or more loads which are coupled with the branch or line in order to measure/monitor power system parameters. Herein, the phrase "coupled with" is defined to mean directly connected to or indirectly connected with through one or more intermediate components. Such intermediate components may include both hardware and software based components. In addition to monitoring power parameters of a certain load(s), such power monitoring devices have a variety of other applications. For example, power monitoring devices can be used in supervisory control and data acquisition ("SCADA") systems such as the XA/21 Energy Management System manufactured by GE Harris Energy Control Systems located in Melbourne, Fla.

In a typical SCADA application, IED's/power measuring devices individually dial-in to a central SCADA computer system via a modem. However, such dial-in systems are limited by the number of inbound telephone lines to the SCADA computer and the availability of phone service access to the IED/power measuring devices. With a limited number of inbound telephone lines, the number of IED's/power measuring devices that can simultaneously report their data is limited resulting in limited data throughput and delayed reporting. Further, while cellular based modems and cellular system access are widely available, providing a large number of power measuring devices with phone service is cumbersome and often cost prohibitive. The overall result is a system that is not easily scalable to handle a large number of IED's/power measuring devices or the increased bandwidth and throughput requirements of advanced power management applications. However, the ability to use a computer network infrastructure, such as the Internet, allows for the use of power parameter and data transmission and reporting on a large scale. The Internet provides a connectionless point to point communications medium that is capable of supporting substantially simultaneous communications among a large number of devices. For example this existing Internet infrastructure can be used to simultaneously push out billing, load profile, or power quality data to a large number of IED/power measurement and control devices located throughout a power distribution system that can be used by those devices to analyze or make intelligent decisions based on power consumption at their locations. The bandwidth and throughput capabilities of the Internet supports the additional requirements of advanced power management applications. For example, billing data, or other certified revenue data, must be transferred through a secure process which prevents unauthorized access to the data and ensures receipt of the data by the appropriate device or entity. Utilizing the Internet, communications can be encrypted such as by using encrypted email. Further, encryption authentication parameters such as time/date stamp or the IED serial number, can be employed. Within the Internet, there are many other types of communications applications that may be employed to facilitate the above described inter-device communications such as email, Telnet, file transfer protocol ("FTP"), trivial file transfer protocol ("TFTP") or proprietary systems, both unsecured and secure/encrypted.

As used herein, Intelligent electronic devices ("IED's") include Programmable Logic Controllers ("PLC's"), Remote Terminal Units ("RTU's"), electric power meters, protective relays, fault recorders and other devices which are coupled with power distribution networks to manage and control the distribution and consumption of electrical power. Such devices typically utilize memory and microprocessors executing software to implement the desired power management function. IED's include on-site devices coupled with particular loads or portions of an electrical distribution system and are used to monitor and manage power generation, distribution and consumption. IED's are also referred herein as power management devices ("PMD's").

A Remote Terminal Unit ("RTU") is a field device installed on an electrical power distribution system at the desired point of metering. It is equipped with input channels (for sensing or metering), output channels (for control, indication or alarms) and a communications port. Metered information is typically available through a communication protocol via a serial communication port. An exemplary RTU is the XP Series, manufactured by Quindar Productions Ltd. in Mississauga, Ontario, Canada.

A Programmable Logic Controller ("PLC") is a solid-state control system that has a user-programmable memory for storage of instructions to implement specific functions such as Input/output (I/O) control, logic, timing, counting, report generation, communication, arithmetic, and data file manipulation. A PLC consists of a central processor, input/output interface, and memory. A PLC is designed as an industrial control system. An exemplary PLC is the SLC 500 Series, manufactured by Allen-Bradley in Milwaukee, Wis.

A meter, is a device that records and measures power events, power quality, current, voltage waveforms, harmonics, transients and other power disturbances. Revenue accurate meters ("revenue meter") relate to revenue accuracy electrical power metering devices with the ability to detect, monitor, report, quantify and communicate power quality information about the power which they are metering. An exemplary meter is the model 8500 meter, manufactured by Power Measurement Ltd, in Saanichton, B.C. Canada.

A protective relay is an electrical device that is designed to interpret input conditions in a prescribed manner, and after specified conditions are met, to cause contact operation or similar abrupt change in associated electric circuits. A relay may consist of several relay units, each responsive to a specified input, with the combination of units providing the desired overall performance characteristics of the relay. Inputs are usually electric but may be mechanical, thermal or other quantity, or a combination thereof. An exemplary relay is the type N and KC, manufactured by ABB in Raleigh, N.C.

A fault recorder is a device that records the waveform and digital inputs, such as breaker status which resulting from a fault in a line, such as a fault caused by a break in the line. An exemplary fault recorder is the IDM, manufactured by Hathaway Corp in Littleton, Colo.

IED's can also be created from existing electromechanical meters or solid-state devices by the addition of a monitoring and control device which converts the mechanical rotation of the rotary counter into electrical pulses or monitors the pulse output of the meter. An exemplary electromechanical meter is the AB1 Meter manufactured by ABB in Raleigh, N.C. Such conversion devices are known in the art.

This invention describes a communications architecture that can be used for monitoring, protection and control of devices and electrical power distribution in an electrical power distribution system, where IED's can interact with other IED's and attached devices.

As will be described in more detail below, a power management architecture for an electrical power distribution system, or portion thereof, is disclosed. The architecture provides a scalable and cost effective framework of hardware and software upon which power management applications can operate to manage the distribution and consumption of electrical power by one or more utilities/suppliers and/or customers which provide and utilize the power distribution system.

Power management applications include automated meter reading applications, load shedding applications, deregulated supplier management applications, on-site power generation management applications, power quality management applications, protection/safety applications, and general distribution system management applications, such as equipment inventory and maintenance applications. A power management application typically includes one or more application components which utilize the power management architecture to interoperate and communicate thereby implementing the power management application.

The architecture includes Intelligent Electronic Devices ("IED's") distributed throughout the power distribution system to monitor and control the flow of electrical power. IED's may be positioned along the supplier's distribution path or within a customer's internal distribution system. IED's include revenue electric watt-hour meters, protection relays, programmable logic controllers, remote terminal units, fault recorders and other devices used to monitor and/or control electrical power distribution and consumption. As was noted, IED's also include legacy mechanical or electromechanical devices which have been retrofitted with appropriate hardware and/or software so as to be able to integrate with the power management architecture. Typically an IED is associated with a particular load or set of loads which are drawing electrical power from the power distribution system. As was described above, the IED may also be capable of receiving data from or controlling its associated load. Depending on the type of IED and the type of load it may be associated with, the IED implements a power management function such as measuring power consumption, controlling power distribution such as a relay function, monitoring power quality, measuring power parameters such as phasor components, voltage or current, controlling power generation facilities, or combinations thereof. For functions which produce data or other results, the IED can push the data onto the network to another IED or back end server, automatically or event driven, (discussed in more detail below) or the IED can wait for a polling communication which requests that the data be transmitted to the requester.

In addition, the IED is also capable of implementing an application component of a power management application utilizing the architecture. As was described above and further described below, the power management application includes power management application components which are implemented on different portions of the power management architecture and communicate with one another via the architecture network. The operation of the power management application components and their interactions/communications implement the power management application. One or more power management applications may be utilizing the architecture at any given time and therefore, the IED may implement one or more power management application components at any given time.

The architecture further includes a communications network. Preferably, the communication network is a publicly accessible data network such as the Internet or other network or combination of sub-networks that transmit data utilizing the transport control protocol/internet protocol ("TCP/IP") protocol suite. Such networks include private intranet networks, virtual private networks, extranets or combinations thereof and combinations which include the Internet. Alternatively, other communications network architectures may also be used. Each IED preferably includes the software and/or hardware necessary to facilitate communications over the communications network by the hardware and/or software which implements the power management functions and power management application components. In alternative embodiments, quality of service protocols can be implemented to guarantee timely data delivery, especially in real time applications.

The hardware and/or software which facilitate network communications preferably includes a communications protocol stack which provides a standard interface to which the power management functions hardware/software and power management application components hardware/software interact. As will be discussed in more detail below, in one embodiment, the communications protocol stack is a layered architecture of software components. In the preferred embodiments these layers or software components include an applications layer, a transport layer, a routing layer, a switching layer and an interface layer.

The applications layer includes the software which implements the power management functions and the power management applications components. Further, the applications layer also includes the communication software applications which support the available methods of network communications. Typically, the power management function software interacts with the power management hardware to monitor and or control the portion of the power distribution system and/or the load coupled with the IED. The application component typically interacts with the power management function software to control the power management function or process data monitored by the power management function. One or both of the power management function software and the power management application component software interacts with the communication software applications in order to communicate over the network with other devices.

The communications applications include electronic mail client applications such as applications which support SMTP, MIME or POP network communications protocols, security client applications such as encryption/decryption or authentication applications such as secure-HTTP or secure sockets layer ("SSL"), or other clients which support standard network communications protocols such as telnet, hypertext transport protocol ("HTTP"), file transfer protocol ("FTP"), network news transfer protocol ("NNTP"), instant messaging client applications, or combinations thereof. Other client application protocols include extensible markup language ("XML") client protocol and associated protocols such as Simple Object Access Protocol ("SOAP"). Further, the communications applications could also include client applications which support peer to peer communications. All of the communications applications preferably include the ability to communicate via the security client applications to secure the communications transmitted via the network from unauthorized access and to ensure that received communications are authentic, uncompromised and received by the intended recipient. Further, the communications applications include the ability to for redundant operation through the use of one or more interface layer components (discussed in more detail below), error detection and correction and the ability to communicate through firewalls or similar private network protection devices.

The transport layer interfaces the applications layer to the routing layer and accepts communications from the applications layer that are to be transmitted over the network. The transport layer breaks up the communications layer into one or more packets, augments each packet with sequencing data and addressing data and hands each packet to the routing layer. Similarly, packets which are received from the network are reassembled by the transport layer and the re-constructed communications are then handed up to the applications layer and the appropriate communications applications client. The transport layer also ensures that all packets which make up a given transmission are sent or received by the intended destination. Missing or damaged packets are re-requested by the transport layer from the source of the communication. In the preferred embodiment, the transport layer implements the transport control protocol ("TCP").

The routing layer interfaces the transport layer to the switching layer. The routing layer routes each packet received from the transport layer over the network. The routing layer augments each packet with the source and destination address information. In the preferred embodiment, the routing layer implements the internet protocol ("IP"). It will be appreciated that the TCP/IP protocols implement a connectionless packet switching network which facilitates scalable substantially simultaneous communications among multiple devices.

The switching layer interfaces the routing layer to the interface layer. The switching layer and interface layer are typically integrated. The interface layer comprises the actual hardware interface to the network. The interface layer may include an Ethernet interface, a modem, such as wired modem using the serial line interface protocol ("SLIP") or point to point protocol ("PPP"), wired modem which may be an analog or digital modem such as a integrated services digital network ("ISDN") modem or digital subscriber line ("DSL") modem, or a cellular modem. Further, other wireless interfaces, such as Bluetooth, may also be used. In addition, AC power line data network interface may also be used. Cellular modems further provide the functionality to determine the geographic location of the IED using cellular RF triangulation. Such location information can be transmitted along with other power management data as one factor used in authenticating the transmitted data. In the preferred embodiments, the interface layer provided allows for redundant communication capabilities. The interface layer couples the IED with a local area network, such as provided at the customer or utility site. Alternatively, the interface layer can couple the IED with a point of presence provided by a local network provider such as an internet service provider ("ISP").

Finally, the architecture includes back-end server computers or data collection devices. Back end servers may be provided by the consumer of electric power, the utility supplier of electric power or a third party. In one embodiment, these devices are IED's themselves. The back end servers are also coupled with the network in a same way as the IED's and may also include a communication protocol stack. The back end servers also implement power management applications components which interact and communicate with the power management application components on the IED's to accomplish the power management application. Preferably, the IED's are programmed with the network addresses of the appropriate back end servers or are capable of probing the network for back end servers to communicate with. Similarly, the back end server is programmed with the network addresses of one or more affiliate IED's or is capable of probing the network to find IED's that are connected. In either case of network probing by the IED or back-end server, software and/or hardware is provided to ensure that back-end servers communicate with authorized IED's and vice versa allowing multiple customers and multiple suppliers to utilize the architecture for various power management applications without interfering with each other.

The back end servers preferably are executing software application counterparts to the application clients and protocols operating on the IED's such as electronic mail, HTTP, FTP, telnet, NNTP or XML servers which are designed to receive and process communications from the IED's. Exemplary server communications applications include Microsoft Exchange™. The back end server is therefore capable of communicating, substantially simultaneously, with multiple IED's at any given time. Further, the back end server implements a security application which decrypts and/or authenticates communications received from IED's and encrypts communications sent to IED's.

In one embodiment, software executing on the back end server receives communications from an IED and automatically extracts the data from the communication. The data is automatically fed to a power management application component, such as a billing management component.

In this way, a generally accessible connectionless/scalable communications architecture is provided for operating power management applications. The architecture facilitates IED-supplier communications applications such as for automated meter reading, revenue collection, IED tampering and fraud detection, power quality monitoring, load or generation control, tariff updating or power reliability monitoring. The architecture also supports IED-consumer applications such as usage/cost monitoring, IED tampering and fraud detection, power quality monitoring, power reliability monitoring or control applications such as load shedding/cost control or generation control. In addition, real time deregulated utility/supplier switching applications which respond in real time to energy costs fluctuations can be implemented which automatically switch suppliers based on real time cost. Further the architecture supports communications between IED's such as early warning systems which warn downstream IED's of impending power quality events. The architecture also supports utility/supplier to customer applications such as real time pricing reporting, billing reporting, power quality or power reliability reporting. Customer to customer applications may also be supported wherein customers can share power quality or power reliability data.

As used herein, an IED or PMD is a power management device capable of network communication. A back end server is a data collection or central command device coupled with the network which receives power management data from an IED and/or generates power management commands to and IED. An IED may contain a back-end server. The network is any communications network which supports the Transport Control Protocol/Internet Protocol ("TCP/IP") network protocol suite. In the preferred embodiment IED's include devices such as PLC's, RTU's, meters, protection relays, fault recorders or modified electromechanical devices and further include any device which is coupled with an electrical power distribution network, or portion thereof, for the purpose of managing or controlling the distribution or consumption of electrical power.

FIG. 1 illustrates an overview of the preferred embodiment of the Power Management Architecture ("architecture") 100, which contains one or more IED's 102, 103, 104, 105, 106, 107, 108, 109. The IED's 102–109 are connected to an electrical power distribution system 101, or portion thereof; to measure, monitor and control quality, distribution and consumption of electric power from the system 101, or portion thereof. The power distribution system is typically owned by either a utility/supplier or consumer of electric power however some components may be owned and/or leased from third parties. The IED's 102–109 are further interconnected with each other and back end servers 121, 122, 123, 124 via a network 110 to implement a Power Management Application ("application") 111 (not shown). In the preferred embodiment, the network 10 is the Internet. Alternatively, the network 110 can be a private or public intranet, an extranet or combinations thereof, or any network utilizing the Transport Control Protocol/Internet Protocol ("TCP/IP") network protocol suite to enable communications, including IP tunneling protocols such as those which allow virtual private networks coupling multiple intranets or extranets together via the Internet. The network 110 may also include portions or sub-networks which use wireless technology to enable communications, such as RF, cellular or Bluetooth technologies. The network 110 preferably supports application protocols such as telnet, FTP, POP3, SMTP, NNTP, Mime, HTTP, SMTP, SNNP, IMAP, proprietary protocols or other network application protocols as are known in the art as well as transport protocols SLIP, PPP, TCP/IP and other transport protocols known in the art.

The Power Management Application 111 utilizes the architecture 100 and comprises power management application components which implement the particular power management functions required by the application 111. The power management application components are located on the IED 102–109 or on the back end server 121–124, or combinations thereof, and can be a client component, a server component or a peer component. Application components communicate with one another over the architecture 100 to implement the power management application 111.

In one preferred embodiment the architecture 100 comprises IED's 102–109 connected via a network 110 and back end servers 120, 121, 122, 123, 124 which further comprise software which utilizes protocol stacks to communicate. IED's 102–109 can be owned and operated by utilities/suppliers 130, 131, consumers 132 133 or third parties 134 or combinations thereof. Back end servers 120 121 122 123 124 can be owned by utilities/suppliers 130, 131, consumers 132, 133, third parties 134 or combinations thereof. For example, an IED 102–109 is operable to communicate directly over the network with the consumer back-end server 120, 121, another IED 102–19 or a utility back end server 123,124. In another example, a utility back end server 123, 124 is operable to connect and communicate directly with customer back end servers 120, 121. Further explanation and examples on the types of data and communication between IED's 102–109 are given in more detail below.

Furthermore, the architecture's 100 devices, such as the back end servers 120–124 or IED's 102–109, can contain an email server and associated communications hardware and software such as encryption and decryption software. Other transfer protocols, such as file transfer protocols (FTP), Simple Object Access Protocol (SOAP), HTTP, XML or other protocols know in the art may also be used in place of electronic mail. Hypertext Transfer Protocol (HTTP) is an application protocol that allows transfer of files to devices connected to the network. FTP is a standard internet protocol that allows exchange of files between devices connected on a network. Extensible markup language (XML) is a file format similar to HTML that allows transfer of data on networks. XML is a flexible, self describing, vendor-neutral way to create common information formats and share both the format and the data over the connection. In the preferred embodiment the data collection server is operable by either the supplier/utility 123, 124 or the customer 132, 133 of the electrical power distribution system 101. SOAP allows a program running one kind of operating system to communicate with the same kind, or another kind of operating system, by using HTTP and XML as mechanisms for the information exchange.

Furthermore, the application 111 includes an authentication and encryption component which encrypts commands transmitted across the network 110, and decrypts power management data received over the network 110. Authentication is also performed for commands or data sent or received over the network 110. Authentication is the process of determining and verifying whether the IED 102–109 transmitting data or receiving commands is the IED 102–109 it declares itself to be and in the preferred embodiment authentication includes parameters such as time/date stamps, digital certificates, physical locating algorithms such as cellular triangulation, serial or tracking ID's, which could include geographic location such as longitude and latitude. Authentication prevents fraudulent substitution of IED 102–109 devices or spoofing of IED 102–109 data generation in an attempt to defraud. Authentication also minimizes data collection and power distribution system 101 control errors by verifying that data is being generated and commands are being received by the appropriate devices. In the preferred embodiment encryption is done utilizing Pretty Good Privacy (PGP). PGP uses a variation of public key system, where each user has a publicly known encryption key and a private key known only to that user. The public key system and infrastructure enables users of unsecured networks, such as the internet, to securely and privately exchange data through the use of public and private cryptographic key pairs.

In the preferred embodiment the architecture is connectionless which allows for substantially simultaneous communications between a substantial number of IED's within the architecture. This form of scalability eclipses the current architectures that utilize point to point connections, such as provided by telephony networks, between devices to enable communications which limit the number of simultaneous communications that may take place.

FIG. 2a illustrates a preferred embodiment where and IED 200 contains several power management components 201 202 203 and power management circuitry 220. The power management circuitry 220 is operable to implement the IED's functionality, such as metering/measuring power delivered to the load 218 from the electrical power distribution system 216, measuring and monitoring power quality, implementing a protection relay function, or other functionality of the IED 200. The IED 200 further includes a power management application components 211 coupled with the circuitry 220 and a protocol stack 212 and data communication interface 213. The protocol stack 212 and data communications interface 213 allow the IED 200 to communicate over the network 215. It will be appreciated that, as described below, the protocol stack 212 may include an interface layer which comprises the data communications interface 213. The power management application components 211 include software and/or hardware components which, alone, or in combination with other components, implement the power management application 111. The components 211 may include components which analyze and log the metered/measured data, power quality data or control operation of the IED 200, such as controlling a relay circuit. The components 211 further include software and/or hardware which processes and communicates data from the IED 200 to other remote devices over the network 215, such as back end servers 121–124 or other IED's 200 (102–109), as will be described below. For example, the IED 200 is connected to a load 218. The power management circuitry 220 includes data logging software applications, memory and a CPU, which are configured to store kWh data from the load 218 in a memory contained within the power management circuitry. The stored data is then read and processed by the components 201 202 in the power management application 211. The components communicate with operating system components which contain the protocol stack 212 and the processed data is passed over the network 215 to the appropriate party via the data communications interface 213. One or more of the components 211 may communicate with one or more application components located on one or other IED's 200 and/or one or more back end servers 121–124.

Figure 2B:
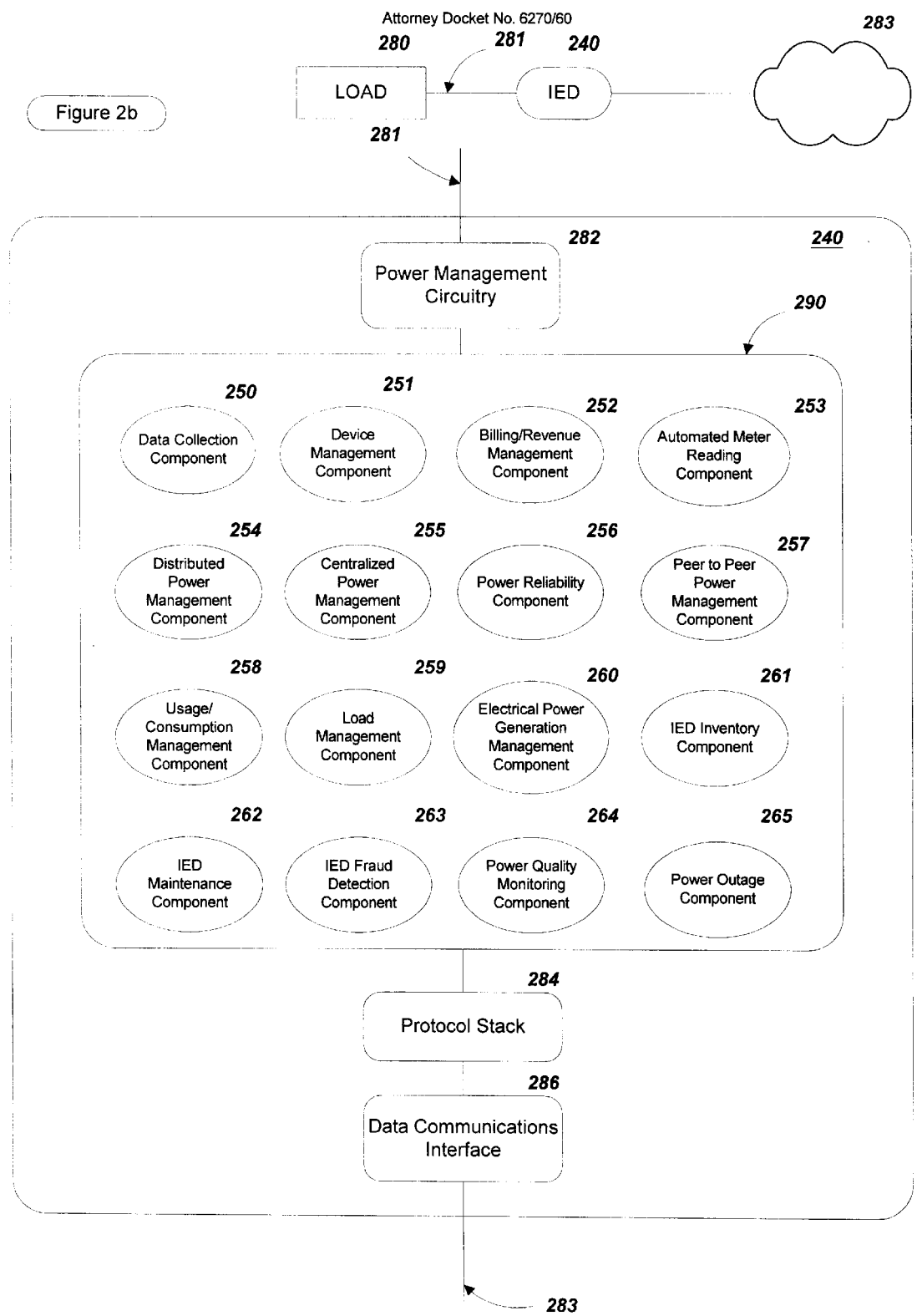
FIG. 2b illustrates another IED, for use with the embodiment of FIG. 1, containing several power management components.

FIG. 2b illustrates an alternate preferred embodiment where an IED 240 is provided which includes power management application components 290. A load 280 is connected to an IED 240 via the electrical power distribution system 281. The IED 240 is further connected to the network 283. The IED 240 contains power management circuitry which is operable to implement the IED's functionality, such as receiving power and generating data from the load 280. The IED further includes a protocol stack layer 284 and a data communication interface 286 which allows the back end server to communicate over the network 283. The power management application components 290 include one or more components such as data collection component 250, an automated meter reading component 253 and a billing/revenue management component 252, which may be revenue certified, a peer-to-peer power management component 257, a usage and consumption management component 258, a distributed power management component 254, a centralized power management component 255, a load management component 259, an electrical power generation management component 260, an IED inventory component 261, an IED maintenance component 262, an IED fraud detection component 263, a power quality monitoring component 264, a power outage component 265, a device management component 251, a power reliability component 256, or combinations thereof. Furthermore, components contained on one IED 240 may operate simultaneously with components on an IED 102–109, 200 or another IED 240 or back end server (not shown). More component details and examples are given below.

In one embodiment the application components comprise software components, such as an email server or an XML or HTTP server. These servers may include a Microsoft Exchange server or a BizTalk framework/XML compatible server. A Microsoft Exchange™ server is an email server computer program manufactured by Microsoft Corporation, located in Redmond, Wash., typically operating on a server computer which facilitates the reception and transmission of emails, and forwards emails to the email client programs, such as Microsoft Outlook™, of users that have accounts on the server. BizTalk is a computer industry initiative which promotes XML as the common data exchange for e-commerce and application integration over the internet. BizTalk provides frameworks and guidelines for how to publish standard data structures in XML and how to use XML messages to integrate software components or programs. Alternately, hardware components, such as a dedicated cellular phone, GPS encryption or decryption key or dongle are included in the components. In a further embodiment, a combination of both hardware and software components are utilized. Additionally, referring back to FIG. 1, one or more power management application components 290 can utilize the architecture 100 to implement their functionality. For example, a utility 130 has a back end server 124 which contains power management application and associated components, such as a usage and consumption monitoring component 258. The utility 130 supplies power to a consumer 132 via the power distribution network 110 and monitors the consumers power consumption using the power management application components on the back end server 124 which communicates with the IED's 104, 105, 108 via the network 110 to retrieve measured consumption/usage data. The consumer 132 concurrently monitors usage of loads 150, using an IED 104, 105, 108 which is connected to the network 110, computing real time costs posted by the utility 130. In one embodiment, the consumer 132 monitors usage using back end server 120 which receives usage and consumption data from the IED's 104, 105, 108 via the network 110. The IED 104, 105, 108 implements power management application components such as load management components and billing management components. One back end server 120, 124 implements power management application components such as a data collection component, a billing/revenue management component, an automated meter reading component or a usage/consumption management component. The components on the IED 104, 105, 108 work in concert with the components on the back end server 120, 124 via the network 110 to implement the overall power management application. In a further embodiment, one or more power management application components are operating on IED 104, 105, 108 and/or back end servers 120, 124 at any given time. Each power management application can be utilized by one or more users, or different applications can be used by different users. Moreover, the application components can exist on the same or different IED's 104, 105, 108 or back end servers 120, 124.

In the preferred embodiment, the data collection component 250 enables an IED to collect and collate data from either a single or multiple sources via the network 110. The data collected by the component is stored and can be retrieved by other components of the power management application components 290, or other components implemented on other IED's 102–109 located on the network 110. In the preferred embodiment the Automated Meter Reading component 253 is utilized to allow either the consumers 132, 133 or providers 130, 131 to generate power management reports from the IED data. In the preferred embodiment the electrical power generation management component 260 analyzes data received from IED's 102–109 to either minimize or maximize measured or computed values such as revenue, cost, consumption or usage by use of handling and manipulating power systems and load routing. IED inventory, maintenance and fraud detection component 261, 262, 263 receive or request communications from the IED's 102–109 allowing the power management application to inventory the installed base of IED's 102–109, including establishing or confirming their geographic installation location, or check the maintenance history of all connected IED's 102–109 These power management applications aid in confirming outage locations or authenticating communications to or from an IED 102–109 to prevent fraud and minimize errors. In one embodiment, the IED inventory component 261 utilizes cellular triangulation technologies, or caller ID based geographic locator technologies to determine and verify IED inventories. In the preferred embodiment the fraud detection component 263 further detects device tampering. In the preferred embodiment the power quality monitoring component 264 monitors and processes electric parameters, such as current, voltage and energy which include volts, amps, Watts, phase relationships between waveforms, kWh, kvAr, power factor, and frequency, etc. The power quality monitoring component 264 reports alarms, alerts, warnings and general power quality status, based on the monitored parameters, directly to the appropriate user, such as customers 132, 133 or utilities 130, 131.

FIG. 3a illustrates a preferred embodiment of an IED 302 for use with the disclosed power management architecture 100. The IED 302 is preferably coupled with a load 301 via a power a distribution system 300, or portion thereof. The IED 302 includes device circuitry 305 and a data communications interface 306. The IED 302 is further coupled with a network 307. The device circuitry 305 includes the internal hardware and software of the device, such as the CPU 305a, memory 305c, firmware and software applications 305d, data measurement functions 305b and communications protocol stack 305e. The data communication interface 306 couples the device circuitry 305 of the IED 302 with the communications network 307. Alternate embodiments may have power management control functions 305b in place of data measurement circuitry. For example, a relay may include a control device and corresponding control functions that regulate electricity flow to a load based on preset parameters. Alternately a revenue meter may include data measurement circuitry that logs and processes data from a connected load. IED's may contain one or the other or combinations of circuitry. In an alternate embodiment the circuitry includes phasor monitoring circuits (not shown) which comprise phasor transducers that receive analog signals representative of parameters of electricity in a circuit over the power distribution system. Further detail and discussion regarding the phasor circuitry is discussed in U.S. patent application Ser. No. 08/798,723, captioned above.

FIG. 3b illustrates a more detailed embodiment of the IED's 310 power management application components 311 and protocol stacks. The IED 310 includes power management application components 311, a communications protocol stack 312 and a data communications interface 313 (as was noted above, in alternate embodiments, the protocol stack 312 may include the data communications interface 313). The application components 311 includes a Load management component 315a, which measures the load's 301 consumption of electrical power from the portion of the power distribution system 316, a Power Quality component 315b, which measures power quality characteristics of the power on the portion of the power distribution system 316, and a billing/revenue management component 315c, which computes the quantity and associated value of the incoming power. The power management components are connected to the network via the data communications interface 312 using the communications protocol stack 312 (described in more detail below).

In one embodiment, a Billing/Revenue Management component on a back end server receives the billing and revenue computations over the network 307 from the billing/revenue management component 315c on the IED 310. These computations are translated into billing and revenue tracking data of the load 317 associated with the IED 310. The Billing/Revenue Management component on the back end server then reports the computations to the appropriate party operating that particular back end server or subscribing to a service provided by the operator the back end server, either the consumer or provider of the electrical power. Additionally, the Billing/Revenue Management component 315c on the IED 310 or the Billing/Revenue Management component on the back end server computes usage and cost computations and tracking data of the associated load and reports the data to the appropriate party. In a still another embodiment, IED 310 transmits billing and revenue data directly to the Billing/Revenue Management component over the network 307 and the Billing/Revenue Management component computes usage and cost computations and tracking data of the associated load and reports the data directly to the appropriate party. Furthermore, tariff data received from the utility by the Billing/Revenue Management component 315c is factored into usage or cost computations.

Figure 3C:
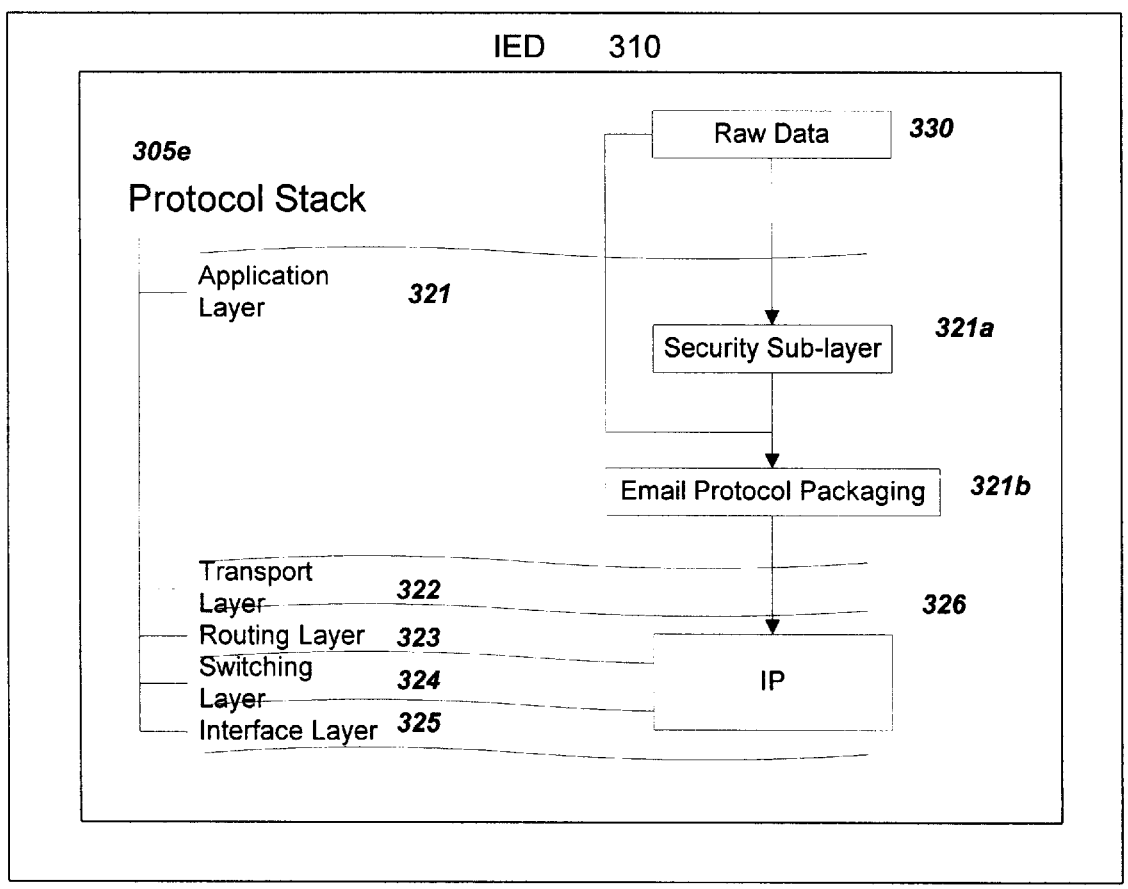
FIG. 3c illustrates a preferred protocol stack of an IED for use with the embodiment of FIG. 1.

FIG. 3c illustrates a preferred embodiment of the communications protocol stack 305e. In the preferred embodiment the connection between devices coupled with the network 110 is established via the Transmission Control Protocol/Internet Protocol ("TCP/IP") protocol suite. To facilitate communications over a network or other communications medium, devices typically include a set of software components known as a protocol stack. The protocol stack handles all of the details related to communicating over a given network so that other application programs executing on the device need not be aware of these details. The protocol stack effectively interfaces one or more application programs executing on the device to the network to which the device is connected. Typically, the protocol stack is arranged as a layered architecture with one or more software components in each layer. In the preferred embodiment, the protocol stack includes an application layer 321, a transport layer 322, a routing layer 323, a switching layer 324 and an interface layer 325. The application layer 321 includes all of the applications component software and/or power management component software. The application layer 321 is coupled with the transport layer 322. Applications or software components in the application layer communicate with the transport layer in order to communicate over the network. In the preferred embodiment, the transport layer is implemented as the Transmission Control Protocol ("TCP"). The transport layer, using TCP, divides communications from the applications of the application layer 321 into one or more packets for transmission across the network. The transport layer adds information about the packet sequence to each packet plus source and destination information about what application component generated the communication and to what application component on the receiving end the communication should be delivered to once reassembled from the constituent packets. The routing layer is coupled with the transport layer and is responsible for routing each packet over the network to its intended destination. In the preferred embodiment, the routing layer is implemented as the Internet Protocol ("IP") and utilizes internet protocol addresses to properly route each packet of a given communication. The switching and interface layers 324, 325 complete the protocol stack and facilitate use of the physical hardware which couples the device to the network. This hardware may include an Ethernet interface, a modem, or other form of physical network connecting including RF based connections such as Bluetooth interfaces. Generally, the preferred embodiments are capable of communicating via any network which transmits information utilizing the TCP and IP, collectively TCP/IP, protocols as are known in the art. TCP/IP is essentially the basic communication language of the both the Internet and private intranets. TCP/IP utilizes the communications protocol stack and can be described as comprising a TCP layer which manages the decomposing and reassembling of messages from the application layer 321 into smaller more manageable packets, and the IP layer which handles the addressing of the packets. The IP layer comprises the routing layer 323, the switching layer 324 and the interface layer 325. The interface layer 325, as described above, makes the physical connection with the network utilizing connections such as Ethernet, dial-up-modems, Point-to-Point Protocol (PPP), Serial Line Interface Protocol (SLIP), cellular modems, T1, Integrated Service Digital Network (IDSN), Digital Subscriber Line (DSL), Bluetooth, RF, fiber-optics or AC power line communications. In an alternate embodiment multiple interface layers 325 are present. For example, the interface layer 325 contains both an Ethernet and cellular modem thus enabling the IED to connect to the network with either interface. This redundancy is advantageous if one interface is inoperable due to a local Ethernet or cellular network outage. It is preferable that one or more of the application components in the application layer 321 implement TCP compatible protocols for the exchange of their communications over the network. Such TCP compatible protocols include the Instant Messaging protocol, file transfer protocol ("FTP"), or Hypertext Transport Protocol ("HTTP"). In addition, a Secure HTTP (S-HTTP) or Secure Socket Layers (SSL) may also be utilized between the application layer 321 and the transport layer 322 for secure transport of data when HTTP is utilized. S-HTTP is an extension to HTTP that allows the exchange of files with encryption and or digital certificates. SSL only allows authentication from the server where S-HTTP allows the client to send a certificate to authenticate to the user. The routing layer 323 and the switching layer 324 enable the data packet to arrive at the address intended.

In operation the IED monitors the power distribution system for events such as wave shape deviation, sag, swell, kWh, kvA or other power usage, consumption, or power quality events and disturbances. In one embodiment, when the IED detects an event, it process the event and generates an email message using an email client application component for transport over the network to a back end data collection server. Raw data 330, such as the error message generated from the IED or a billing signal, is passed into the application layer's 321 Security Sub-layer 321a where it is encrypted before email protocol packaging 321b takes place. Once the data 330 has been encrypted and packaged, the message is passed through the remaining IP layers where the message is configured for transmission and sent to the destination address. In one embodiment, the destination address is for a back end server implementing a data collection application component. This back end server may be operated by the consumer or supplier of electrical power or a third party as described above. In an alternate embodiment the Security Sub-layer 321a includes authentication or encryption, or alternately the Security Sub-layer 321a is bypassed. The application layer may include application components which implement protocols that are designed to pass through a firewall or other type of software that protects a private network coupled with a publicly accessible network. Multiple redundant data messages may be sent from the IP layer to ensure the complete data packet is received at the destination. In the above operation, the protocol stack, which includes an SMTP or MIME enabled email client, is a scalable, commercial product such as the Eudora™ email client manufactured by Qualcomm, Inc., located in San Diego, Calif. In an alternate embodiment data messages may also be sent to redundant destination email addresses to ensure delivery of the message. Quality of Service (QoS) may also be implemented, depending on the volume of bandwidth required for the data, ensuring reliable and timely delivery of the data. QoS is based on the concept that transmission rates, error rates, and other characteristics of a network can be measured, improved and, to some extent, guaranteed in advance. QoS is a concern for continuous transmission of high-bandwidth information. The power quality events, consumption, disturbances or other usage data may be stored in the IED and sent to the destination address upon request from an application component operating at the destination address, upon pre-determined time intervals and schedules, upon pre-defined events or in real time. In an alternate embodiment a IED may transport data or requests to or receive data or requests from other IED's directly, also know as peer-to-peer communications. Peer-to-peer is a communications model in which each party or device has the same capabilities and either party or device can initiate communication sessions.

In an alternate embodiment the Security Sub-layer 321a may include multiple encryption keys, each conferring different access rights to the device. This enables multiple users, such as a utility and customers, or multiple internal departments of a utility or customer, to send or receive data and commands to or from the IED. For example a customer's IED sends out two encrypted messages, one billing data and one power quality data, to the customer's office site. The billing data message is encrypted at a level where only the internal accounting department has access to decrypt it. The power quality data message is encrypted at a different level where the entire company can decrypt the message. Furthermore, in the preferred embodiment, commands sent to or from the IED are coupled with the appropriate encryption key. For example, the IED's Security Sub-layer 321a may only permit billing reset commands to be received and processed if the command has been authenticated where the point of origin was the appropriate customer or utility. Further, encrypted email messages may also include various encrypted portions, each accessible and readable with a different encryption key. For example an IED sends out one message to both the utility and the customer containing billing data and power quality data. The data is encrypted with two different encryption keys so only the utility can decrypt the power quality data and only the customer can decrypt the billing data.

In operation the IED monitors the power distribution system 301 for billing events such as, kWh or kvA pulses. In one embodiment the IED may store billing events and transport the data to the power management application components operating on a back end server either upon request or upon pre-determined time intervals. Alternately the IED may transport billing event data in real time to the back end server. Data may he filtered through the either the Back End Server's or IED's power management components or any combination or variation thereof, before being entered into the Billing/Revenue Management component where billing, revenue, cost and usage tracking are computed into revised data. The Billing/Revenue Management components either stores the computations for future retrieval or pushes the revised data to the appropriate party, such as the consumer or provider of the electric power system. Data can be retrieved upon command or sent or requested upon a scheduled time.

In the preferred embodiment the back end server's operate in a similar approach to the IED's. The back end server contains a transport protocol stack and power management application components. Alternatively, a back end server could be a function or component of the IED, i.e., implemented as an application component.

The IED 402 implements power management functions on the whole electrical power distribution system 400 or just a portion thereof. Referring to FIG. 4a the IED 402 monitors the electrical power via the system 400 to a load 401 and reports events and data to the power management application components 411 through the network 410. The power management application components 411 are preferably operating on a back end server. The events and data are collected and processed through the automated meter reading components, billing/revenue management components or a combination and variation thereof, and revised data or commands are sent back to the IED through the network 410, enabling control of the power flow and distribution of the loading on the power distribution system. The automated meter reading component allows for retrieval and collection of data for the customer, utility or third party. The component further allows for schedule driven, event driven or polling commands which are operable to push data onto the network.

The power management functions implemented by the IED's enables the back end servers or IED's to control power flow and distribution over the electrical power distribution system. Specifically the power management application components process power measurement data and generate power measurement and reporting commands, transmitting them to the back end servers or IED's for execution. Referring now to FIG. 4b, in one preferred operation a load is monitored by a IED where kvA and kWh pulse data are sent in real time over the network 424 to the Application via email or another transport protocol. If pre-processing is required 425a the raw pulse data is transported into a data collection server or component where it is translated into a format readable by the billing/revenue management component 426. Alternately, the billing/revenue management component may be configured to receive and process data without pre-processing 425b. Once sent to the billing/revenue management component 428 the data is compared and analyzed for usage, consumption or billing revenue ranges against a pre-determined tariff structure 432 where any anomalies, excess or shortages are reported back to the IED in the form of a command to a power management function which controls the power flow and load distribution accordingly 434. The components further contact the required parties, such as the consumer or provider of the load, over the network, forwarding power quality, billing, usage or consumption reports or any power management functions that were required against the set tariff structure.

FIG. 5a illustrates a preferred embodiment for a usage and consumption management application of the power management architecture. The IED 502 implements a power management function of controlling the source of electrical power for the load 501 from either energy supplier 1 505 or energy supplier 2 506. The application is designed to take advantage a deregulated marketplace and operate the load 501 from the most cost efficient energy supplier at the given time period. Which supplier is most efficient may fluctuate frequently as a function of the energy market and supply and demand for electrical power. Referring to FIG. 5b, the IED 502 contains a usage and consumption management component which receives tariff and cost structures from multiple energy suppliers 505, 506. The component receives usage and consumption from the Load 501 and compares actual usage against multiple tariff structures choosing the most cost effective provider for a given load. Similarly the load management component 259, as shown in FIG. 2b, is utilized to connect and disconnect loads to and from the electrical distribution system during either low and high rate and demand periods, hence reducing the electrical power costs and demand. In the preferred embodiment the load management component 250 is programmed to run in an automated fashion based on feedback from the system, however in an alternate embodiment the component is operated manually based on user input.

For example, an IED 502 is connected to a power line 500 and associated load 501. The IED 502 measures power usage by the load and transmits this consumption data 514 over a network 510 to a usage and consumption management application component operating on a back end server 511. The Usage and consumption management component receives and tracks cost and usage 516, 518 and compares rates for actual usage against multiple suppliers bids 522. Suppliers have the option to either push tariff structures to the application component or have tariff structures polled over the network. Once the most cost effective structure is determined by the usage and consumption management component, a command or function is sent to the IED 502 with the new tariff structure 523, 524. Alternately, the new tariff structure is applied across to the billing/revenue management component where billing is applied to the usage and revenue reports are forwarded onto the appropriate parties.

In another example the usage and consumption management component determines all suppliers tariff structures are too expensive to warrant usage or consumption thus a command to reduce consumption to a desired level is transmitted over the network to the IED 525. Furthermore, an alternate embodiment includes application of real-time usage and cost monitoring of loads being measured by an IED and multiple energy and distribution system suppliers.

In an alternate embodiment the usage and consumption component is pre-programmed to monitor and shed loads based on a exceeding a set tariff structure. For example an IED 502 monitors a load 501 connected to a power distribution system 500. Energy is supplied by an energy supplier 505. The IED contains a tariff structure that has a limit of $0.80/kWh during peak hours of 6 am to 6 pm and a limit of $0.60/kWh for non-peak hours of 6 pm to 6 am. The IED 502 monitors the power usage of the load 501 vs. the actual tariff structure of the energy supplier and shuts the load 501 off if the actual tariff exceeds the limits of $0.80/kWh during peak times or $0.60/kWh during non-peak times.

The centralized power management component 255 allows the centralization of work at one location, such as a centralized billing server, load management server or master IED, which collects and processes data from various devices spread over the network. In operation, remote IED's connected to the network transmit data to the centralized power management component where operations such as billing, load management, usage and consumption reporting are processed in one central location.

The distributed power management component 254 allows for the distribution of work or data processing to various devices on the network. In operation, an IED measures or detects an occurring or impending catastrophic power quality event and alerts other downstream IED's (on the power distribution network) of the event thereby giving the downstream IED's an opportunity to disconnect or alter loads before the event reaches the downstream system and causes damage. The component further includes a function that, upon detection of an occurring or impending event, alerts downstream IED's or back end servers to alert their connected loads to either protect themselves from the outage by shutting down, or instructing them to shut down applications that may cause critical failure or damage if interrupted, such as writing to a hard-drive. FIG. 6 illustrates a preferred embodiment of the distributed power management component in action. An Electrical power distribution system 600 distributes energy over distribution lines 601 which are connected to multiple IED's 620, 622, 624, 626 which are present to continuously monitor the energy being fed onto their respective loads 621 623 and generators 625 627 on a given branch and furthermore all IED's 620, 622, 624, 626 are connected via a network 610 as described above. IED's 616 618 are also present on the distribution system 600 to continuously monitor energy being transferred onto the system as a whole. It will be appreciated that the loads and generators may reside on multiple or separate consumer sites. In operation, a catastrophic power quality event is detected on a load 623 by the attached IED 622. The IED 622 takes appropriate action, such as triggering a protection relay, on the load and further transmits communications of its actions to upstream IED's 616 618. This ensures local containment of the event by the IED 622 informing upstream IED's to not duplicate the action on the larger system. Obviously retaining upstream IED's as a backup is not discounted in this operation. Alternatively, the operation is utilized to coordinate downstream IED's over the network 610. For example an event may be detected at the distribution system 600 by an IED 616 monitoring the system 600 which triggers, for example, a protection relay. The IED 616 which triggered the protection relay communicates its actions to downstream IED's 618 620 622 624 626 over the network 610 allowing them to take appropriate intelligent action, such as disconnection the generators 625 627. It can be appreciated that IED applications may include a combination of the centralized and distributed power management components.

In one embodiment, a power reliability component 256 is provided in the IED to measure and compute the reliability of the power system. Power system reliability is discussed in commonly assigned U.S. patent application Ser. No. 09/749, 129, "APPARATUS AND METHOD FOR MEASURING AND REPORTING THE RELIABILITY OF A POWER DISTRIBUTION SYSTEM", captioned above. In the preferred embodiment the component 256 computes and measures reliability as a number of "nines" measure. The component includes a function which compiles the reliability of the power from other components located on back end servers or IED's, giving a total reliability. This function also enables a user to determine which part of the distribution system has the most unreliable power. Knowing this enables the user to focus on the unreliable area, hopefully improving local power reliability and thus increasing overall reliability.

For example, referring now to FIG. 7, an IED 711 is connected to a network 710 and measures the reliability of the power distribution system 701 which supplies power to loads 724 726 within a customer site 705. The customer also provides a generator 726 which supplies power to the loads 722 724 at various times. The customer measures the power reliability of the system for the load 722 724 using the associated IED 712 714 and considers it unreliable. One IED's 714 power reliability component polls the other IED's 711 712 716 and determines the unreliable power source is coming from the generator 726. From this the customer can decide to shut off the power supply from the generator 726 in order to improve the power reliability of the system.

In another embodiment, a power outage component 265 is provided in the IED which informs the appropriate parties of a power outage using email or other transport protocols. In the preferred embodiment an IED is connected to a power system when a power failure occurs. The IED's power outage component 265 contains hardware, such as a battery backup and modem, which enables the IED to transmit a power failure warning to the appropriate parties, such as the utility or customer, such as by email over a network as described above. Further, a cellular modem may be utilized to call out to indicate the location of an outage. Physical locating algorithms such as cellular triangulation or telephone caller ID can be used to track or verify outage locations.

Peer to peer communications between IED's and between back end servers are supported by the peer to peer management component 257. In the preferred embodiment peer to peer communications are utilized to transport or compile data from multiple IED's. For example, as shown in FIG. 8, an IED 800 is connected to a network 810. Multiple loads 806 808 draw power from a power utility's 803 power distribution line 801 and each load is monitored by an IED 804 806. An IED 800 polls load and billing data from all other IED's on the network on the customer site 802 804. Upon request, the IED 800 then transmits the load and billing data to the customer's billing server 814. In the preferred embodiment, the IED 800 communicates the load and billing data in a format which allows software programs inside the customer billing server 814 to receive the data directly without translation or reformatting.

Transmission of data in XML format allows a user to receive the data in a readable self-describing format for the application intended. For example, traditional data file formats include comma-separated value files (CSV), which contain values in tables as a series of ASCII text strings organized so each column value is separated by a comma from the next column's value. The problem with sending CSV file formats is the recipient may not be aware of each column's desired meaning. For example, a CSV file may contain the following information sent from a revenue billing application 45.54,1.25,1234 Elm Street, 8500 where 45.54 is the kWh used this month, 1.25 is the kWh used today, 1234 Elm Street is the location of the device and 8500 is the type of device. However, if the recipient of the CSV file was not aware of the data format, the data could be misinterpreted. A file transported in XML is transmitted in HTML tag type format and includes information that allows a user or computer to understand the data contained within the tags. XML allows for an unlimited number of tags to be defined, hence allowing the information to be self-describing instead of having to conform to existing tags. The same information is transmitted in XML format as:

<billing[ ]_information>
<kWh[ ]_month>45.54</kWh[ ]_month>
<kWh[ ]_day>1.25</kWh[ ]_day>
<location>1234 Elm Street</location>

<device[ ]_type>8500</device[ ]_type>
    </billing[ ]_information>

Transmission in XML format allows the recipient to receive XML-tagged data from a sender and not require knowledge of how the sender's system operates or data formats are organized. In a preferred embodiment communications between IED's connected to the network are transmitted in XML format. An IED utilizes XML based client application components included within the power management applications and transmits the data in XML format so little or no post-processing is required. FIG. 9 illustrates an example of the preferred embodiment. An IED 902 is connected to a power distribution line 900 and associated load 901 owned by a customer 920. Power is supplied by a power utility's 908 power generator 903. The power utility also has a utility billing server 906 which compiles billing data from consumers drawing power from their power generators. The IED 902 is connected to the utility billing server via a network connection 910 and the IED 902 measures usage and consumption of the load, and other values associated with billing. The utility billing server 906 contains billing software, such as a MV90, which requires data in a specified format. Either upon request, or a pre-scheduled times, the IED 902 transmits the usage, consumption and billing data associated with the load 901 to the utility billing server 906 in XML format. The customer also has a monitoring server 921 which is dedicated to receiving billing data from the IED 902 and reporting usage and consumption to the appropriate parties, the monitoring server 921 also reads data in a specified format for its associated monitoring software. The IED 902 transmits the same usage, consumption and billing data to the monitoring server 921 in XML format. By utilizing XML data formats the data transmitted by the IED 902 can be read by multiple servers or IED's 902 that do not require knowledge beforehand of the order or type of data that is being sent. In an alternate embodiment an IED 902 may also receive inputs from peripheral devices which may be translated and combined in the XML transmission. For example, the load 901 is a motor which contains a temperature probe. The temperature probe is connected to the IED 902 and allows the IED 902 to monitor the motor temperature in addition to power data on the power distribution line 900. The IED 902 is programmed to act on the temperature input by shutting down the motor if the temperature exceeds a pre-defined critical level by tripping a relay or other protection device (not shown). The IED 902 is further programmed to alert the customer monitoring server 921 and an alert pager 922 and if such an action takes place. This alert transmission is sent in XML format so both the server 921 and the pager 922, which may be configured to read incoming transmissions differently, receive the alert transmission in the form it was intended. It can be appreciated that the IED 902 can receive data in XML format from multiple sources without complete knowledge of their file transfer notations.

In an alternate embodiment the back end servers include software that is generally included on a majority of existing computer systems, such as Microsoft Office™ software, manufactured by Microsoft Corporation, located in Redmond, Wash. which includes the software applications Microsoft Word™ and Microsoft Excel™. The software receives data in a self describing format, such as XML, and the software includes off the shelf applications and processes such as a Microsoft Exchange Server, Microsoft Excel and associated Excel Workbooks, Microsoft Outlook and associated Outlook rules, Microsoft Visio and associated Visio Stencils, Template files, and macros which allow the user to view and manipulate data directly from the IED. In one embodiment the IED transmission format makes use of existing standard software packages and does not require additional low level components, such as a communications server communicating with a serial port, which are normally required to interface to the IED communication ports. Further, the embodiment does not require a separate database, as the data is stored in the software programs. This allows a user to view data from the IED using standard computer software. For example, referring now to FIG. 10, an IED 1002 monitors a load 1001 and passes the monitored data to a monitoring server 1011. The data can be transmitted using a variety of protocols, such as FTP, TCP/IP or HTTP, as described above. In the preferred embodiment data is transmitted in an HTTP based form or an SMTP form where the HTTP form is a self-describing format such as XML and the SMTP format is an email message. The monitoring server 1011 includes Microsoft Exchange Server 1022, Visio 1021, Microsoft Excel 1020 and Excel Workbooks 1023. The Excel software 1020 is capable of receiving data directly from the IED in a self-describing format, thus allowing the user to view real time load profiles or graphs and other monitored data directly from the IED in real time. The Visio software 1021 is also capable of receiving data directly from the IED in a self-describing format, thus allowing the user to process and view real time data in Visio format. Alternately, the IED transmits power quality, load, billing data or other measured or monitored values to the Excel Workbooks 1023 via the Exchange Server 1022. The Excel or Visio software is then capable of retrieving historical data directly from the workbooks.

Referring to FIG. 11, there is shown an exemplary screen display of a Microsoft Excel worksheet which is coupled with the IED 1002 as described above. In this example, the IED 1002 is a model 8500 meter, manufactured by Power Measurement Limited, in Victoria, British Columbia, Canada. The IED 1002 is coupled via a TCP/IP based network with a personal computer having at least 64 MB memory and 6 GB hard disk with a Pentium™ III or equivalent processor or better, executing the Microsoft Windows 98™ operating system and Microsoft Excel 2000. The computer further includes Microsoft Internet Explorer™ 5.0 which includes an XML parser that receives and parses the XML data fro the meter and delivers it to the Excel worksheet. The worksheet displays real time data received directly from the IED 1002 in an XML format. As the IED 1002 detects and measures fluctuations in the delivered electrical power, it transmits updated information, via XML, to the worksheet which, in turn, updates the displayed data in real time. Note that all of the features of the Microsoft Excel program are available to manipulate and analyze the received real time data, including the ability to specify mathematical formulas and complex equations which act on the data. Further, display templates and charting/graphing functions can be implemented to provide meaningful visual analysis of the data as it is received. Further, the real time data can be logged for historical analysis. In one embodiment, the activation of a new IED 1002 on the network is detected by the worksheet which cause automatic generation of a new worksheet to receive and display data from the new device.

In still another alternative embodiment, the ability to communicate through a firewall or other private network security/protection implementations, as described above, also known as "punch through", is provided. As was described, in order to implement the various power management applications on the disclosed power management architecture, the IED's, back-end servers and their constituent application components must be able to intercommunicate with and among one another to share data and command and control information. Further, as was noted, the IED's, back-end servers and their constituent application components may be located anywhere, including within private internal networks, relying on the fabric of the public network infrastructure to link them together and facilitate their "machine to machine" communications. However, concerns over enterprise network security often result in the restriction of such communications between private/internal networks and public external networks such as the Internet. Unfettered communications over unknown or unregulated protocols or between unknown or unregulated clients, servers or hosts represent an inherent network security risk to an enterprise. As will be discussed below, it is therefore advantageous to encapsulate/facilitate these computer readable communications using protocols intended for human readable communications, such as electronic mail, hypertext/web or instant messaging protocols, which are more benign and more easily regulated and monitored, i.e. trusted.

A firewall is a software program, or combination of software and hardware, typically located on a network, that protects the resources of a private network, such as an intranet, from users of other external networks, such as the Internet, coupled with that private network. The firewall within an internal network, or intranet, allows internal users access to the intranet but prevents outsiders from accessing the private data, and/or it controls which resources both the internal or external users have access to. Alternately, or in conjunction, the firewall restricts outgoing connections to external network entities from the internal user by restricting certain types of protocol connections or data transfers. A firewall mediates/facilitates bi-directional communication between two networks, typically external and internal networks, but in certain situations data or standard communications protocols are only allowed outbound to the external network and not inbound from the external network. Alternately, select standard protocols are enabled for both inbound and outbound communication. Standard communication protocols include FTP, NNTP or instant messaging protocols, such as AOL™, Yahoo!™ or MSN™ instant messaging protocols. It may also include SMTP (port 25) type protocols known in the art or other HTTP (port 80) type protocols. It will be appreciated that firewalls are well known in the art.

A firewall examines each network packet to determine whether to forward it towards its destination. A firewall may also include or work with a proxy server that makes external network requests on behalf on internal users. The proxy server allows an enterprise, which has several users, to act as an intermediary between the users and the external network/internet so the Enterprise, such as a company's Information Services department, can ensure security, administrative control and/or offer caching services.

The firewall also acts as a screening method. For example, a firewall may screen requests to ensure they come from acceptable domain names or Internet protocol addresses. Further, the firewall may also allow remote access into the private or internal network by the use of secure login procedures and authentication certificates. The term firewall typically implies not only that firewall network hardware and software is installed but also that a security policy is in place. The security policy refers to the configuration of the firewall as to which internal and external entities are permitted to communicate. Typically this includes defining which communications protocols will be allowed to pass through and which computer systems or hosts, internal and external, will be allowed to communicate via those protocols. Such security policies are typically implemented by the Information Technology/Services (IT or IS) departments of the enterprise.

Typical enterprises implement internal or local area networks for at least the purpose of allowing employees to communicate via electronic mail. Further, these mail servers are typically configured, along with the firewall, to permit the exchange of electronic mail with entities outside the enterprise. Mail servers may also act as a similar screening method to restrict messages or access only to acceptable services or from acceptable users. For example, a mail server may screen incoming messages to ensure that they come from acceptable or valid domain names, Internet protocol addresses or even specific user addresses. In one embodiment a mail server may be instructed to only receive messages from a single user address, such as ied_data@company.com, or a valid domain @company.com. Further, the mail server typically must also be configured for each user or email client program that wishes to communicate using the server. For example, an email account must be set up for each user within the enterprise who is to be allowed to communicate via email.

In one embodiment disclosed herein, the IED is configured as an email client with the email server and appears to the email server as any other user of email within the enterprise, creating, sending and receiving emails via the server. These emails contain the computer readable power management data and commands to other application components within the power management application which are capable of receiving the email and parsing out the power management data or commands. The IED may be configured to define or set any outgoing message criteria/parameters or to conform its communications to the user or enterprise domain address to ensure the mail server will accept any messages the IED sends from the valid domain. In this way, the IED can take advantage of the email server's capability to communicate via the firewall to get messages out to the external network.

As described above, the ability of an IED to push or send data or commands using the public Internet infrastructure allows IED's to be easily scalable when implemented in a network type architecture. By using the existing resources of the enterprise in which the IED is installed, including the internal/local area network and its connection with the external network/Internet, the need for dedicated communications media, such a telephone line, is eliminated. However, this ability to communicate requires that the data be able to get out of the internal/private network and to the external public network or Internet. As discussed above, with the advent of network security, this requires that the IED be able to send and receive its communications through the firewall. Sending data or commands, such as power management commands described earlier, using a protocol such as SMTP enabled email clients, allows a user or IED to communicate through a firewall while meeting the demands for security by the enterprise. However, due to various security policies, discussed above, the enterprise's internal network must be configured, in most cases, to allow such communication.

One method, as discussed above, is to configure the IED as an email client on the enterprise's internal electronic mail server, where that server is capable of communicating electronic mail via the firewall. In this case, the TED appears as any other user of the email server and is able to send and receive email via the firewall. The IED need only be configured to correctly interact with the mail server. In another embodiment, the IED is configured to interact with a communications server, such as an electronic mail server or XML server, which is external to the enterprise's internal network. In this case, the security policy of the enterprise may need to be reconfigured to allow the firewall to pass the communications of the IED to an external communications server such as an external mail server or external XML server. As will be discussed, in still another embodiment, the IED is configured to utilize a standard protocol typically already permitted by the enterprise's security policy for communications via the firewall, such as the HTTP protocol. In this case, no reconfiguration of the enterprise's internal network is required for the IED to communicate via the firewall.

In order to interact via electronic mail, whether with an internal or external mail server, the IED includes an electronic mail client application, as described above. It will be appreciated, that depending on the protocol and method of communications, the IED is equipped with an appropriately enabled client application, as described above. An exemplary SMTP enabled email client for IED's is the MeterM@il™ email client manufactured by Power Measurement, Ltd, located in Saanichton, B.C. Canada. Other protocols, such as Multi-Purpose Internet Mail Extensions ("MIME") may also be used to transport data or commands.

As described earlier in FIG. 3c, a security sub-layer 321a is present on the application layer 321 where encryption before email protocol packaging takes place. In an alternate embodiment a secure sockets layer ("SSL") is utilized to ensure security between the IED and the server or client which it ultimately connects to. SSL is a commonly-used protocol for managing the security of a message transmission. In the preferred embodiment, the SSL is included on the application layer 321, which includes all of the application software component and/or power management components. SSL uses public-and-private key encryption, which also includes the use of digital certificates. Digital certificates allow the recipient to verify that the certificate is real, and hence the message is real and from an authorized user. As described earlier, encryption can also be done utilizing Pretty Good Privacy (PGP). PGP uses a variation of the public key system, where each user has a publicly known encryption key and a private key known only to that user. The public key system and infrastructure enables users of unsecured networks, such as the Internet, to securely and privately exchange data through the use of public and private cryptographic key pairs. A security module, or security application, includes the aforementioned encryption, authentication and encryption applications.

In an alternate embodiment a Network Time Protocol ("NTP") or other form of time-syncing is utilized on the IED to ensure the transferred message has the correct time and to ensure that the contents of the message is derived using accurate time (i.e., interval energy data). NTP is a protocol that is used to synchronize computer or IED clock times in a network, either external or internal. Accurate time across the network is important. Distributed procedures depend on coordinated times to ensure proper sequences are followed or security mechanisms depend on coordinated times across the network. For example, a supplier may initiate a startup of two generators, each connected to an IED. In order to achieve proper startup, the first and second generator must be started in the correct order within a specified period of time. The supplier sends a command to start the first generator at 12:00 AM and the second generator at 12:01 AM. In order to ensure the proper startup sequence is done, both the IED's must be timesynced together. As one can see, if one of the IED's has the incorrect internal time the procedure may not occur in the correct order. Further, correct time stamping of messages is important for real time or revenue related messages. NTP typically applies to both the protocol and the client/server programs that may run on the IED. In one embodiment, the IED NTP initiates a request to the network time server, internal or external. Alternately, the IED may receive the correct time to timesync the IED from the time server via a push mechanism.

Figure 12:
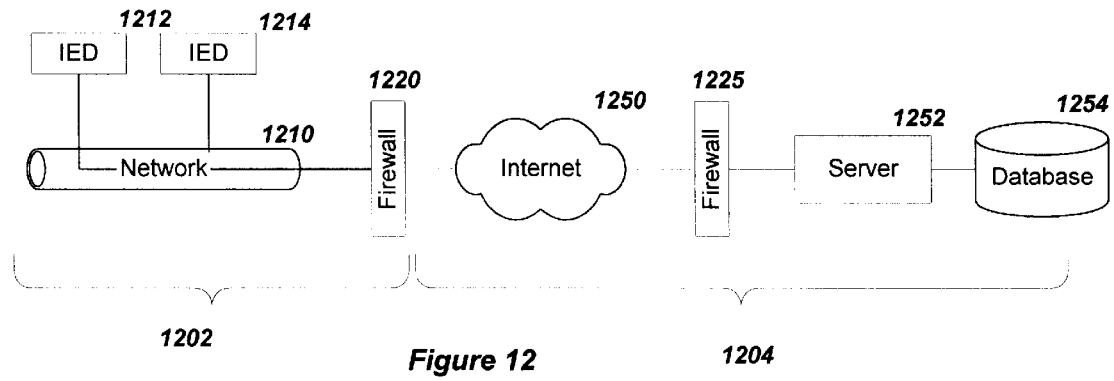
FIG. 12 illustrates a first embodiment of a networked architecture with firewalls.

FIG. 12 shows an example of a networked architecture with firewalls. A firewall 1220 defines the internal network 1202, which comprises an intranet 1210 with IED's 1212 1214 coupled with the intranet 1210. The IED's 1212 1214 may be in turn connected to loads or generators or other devices requiring power management or other power measurement data. It can be appreciated that loads or generators, such as fuel cells, turbines or flywheels, may be coupled with other types of power systems beyond electricity systems, such as power and gas. As described earlier power management data includes any data or information utilized or created by an IED, such as a status information, load information or electricity information used by an energy enterprise that may used in reporting or commanding or communicating to, with or from an IED. A database 1254 is connected to a server 1252, which may include a mail server such as Microsoft Exchange™, which is in turn connected to the Internet 1250. The network connections shown allow the server 1252 to connect to the IED 1212. In an alternate embodiment, the external network 1204 contains another firewall 1225 thereby defining another internal network which houses the server 1252 and the database 1254. The use of a firewall allows security to be present so the IED's 1212 1214 located in the internal network 1202, or internal Ethernet network, are protected from unauthorized access, and may restrict communications to other unauthorized sites or locations. For example the IED 1212 may contain billing or other revenue certified data which is required to be sent to the database 1254, which is located outside the secure firewall. The security contained in the firewall prohibits unauthorized users from collecting or viewing the billing data. The IED 1212 pushes or sends billing data on a scheduled or event driven basis by packaging the billing data in an email message, which utilizes an SMTP protocol. The email message is sent through the firewall 1220 to the server 1252, which processes the data and forwards it onto the database 1254. It will be appreciated that increased security, such as email encryption and authentication as described earlier may be utilized to further prevent unauthorized access to the billing data while in transport across the Internet 1250.

Figure 13:
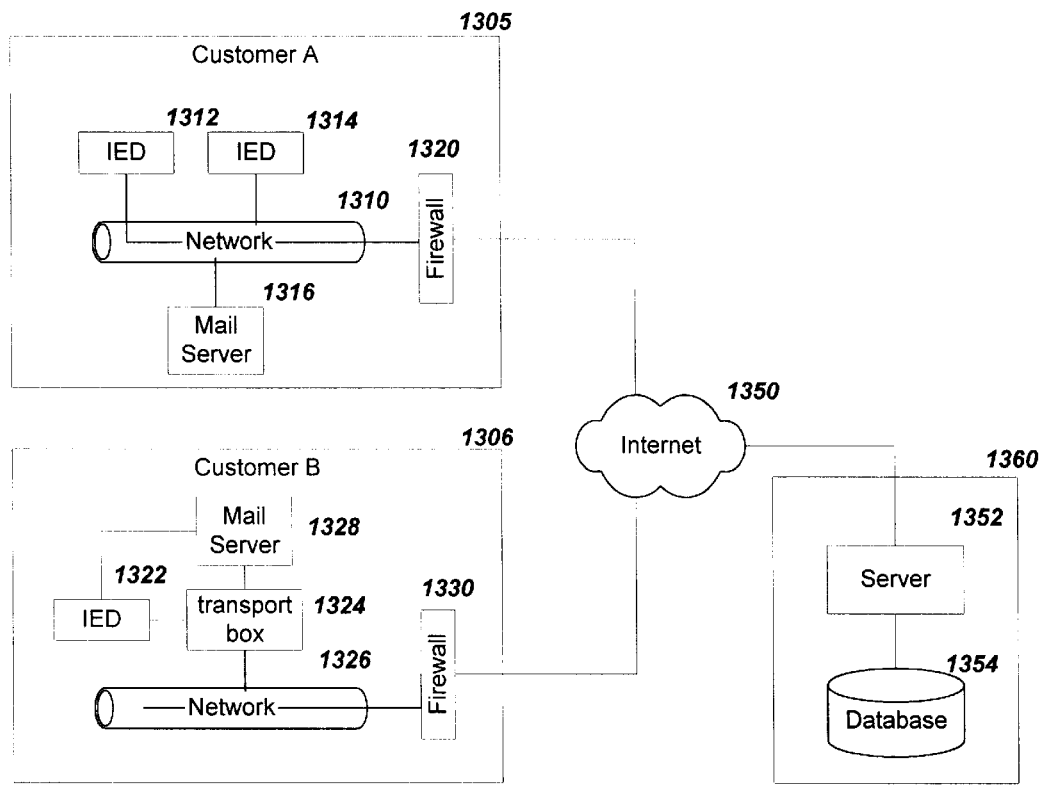
FIG. 13 illustrates a second embodiment of a networked architecture with firewalls.

As shown in FIG. 13, Customer A 1305 contains an internal network 1310 with various IED's 1312 1314 connected to the network 1310. A firewall 1320 protects the internal network 1310 from users which may attempt to access the IED's 1312 1314 or other network resources through the Internet 1350, or via some other type of external network connection. Customer B 1306 also contains an internal network 1326 with an IED 1322 connected to a transport box 1324, the transport box 1324, described in more detail below, is connected to the network. The internal network 1326 also contains a firewall 1330 which protects the internal network from unauthorized users or access. An Enterprise 1360 has a server 1352 and a database 1354 which are utilized to receive data from both Customer A 1305 and Customer B 1306. This data, such as revenue billing data, or other power management data, is packaged by the respective IED 1314 on the respective internal network and sent using a SMTP protocol through the firewall 1320 to the server 1352. The server 1352 contains a mail server, such as Microsoft Exchange™ which receives and processes the data sent. The Enterprise 1360 has a database 1354 which compiles the data sent by the respective Customers 1305 1306. Further, it will be appreciated that the Server 1352 can also send a command or data packet to the IED 1312 using the same protocol.

In one embodiment the transport box 1324 allows an IED 1322, which does not have the ability to either directly connect to the network 1326 or the ability to use an email transport protocol, to connect to the Enterprise 1360. The IED, such as an electro-mechanical watt-hour meter, gives an output pulse, or other form of output data, to the transport box 1324, which is equal to a pre-defined measurement such as a kWh. In turn the transport box 1324 contains the ability to compile and translate the pulses or other output data from the IED 1322 into data, such as billing data, and package and push or send the data on either a pre-defined schedule, or an event driven schedule, to the Enterprise 1360. For example the IED 1322 emits a pulse to the transport box for every kWh measured. The transport box 1324 is programmed to push revenue billing data, as measured by the IED 1322, on a weekly or other scheduled basis to the Enterprise 1360. The transport box compiles the pulses, as sent by the IED 1322, into an email message containing the data, encrypts the data, and sends the message through the firewall 1330 to the Enterprise 1360. The Server 1352 receives the message from the transport box 1324 and decrypts and authenticates the message before sending the data to the database 1354. The database is then utilized to provide billing to Customer B 1306 on a monthly basis. The use of a firewall 1330 ensures that an unauthorized user, such as Customer A may not access or alter the billing data contained in the transport box 1324. In an alternate embodiment the transport box contains a data converter engine, such as an extensible markup language ("XML") Engine, to convert the billing data into a pre-defined or readable data format, such as XML or Comma Separated Values ("CSV").

Further, in an alternate embodiment, the Enterprise 1360, may contact the Customer to enable a power management command, such as shed a load, on a load or device connected to an IED 1314. In operation a power management command is created or sent to the Server 1352 and the corresponding "shed load" command is packaged in an email protocol, such as SMTP, and sent to the IED 1314. A power management command may be included or reside in power management data. The use of an email message allows the Enterprise 1360 to transmit information through the firewall 1320. It can be appreciated that other transport protocols to transmit information through the firewall can be utilized, such as HTTP, HTTP Tunneling, SOAP™ or instant messaging.

In an alternate embodiment the transport box is utilized to allow bi-directional communication through the firewall between the IED 1322 and the Enterprise 1360. The Server 1352 sends an email message through the Internet 1350, the firewall 1330 to the transport box 1324, addressed to the IED 1322. The transport box 1324, which contains a mail server, such as Microsoft Exchange™, receives and temporarily stores the email message for pickup from the IED 1322. Alternatively, the Mail Server 1328 may be external from the transport box 1324. Upon pickup, the IED 1322 can extract, process, permanently store the message and take any necessary action the message may have included. This "store and forward" capability of the mail server 1328 allows the IED 1322 to only connect to the Mail Server 1328 or Transport Box 1324 while the corresponding message is held for retrieval. It can be appreciated that although the IED 1322 has the ability to connect to the network but for reasons such as security utilizes the transport box 1324 or mail server 1328 as a way to connect to the network and send messages either in one direction or bi-directional as described.

Figure 14:
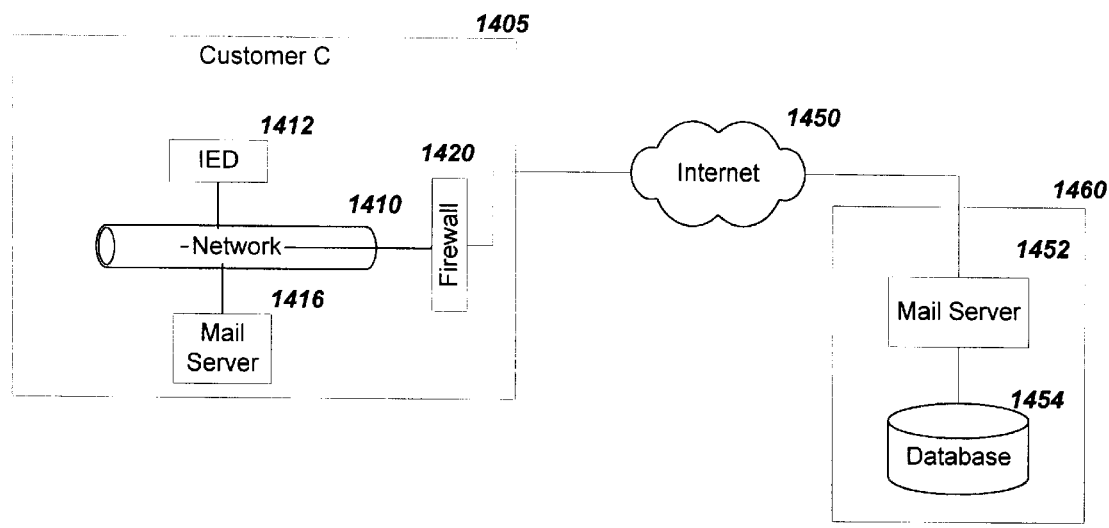
FIG. 14 illustrates a third embodiment of a networked architecture with firewalls.

FIG. 14 illustrates an alternate embodiment where the Mail Server 1452 is located on the external network. Customer C 1405 comprises an internal network 1410 with an IED 1412 and an internal mail server 1416 connected to the network 1410. A firewall 1420 protects the internal network 1410 from users which may attempt to access the IED 1412 via the Internet 1450, or some other type of external network connection. An Enterprise 1460 has an enterprise mail server 1452 and a database 1454 which are utilized to send or receive data or commands to or from Customer C 1405. In one embodiment a message is sent to the IED 1412. In operation, the message from the Enterprise 1460 is received and stored in the internal mail server 1416, and the IED 1412 contacts the internal mail server 1416 periodically to check for messages. If a message is found on the internal mail server 1416 for the IED 1412 in question, the IED 1412 retrieves the message and acts or responds accordingly. In a second embodiment the message is received and stored in the external mail server 1452. This mail server 1452, which is located outside the firewall 1420, also stores the message for the IED 1412 until the IED 1412 retrieves the message and acts or responds accordingly. It can be appreciated that the IED connects to the internal mail server 1416 or the external mail server 1452, which ever is utilized by the Customer 1405, using protocols known in the art such as POP3 or Internet Message Access Protocol 4 ("IMAP").

In another embodiment authentication and encryption of the email message is performed to ensure that the email is not erroneously received by another IED 1312 and the command is conducted on the correct load or application. In another embodiment a proxy server is located on the internal network however, in alternate embodiments, the IED may contain a proxy server which can also act as a filter to protect the IED from contacting or connecting to unauthorized sites. Further, it can be appreciated that the IED may have the ability to communicate to the internet 1250 via a proxy server. In another embodiment the IED itself may contain a firewall to secure access as described above.

With the inherent insecurity of publicly accessible external networks such as the Internet, private enterprises implementing internal local area networks, such as Intranets, must take precautions. While the safest alternative to prevent hacking, information theft, corporate espionage and other security breaches is to completely disconnect the internal network from external network, this solution also shuts out the tremendous benefits of having access to such external networks, some which have been explained above. Therefore, network security devices and policies, such as firewalls, must be implemented to safeguard the internal network while maintaining communication with the outside world. Automated power management applications operating on the disclosed power management architecture, as described above, must deal with this reality and respect the enterprise's need for network security while employing the intra-application component communications which span the internal and external networks to implement the power management application.

The disclosed embodiments meet these needs by providing a system and method for communicating through a firewall that takes advantage of the existing network infrastructure of the enterprise without jeopardizing the security of that infrastructure. The disclosed embodiments do not require a dedicated communications medium such as a telephone line. Each IED is capable of connecting directly to the existing network infrastructure, taking advantage of cabling, routers, switches, hubs, etc. that are already in place. Further, the disclosed embodiments do not require additional layers of data collection. Each IED is a standalone device capable of communicating with the back end servers or other data collection system within the power management architecture. Additional dedicated intermediary devices are not necessary to collect the power management data for the purpose of communicating it over the internal network. Further, each IED is capable of initiating communications, either according to a schedule, or as power management events are detected on the monitored power distribution system. This eliminates the need for in-bound "polling request" communications to the IED to cause it to send its data. By restricting communications to outbound traffic only, the enterprise's network security policies can be respected, and less burden is placed on the enterprise's network security staff in monitoring in bound network traffic from unknown sources.

As described above, a generally accessible connectionless/scalable communications architecture is provided for operating power management applications. The architecture facilitates IED-supplier communications applications such as for automated meter reading, revenue collection, IED tampering and fraud detection, power quality monitoring, load or generation control, tariff updating or power reliability monitoring. The architecture also supports IED-consumer applications such as usage/cost monitoring, IED tampering and fraud detection, power quality monitoring, power reliability monitoring or control applications such as load shedding/cost control or generation control. In addition, real time deregulated utility/supplier switching applications which respond in real time to energy costs fluctuations can be implemented which automatically switch suppliers based on real time cost. Further the architecture supports communications between IED's such as early warning systems which warn downstream IED's of impending power quality events. The architecture also supports utility/supplier to customer applications such as real time pricing reporting, billing reporting, power quality or power reliability reporting. Customer to customer applications may also be supported wherein customers can share power quality or power reliability data.

It is therefore intended that the foregoing detailed description be regarded as illustrative rather than limiting, and that it be understood that it is the following claims, including all equivalents, that are intended to define the spirit and scope of this invention.

We claim:

1. An electrical power management architecture comprising:

at least one intelligent electronic device ("IED") coupled with a portion of an electrical power system and further coupled with an internal network;

the at least one IED further comprising at least one sensor coupled with the portion of the electrical power system and further operative to sense at least one electrical parameter in the portion of the electrical power system and generate first power management data related thereto;

a firewall, the firewall operative to securely couple an external network with the internal network; and a network interface operative to couple the at least one IED with the internal network and facilitate a communications, initiated by the at least one IED, of the first power management data through the firewall from the internal network to the external network.

2. The electrical power management architecture of claim 1, wherein the firewall is operative to selectively restrict selected protocols communicated between the external network and the internal network.

3. The electrical power management architecture of claim 1, wherein the network interface is further operative to facilitate receipt of the first power management data from the external network.

4. The electrical power management architecture of claim 3 wherein the first power management data is received as at least one electronic mail message.

5. The electrical power management architecture of claim 3, wherein the first power management data is received as at least one instant message.

6. The electrical power management architecture of claim 3, wherein the at least one IED is operative to process and implement a power management function in response to the first power management data.

7. The electrical power management architecture of claim 6, wherein the first power management data comprises a power management command.

8. The electrical power management architecture of claim 1, wherein the first power management data is communicated as at least one electronic mail message.

9. The electrical power management architecture of claim 1, wherein the first power management data is communicated as at least one instant message.

10. The electrical power management architecture of claim 1, wherein the external network further comprises an external mail server, the at least one IED being further adapted to retrieve second power management data from the external mail server.

11. The electrical power management architecture of claim 10, wherein the at least one IED retrieves the second power management data using a POP3 protocol.

12. The electrical power management architecture of claim 10, wherein the second power management data is retrieved as at least one electronic mail message.

13. The electrical power management architecture of claim 10, wherein the at least one IED is capable of being configured to facilitate receipt of the power management data from the external mail server.

14. The electrical power management architecture of claim 1, wherein the internal network is further coupled with an internal mail server, the at least one IED adapted to retrieve the first power management data from the internal mail server.

15. The electrical power management architecture of claim 1, wherein the at least one IED comprises an electrical energy meter.

16. The electrical power management architecture of claim 1, wherein the network interface is further coupled with a security module, the security module operative to prevent unauthorized access to the power management data.

17. The electrical power management architecture of claim 16, wherein the security module further comprises a second firewall.

18. The electrical power management architecture of claim 1, further comprising a security module coupled with the network interface, the security module further comprising an encryption application operative to encrypt the first power management data prior to communication.

19. The electrical power management architecture of claim 1, further comprising a security module coupled with the network interface, the security module operative to authenticate second power management data received from the external network.

20. The electrical power management architecture of claim 19, wherein the security module is operative to decrypt the second power management data received from the external network.

21. The electrical power management architecture of claim 1, the network interface using at least one application, wherein the application comprises a SMTP client.

22. The electrical power management architecture of claim 1, the network interface comprising at least one application, wherein the application comprises an instant messaging protocol.

23. The electrical power management architecture of claim 1, the network interface comprising at least one application, wherein the application comprises a hypertext transport protocol ("HTTP") tunneling application.

24. The electrical power management architecture of claim 1, the network interface comprising at least one application, wherein the application communicates the power management data on a scheduled basis.

25. The electrical power management architecture of claim 1, wherein the at least one IED retrieves a timestamp from a time server, the timestamp operative to timesync the at least one IED.

26. The electrical power management architecture of claim 25, the network interface comprising at least one application operative to communicate the power management data on a scheduled basis, the scheduled basis being authenticated from the timestamp.

27. The electrical power management architecture of claim 1, the network interface comprising at least one application operative to communicate the first power management data on an event driven basis.

28. The electrical power management architecture of claim 1, wherein the first power management data comprises a power management command.

29. The electrical power management architecture of claim 1, wherein the first power management data is in extensible markup language ("XML") format.

30. The electrical power management architecture of claim 1, wherein the first power management data is in comma-separated value ("CSV") format.

31. The electrical power management architecture of claim 1, wherein the electrical power system comprises a load.

32. The electrical power management architecture of claim 1, wherein the electrical power system comprises a generator.

33. The electrical power management architecture of claim 1, wherein the internal network comprises an Ethernet network.

34. An electrical power management architecture comprising:
at least one intelligent electronic device ("IED") coupled with a portion of an electrical power system and further coupled with an internal network, the at least one IED further including at least one sensor coupled with the portion of the electrical power system and further operative to sense at least one electrical parameter in said portion of said electrical power system and to generate first power management data related thereto;
a firewall, the firewall operative to couple the internal network with an external network;
a communications interface operative to facilitate communications of the at least one IED with a transport box, the transport box having a network interface and operative to facilitate communication of the first power management data from the at least one IED through the firewall, and further wherein the network interface is operative to initiate communications of the first power management data from the internal network to the external network via the firewall on behalf of the at least one IED.

35. The electrical power management architecture of claim 34, wherein the firewall is adapted to restrict communications from the internal network to the external network.

36. The electrical power management architecture of claim 34, wherein the firewall is operative to restrict selected protocols between the external network and the internal network.

37. The electrical power management architecture of claim 34, wherein a security module is coupled with the network interface, the security module operative to prevent unauthorized access to the power management data.

38. The electrical power management architecture of claim 34, wherein the network interface is further operative to facilitate receipt of at least one power management command from the external network.

39. The electrical power management architecture of claim 34, wherein the first power management data comprises an electronic pulse, the at least one IED transmitting the electronic pulse to the transport box, the transport box converting the electronic pulse into second power management data.

40. The electrical power management architecture of claim 39, wherein the transport box converts the electronic pulse to XML format.

41. The electrical power management architecture of claim 34, wherein the communications comprises at least one electronic mail message.

42. The electrical power management architecture of claim 34, wherein the communications comprises at least one instant message.

43. The electrical power management architecture of claim 34, wherein the network interface is further coupled to a security module, the security module further comprises an encryption application operative to encrypt the first power management data prior to transmission of the first power management data.

44. The electrical power management architecture of claim 43, wherein the transport box is further operative to receive an external electronic mail message from the external network, the at least IED further operative to communicate with the transport box and retrieve the external electronic mail message from the transport box.

45. The electrical power management architecture of claim 34, wherein a second network interface is operative to couple the at least one IED with the internal network.

46. The electrical power management architecture of claim 34, wherein the communications comprises HTTP tunneling.

47. The electrical power management architecture of claim 34, wherein the at least one IED comprises an energy meter.

48. The electrical power management architecture of claim 34, wherein the at least one IED comprises an electromechanical watt-hour meter.

49. The electrical power management architecture of claim 34, wherein the at least one IED comprises a Remote Terminal Unit ("RTU").

50. The electrical power management architecture of claim 34, wherein the firewall comprises a proxy server.

51. An electrical power management architecture comprising:
- at least one intelligent electronic device ("IED") coupled with a portion of an electrical power system and further coupled with an internal network;
- the at least one IED further comprising at least one sensor coupled with said electrical power system and further operative to sense at least one electric parameter in said portion of said electrical power system and to generate power management data related thereto;
- a firewall operative to couple an external network with the internal network;
- a mail server coupled with the internal network and operative to facilitate communications of electronic mail messages between the external network and the internal network;
- a network interface operative to couple the at least one IED with the internal network and further operative to communicate with the mail server, the mail server being operative to communicate through the firewall, and further wherein the mail server is operative to initiate communications of at least one of the electronic mail messages comprising the power management data from the internal network to the external network.

52. The electrical power management architecture of claim 51, wherein the mail server uses a POP3 protocol.

53. An electrical power management architecture for managing an electrical power distribution system comprising:
- a network;
- at least one intelligent electronic device ("IED") coupled with a portion of said electrical power distribution system and further coupled with said network, each of said at least one IED operative to implement a power management function in conjunction with said portion of said electrical power distribution system, said power management function operative to respond to at least one power management command and generate power management data, each of said at least one IED comprising:
  - a first network interface operative to couple said at least one IED with said network and facilitate transmission of said power management data and receipt of said at least one power management command over said network;
  - a security module coupled with said first network interface and operative to prevent unauthorized access to said power management data; and
  - a protocol stack, said protocol stack including an application layer comprising at least one application operative to punch through a firewall to facilitate said transmission of said power management data;
  - at least one sensor coupled with said portion of said electrical power system and further operative to sense at least one electrical parameter in said portion of said electrical power distribution system, said IED being operative to generate said power management data related thereto;
- said architecture further comprising:
  - a power management application coupled with said network and operative to receive and process said power management data from said at least one IED and generate said at least one power management command to said at least one IED to implement said power management function.

54. A method of communicating power management data in an electrical power management architecture between an internal network and an external network, the internal network being coupled with the external network by a firewall, the method comprising:
- (a) monitoring a portion of an electrical power distribution system with at least one intelligent electronic device ("IED"), the at least one IED further being coupled with the internal network, the at least one IED further comprising at least one sensor coupled with said portion of said electrical power distribution system and further operative to sense at least one electrical parameter in said portion of said electrical power distribution system and to generate at least one signal indicative thereof;
- (b) generating power management data by the at least one IED based on said at least one signal;
- (c) initiating a first communications of the power management data by the at least one IED to a receiver, the receiver being coupled with the external network; and
- (d) facilitating the initiated first communications through the firewall to the external network for delivery to the receiver.

55. The method of claim 54, further comprising:
- (e) receiving a second communications by the at least one IED from the external network through the firewall.

56. The method of claim 54, wherein the first communications comprises at least one electronic mail message.

57. The method of claim 54, further comprising:
- (e) allowing communications using standard protocols between the internal and external networks by the firewall.

58. The method of claim 54, further comprising:
- (e) restricting communications using standard protocols between the internal and external networks by the firewall.

59. A method of communicating power management data in an electrical power management architecture between an internal network and an external network, the internal network being coupled with the external network by a firewall through which communications between the internal network and external network must travel, the method comprising:
- (a) monitoring a portion of an electrical power distribution system with at least one intelligent electronic device ("IED"), the at least one IED further being coupled with the internal network, the at least one IED further comprising at least one sensor coupled with an electric power system and further operative to sense at least one electrical parameter in said electric power system and to generate at least one signal indicative thereof;
- (b) generating power management data by the at least one IED based on the at least one signal;
- (c) initiating a first communications of the power management data by the at least one IED to a receiver, the receiver being coupled with the external network;
- (d) configuring the internal network to allow the first communications to be transmitted to the external network via the firewall; and
- (e) transmitting the initiated first communications through the firewall to the external network for delivery to the receiver.

60. The method of claim 59, wherein (d) further includes configuring an electronic mail server coupled with the internal network to allow the at least one IED to send electronic mail to the external network using the electronic mail server, the electronic mail server being operative to transmit electronic mail messages from the internal network to the external network via the firewall.

61. The method of claim 59, wherein (d) further includes configuring the firewall to allow the at least one IED to communicate with a communications server coupled with the external network.

62. The method of claim 61, wherein the communications server comprises an electronic mail server.

63. The method of claim 61, wherein the communications server comprises an XML server.

64. The method of claim 59, wherein the first communications is formatted in a computer readable format.

65. The method of claim 64, wherein the receiver comprises a data processing system operative to receive the first communications and automatically process the power management data.

66. The method of claim 59, wherein (c) is performed in response to an occurrence of an event monitored on the power distribution system.

67. The method of claim 59, wherein (c) is performed according to a pre-defined schedule maintained by the at least one IED.

68. The electrical power management architecture of claim 1, wherein the first power management data further comprises an HTTP format.

69. The electrical power management architecture of claim 1, wherein the first power management data further comprises an XML format.

70. The electrical power management architecture of claim 1, wherein the first power management data further comprises a SOAP format.

71. The electrical power management architecture of claim 1, wherein the first power management data further comprises an SSL format.

72. The electrical power management architecture of claim 1, wherein the first power management data further comprises an NNTP format.

73. The electrical power management architecture of claim 1, wherein the first power management data further comprises an FTP format.

74. The electrical power management architecture of claim 1, wherein the first power management data further comprises a MIME format.

75. The electrical power management architecture of claim 1, wherein the first power management data further comprises an S-HTTP format.

76. The electrical power management architecture of claim 3, wherein the first power management data further comprises an HTTP format.

77. The electrical power management architecture of claim 3, wherein the first power management data further comprises an XML format.

78. The electrical power management architecture of claim 3, wherein the first power management data further comprises a SOAP format.

79. The electrical power management architecture of claim 10, wherein the at least one IED retrieves the second power management data using an IMAP protocol.

80. The electrical power management architecture of claim 1, wherein the external network further comprises an external mail server, the at least one IED being further adapted to send the first power management data to the external mail server.

81. The electrical power management architecture of claim 80, wherein the at least one IED retrieves the second power management data using an POP3 protocol.

82. The electrical power management architecture of claim 80, wherein the at least one IED retrieves the second power management data using an IMAP protocol.

83. The electrical power management architecture of claim 1, further comprising a security module coupled with the network interface, the security module further operative to provide authentication of the first power management data prior to communication.

84. The electrical power management architecture of claim 1, wherein the internal network is further coupled with a security module, the security module operative to prevent unauthorized access to the power management data.

85. The electrical power management architecture of claim 16, wherein the at least one IED further comprises the security module.

86. The electrical power management architecture of claim 25, wherein the timesync further comprises the NTP protocol.

87. The electrical power management architecture of claim 51, wherein the mail server uses an IMAP protocol.

88. The electrical power management architecture of claim 51, wherein the at least one electronic mail messages is encrypted.

89. The electrical power management architecture of claim 51, wherein the at least one electronic mail messages is decrypted.

90. The electrical power management architecture of claim 51, wherein the at least one electronic mail messages is authenticated.

91. The electrical power management architecture of claim 51, wherein the at least one electronic mail messages further comprises an SMTP format.

92. The electrical power management architecture of claim 51, wherein the at least one electronic mail messages further comprises an XML format.

93. The electrical power management architecture of claim 51, wherein the at least one electronic mail messages further comprises a CSV format.

94. The electrical power management architecture of claim 51, wherein the at least one electronic mail messages further comprises a MIME format.

95. The electrical power management architecture of claim 51, wherein the at least one electronic mail messages further comprises an IMAP format.

96. The electrical power management architecture of claim 51, wherein the at least one electronic mail messages parameters conform to the requirements of the external mail server.

* * * * *

UNITED STATES PATENT AND TRADEMARK OFFICE
CERTIFICATE OF CORRECTION

PATENT NO. : 6,751,562 C1
APPLICATION NO. : 90/009028
DATED : March 1, 2011
INVENTOR(S) : Andrew W. Blackett et al.

Page 1 of 1

It is certified that error appears in the above-identified patent and that said Letters Patent is hereby corrected as shown below:

In Column 2, line 34, delete "comand" and insert --command--.

In Column 4, line 27, insert --encapsulated-- after "initiated".

In Column 4, line 27, delete "thorugh" and insert --through--.

Signed and Sealed this
Twelfth Day of July, 2011

David J. Kappos
*Director of the United States Patent and Trademark Office*

(12) EX PARTE REEXAMINATION CERTIFICATE (8060th)
United States Patent
Blackett et al.

(10) Number: US 6,751,562 C1
(45) Certificate Issued: Mar. 1, 2011

(54) COMMUNICATIONS ARCHITECTURE FOR INTELLIGENT ELECTRONIC DEVICES

(75) Inventors: Andrew W. Blackett, Victoria (CA); Bryan J. Gilbert, Victoria (CA); John C. Van Gorp, Sidney (CA); Michael E. Teachman, Victoria (CA); Jeffrey W. Yeo, Saanichton (CA)

(73) Assignee: Power Measurement Ltd., Saanichton (CA)

Reexamination Request:
No. 90/009,028, Feb. 11, 2008

Reexamination Certificate for:
Patent No.: 6,751,562
Issued: Jun. 15, 2004
Appl. No.: 09/814,436
Filed: Mar. 22, 2001

Related U.S. Application Data

(63) Continuation-in-part of application No. 09/723,564, filed on Nov. 28, 2000, now Pat. No. 6,961,641.

(51) Int. Cl.
*G06F 19/00* (2006.01)
*G01R 21/00* (2006.01)

(52) U.S. Cl. .......................... 702/61; 340/635; 340/637; 700/286; 700/292

(58) Field of Classification Search .................. None
See application file for complete search history.

(56) References Cited

U.S. PATENT DOCUMENTS

| | | | |
|---|---|---|---|
| 2,119,364 A | 5/1938 | Smith, Jr. |
| 3,153,758 A | 10/1964 | Kusters et al. |
| 3,534,247 A | 10/1970 | Miljanic |
| 4,162,530 A | 7/1979 | Kusui et al. |
| 4,255,704 A | 3/1981 | Milkovic |
| 4,261,037 A | 4/1981 | Hicks |
| 4,422,039 A | 12/1983 | Davis |
| 4,458,307 A | 7/1984 | McAnlis et al. |
| 4,570,217 A | 2/1986 | Allen et al. |
| 4,629,974 A | 12/1986 | Friedi |

(Continued)

FOREIGN PATENT DOCUMENTS

| | | |
|---|---|---|
| EP | 395 495 A | 10/1990 |
| EP | 957 607 A1 | 11/1999 |

(Continued)

OTHER PUBLICATIONS

"Powerlogic® Advanced Power Reliability Solutions," Square D Schneider Electric, brochure, 2000, 6 pages.
"Powerlogic® Circuit Monitor—Series 2000," Class 3020, Square D Schneider Electric, brochure, 6 pages.
"Powerlogic® Power Meter," Class 3020, Square D Schneider Electric, brochure, 1998, 4 pages.

(Continued)

*Primary Examiner*—Colin M Larose

(57) ABSTRACT

A power management architecture for an electrical power distribution system, or portion thereof, is disclosed. The architecture includes multiple intelligent electronic devices ("IED's") distributed throughout the power distribution system to manage the flow and consumption of power from the system. The IED's are linked via a network to back-end servers. Power management application software and/or hardware components operate on the IED's and the back-end servers and inter-operate via the network to implement a power management application. The communications between the IED's and the back-end servers are facilitated through network security devices such as firewalls. The architecture provides a scalable and cost effective framework of hardware and software upon which such power management applications can operate to manage the distribution and consumption of electrical power by one or more utilities/suppliers and/or customers which provide and utilize the power distribution system.

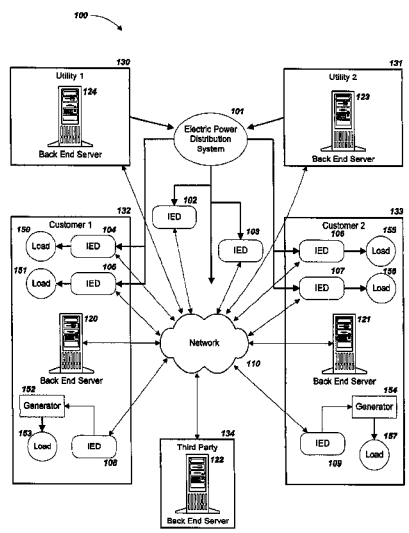

U.S. PATENT DOCUMENTS

| | | |
|---|---|---|
| 4,630,211 A | 12/1986 | Pettis |
| 4,641,248 A | 2/1987 | Suzuki et al. |
| 4,709,339 A | 11/1987 | Fernandes |
| 4,710,692 A | 12/1987 | Libert et al. |
| 4,804,957 A | 2/1989 | Selph et al. |
| 4,841,236 A | 6/1989 | Miljanic et al. |
| 4,884,038 A | 11/1989 | Miljanic |
| 4,967,145 A | 10/1990 | Davies |
| 4,989,155 A | 1/1991 | Begin et al. |
| 5,032,833 A | 7/1991 | Laporte |
| 5,066,904 A | 11/1991 | Bullock |
| 5,237,507 A | 8/1993 | Chasek |
| 5,239,584 A | 8/1993 | Hershey et al. |
| 5,248,967 A | 9/1993 | Daneshfar |
| 5,276,394 A | 1/1994 | Mayfield |
| 5,289,362 A | 2/1994 | Liebl et al. |
| 5,301,122 A | 4/1994 | Halpern |
| 5,307,008 A | 4/1994 | So |
| 5,418,752 A | 5/1995 | Harari |
| 5,530,435 A | 6/1996 | Toms et al. |
| 5,548,527 A | 8/1996 | Hemminger |
| 5,555,508 A | 9/1996 | Munday |
| 5,563,506 A | 10/1996 | Fielden et al. |
| 5,568,398 A | 10/1996 | Trainor |
| 5,604,892 A | 2/1997 | Nuttall et al. |
| 5,627,759 A | 5/1997 | Bearden et al. |
| 5,631,636 A | 5/1997 | Bane |
| 5,642,275 A | 6/1997 | Peng et al. |
| 5,644,514 A | 7/1997 | Abo et al. |
| 5,650,936 A | 7/1997 | Loucks et al. |
| 5,673,316 A | 9/1997 | Auerbach et al. |
| 5,684,466 A | 11/1997 | Keating et al. |
| 5,684,710 A | 11/1997 | Ehlers et al. |
| 5,694,607 A | 12/1997 | Dunstan et al. |
| 5,696,501 A | 12/1997 | Ouellette |
| 5,710,723 A | 1/1998 | Hoth et al. |
| 5,721,689 A | 2/1998 | Hart et al. |
| 5,742,512 A | 4/1998 | Edge et al. |
| 5,745,044 A | 4/1998 | Hyatt et al. |
| 5,754,657 A | 5/1998 | Schopper et al. |
| 5,754,764 A | 5/1998 | Davis et al. |
| 5,758,331 A | 5/1998 | Johnson |
| 5,764,155 A | 6/1998 | Kertesz |
| 5,768,148 A | 6/1998 | Murphy et al. |
| 5,808,558 A | 9/1998 | Meek et al. |
| 5,809,045 A | 9/1998 | Adamiak et al. |
| 5,818,245 A | 10/1998 | Allfather |
| 5,825,656 A | 10/1998 | Moore et al. |
| 5,831,428 A | 11/1998 | Pyle et al. |
| 5,854,994 A | 12/1998 | Canada et al. |
| 5,862,391 A | 1/1999 | Salas et al. |
| 5,874,903 A | 2/1999 | Shuey et al. |
| 5,918,194 A | 6/1999 | Banaska |
| 5,933,092 A | 8/1999 | Ouellette |
| 5,949,230 A | 9/1999 | Kobayashi et al. |
| 5,956,220 A | 9/1999 | Novosel et al. |
| 5,959,818 A | 9/1999 | Blakely |
| 5,964,879 A | 10/1999 | Dunstan et al. |
| 5,978,475 A | 11/1999 | Schneider et al. |
| 5,995,911 A | 11/1999 | Hart |
| 6,000,034 A | 12/1999 | Lightbody et al. |
| 6,018,700 A | 1/2000 | Edel |
| 6,020,734 A | 2/2000 | Grisham et al. |
| 6,021,401 A | 2/2000 | Oravetz et al. |
| 6,023,223 A | 2/2000 | Baxter, Jr. |
| 6,023,769 A | 2/2000 | Gonzalez |
| 6,028,857 A | 2/2000 | Poor |
| 6,046,582 A | 4/2000 | Sanelli et al. |
| 6,052,364 A | 4/2000 | Chalmers et al. |
| 6,061,451 A | 5/2000 | Muratani et al. |
| 6,085,192 A | 7/2000 | Mendez et al. |
| 6,105,093 A | 8/2000 | Rosner et al. |
| 6,112,304 A | 8/2000 | Clawson |
| 6,114,859 A | 9/2000 | Koda et al. |
| 6,115,653 A | 9/2000 | Bergstrom et al. |
| 6,124,806 A | 9/2000 | Cunningham et al. |
| 6,154,710 A | 11/2000 | Kobayashi et al. |
| 6,157,721 A | 12/2000 | Shear et al. |
| 6,172,616 B1 | 1/2001 | Johnson et al. |
| 6,178,362 B1 | 1/2001 | Woolard et al. |
| 6,181,294 B1 | 1/2001 | Porter et al. |
| 6,219,656 B1 | 4/2001 | Cain |
| 6,233,327 B1 | 5/2001 | Petite |
| 6,233,685 B1 | 5/2001 | Smith et al. |
| 6,263,313 B1 | 7/2001 | Milsted et al. |
| 6,272,552 B1 | 8/2001 | Melvin et al. |
| 6,278,357 B1 | 8/2001 | Croushore et al. |
| 6,285,917 B1 | 9/2001 | Sekiguchi et al. |
| 6,292,717 B1 | 9/2001 | Alexander et al. |
| 6,298,376 B1 | 10/2001 | Rosner et al. |
| 6,301,527 B1 | 10/2001 | Butland et al. |
| 6,321,272 B1 | 11/2001 | Swales |
| 6,351,737 B1 | 2/2002 | Williams |
| 6,351,817 B1 | 2/2002 | Flyntz |
| 6,367,023 B2 | 4/2002 | Kling |
| 6,373,238 B2 | 4/2002 | Lewis et al. |
| 6,373,399 B1 | 4/2002 | Johnson et al. |
| 6,373,834 B1 | 4/2002 | Lundh et al. |
| 6,385,022 B1 | 5/2002 | Kulidjian et al. |
| 6,393,341 B1 | 5/2002 | Lawrence et al. |
| 6,397,155 B1 | 5/2002 | Przdatek et al. |
| 6,401,081 B1 | 6/2002 | Montgomery et al. |
| 6,417,661 B1 | 7/2002 | Berkean et al. |
| 6,433,981 B1 | 8/2002 | Fletcher et al. |
| 6,437,692 B1 | 8/2002 | Petite et al. |
| 6,459,175 B1 | 10/2002 | Potega |
| 6,459,997 B1 | 10/2002 | Andersen |
| 6,462,713 B2 | 10/2002 | Porter et al. |
| 6,470,283 B1 | 10/2002 | Edel |
| 6,480,748 B1 | 11/2002 | Gerszberg et al. |
| 6,486,652 B1 | 11/2002 | Ouellette |
| 6,493,644 B1 | 12/2002 | Jonker et al. |
| 6,496,342 B1 | 12/2002 | Horvath et al. |
| 6,512,463 B1 | 1/2003 | Campbell et al. |
| 6,519,509 B1 | 2/2003 | Nierlich |
| 6,535,983 B1 | 3/2003 | McCormack et al. |
| 6,538,577 B1 | 3/2003 | Ehrke et al. |
| 6,550,012 B1 | 4/2003 | Villa et al. |
| 6,553,336 B1 | 4/2003 | Johnson et al. |
| 6,553,418 B1 | 4/2003 | Collins et al. |
| 6,564,332 B1 | 5/2003 | Nguyen et al. |
| 6,571,182 B2 | 5/2003 | Adamiak et al. |
| 6,587,884 B1 | 7/2003 | Papadopoulos et al. |
| 6,590,891 B1 | 7/2003 | Jacquet et al. |
| 6,608,140 B2 | 8/2003 | Christie et al. |
| 6,618,578 B1 | 9/2003 | Petite |
| 6,618,709 B1 | 9/2003 | Sneeringer |
| 6,628,764 B1 | 9/2003 | Petite |
| 6,631,309 B2 | 10/2003 | Boies et al. |
| 6,633,823 B2 | 10/2003 | Bartone et al. |
| 6,640,301 B1 | 10/2003 | Ng |
| 6,640,308 B1 | 10/2003 | Keyghobad et al. |
| 6,646,894 B2 | 11/2003 | Hong et al. |
| 6,650,249 B2 | 11/2003 | Meyer et al. |
| 6,657,552 B2 | 12/2003 | Belski et al. |
| 6,671,586 B2 | 12/2003 | Davis et al. |
| 6,671,635 B1 | 12/2003 | Forth et al. |
| 6,681,156 B1 | 1/2004 | Weiss |
| 6,694,270 B2 | 2/2004 | Hart |
| 6,704,873 B1 | 3/2004 | Underwood |
| 6,714,977 B1 | 3/2004 | Fowler et al. |

| | | |
|---|---|---|
| 6,735,630 B1 | 5/2004 | Gelvin et al. |
| 6,745,138 B2 | 6/2004 | Przydatek et al. |
| 6,751,562 B1 | 6/2004 | Blackett et al. |
| 6,751,563 B2 | 6/2004 | Spanier et al. |
| 6,762,675 B1 | 7/2004 | Cafiero et al. |
| 6,766,143 B1 | 7/2004 | Beckwith |
| 6,775,595 B1 | 8/2004 | Yabutani et al. |
| 6,792,337 B2 | 9/2004 | Blackett et al. |
| 6,801,865 B2 | 10/2004 | Gilgenbach et al. |
| 6,812,716 B2 | 11/2004 | Fawcett |
| 6,813,571 B2 | 11/2004 | Lightbody et al. |
| 6,836,737 B2 | 12/2004 | Petite et al. |
| 6,853,978 B2 | 2/2005 | Forth et al. |
| 6,859,882 B2 | 2/2005 | Fung |
| 6,885,309 B1 | 4/2005 | Van Heteren |
| 6,891,838 B1 | 5/2005 | Petite et al. |
| 6,904,385 B1 | 6/2005 | Budike, Jr. |
| 6,907,546 B1 | 6/2005 | Haswell et al. |
| 6,925,567 B1 | 8/2005 | Hirata |
| 6,961,641 B1 | 11/2005 | Forth et al. |
| 6,968,295 B1 | 11/2005 | Carr |
| 6,985,087 B2 | 1/2006 | Soliman |
| 6,996,154 B2 | 2/2006 | Haas |
| 7,000,021 B1 | 2/2006 | Radhakrishnan et al. |
| 7,024,692 B1 | 4/2006 | Schanze et al. |
| 7,027,773 B1 | 4/2006 | McMillin |
| 7,031,945 B1 | 4/2006 | Doner |
| 7,047,009 B2 | 5/2006 | Laroia et al. |
| 7,050,916 B2 | 5/2006 | Curtis et al. |
| 7,069,161 B2 | 6/2006 | Gristinia et al. |
| 7,079,551 B2 | 7/2006 | Shivnan |
| 7,085,824 B2 | 8/2006 | Forth et al. |
| 7,089,089 B2 | 8/2006 | Cumming et al. |
| 7,117,015 B2 | 10/2006 | Scheinert et al. |
| 7,124,190 B1 | 10/2006 | Moore |
| 7,131,070 B1 | 10/2006 | Motoyama et al. |
| 7,136,913 B2 | 11/2006 | Linderman |
| 7,143,141 B1 | 11/2006 | Morgan et al. |
| 7,181,517 B1 | 2/2007 | Iavergne et al. |
| 7,194,620 B1 | 3/2007 | Hayes |
| 7,251,570 B2 | 7/2007 | Hancock et al. |
| 7,304,587 B2 | 12/2007 | Boaz |
| 7,327,558 B2 | 2/2008 | Kennedy et al. |
| 7,447,762 B2 | 11/2008 | Curray et al. |
| 2001/0002485 A1 | 5/2001 | Bisbee et al. |
| 2001/0015640 A1 | 8/2001 | Hemminger et al. |
| 2001/0038343 A1 | 11/2001 | Meyer et al. |
| 2001/0039537 A1 | 11/2001 | Carpenter et al. |
| 2002/0009301 A1 | 1/2002 | Anand et al. |
| 2002/0017977 A1 | 2/2002 | Wall |
| 2002/0018545 A1 | 2/2002 | Crichlow |
| 2002/0019712 A1 | 2/2002 | Petite et al. |
| 2002/0019725 A1 | 2/2002 | Petite |
| 2002/0027504 A1 | 3/2002 | Davis et al. |
| 2002/0032535 A1 | 3/2002 | Alexander et al. |
| 2002/0046197 A1 | 4/2002 | Kashti |
| 2002/0063635 A1 | 5/2002 | Shincovich |
| 2002/0069076 A1 | 6/2002 | Faris et al. |
| 2002/0071296 A1 | 6/2002 | Hemminger et al. |
| 2002/0094799 A1 | 7/2002 | Elliott et al. |
| 2002/0099955 A1 | 7/2002 | Peled et al. |
| 2002/0103772 A1 | 8/2002 | Chattopadhyay |
| 2002/0109607 A1 | 8/2002 | Cumeralto et al. |
| 2002/0109608 A1 | 8/2002 | Petite et al. |
| 2002/0120685 A1 | 8/2002 | Srivastava et al. |
| 2002/0150110 A1 | 10/2002 | Inbar et al. |
| 2002/0154777 A1 | 10/2002 | Candelore |
| 2002/0163770 A1 | 11/2002 | Shiue et al. |
| 2002/0169643 A1 | 11/2002 | Petite et al. |
| 2002/0178047 A1 | 11/2002 | Or et al. |
| 2003/0001754 A1 | 1/2003 | Johnson et al. |
| 2003/0009401 A1 | 1/2003 | Ellis |
| 2003/0043763 A1 | 3/2003 | Grayson |
| 2003/0055676 A1 | 3/2003 | Huneycutt |
| 2003/0063723 A1 | 4/2003 | Booth et al. |
| 2003/0067725 A1 | 4/2003 | Horvath et al. |
| 2003/0078029 A1 | 4/2003 | Petite |
| 2003/0081790 A1 | 5/2003 | Kallahalla et al. |
| 2003/0098679 A1 | 5/2003 | Odaohhara |
| 2003/0099221 A1 | 5/2003 | Rhee |
| 2003/0110302 A1 | 6/2003 | Hodges et al. |
| 2003/0158826 A1 | 8/2003 | Burke et al. |
| 2003/0160692 A1 | 8/2003 | Nonaka |
| 2003/0174067 A1 | 9/2003 | Soliman |
| 2003/0179135 A1 | 9/2003 | Louhi |
| 2003/0226050 A1 | 12/2003 | Yik et al. |
| 2003/0236903 A1 | 12/2003 | Piotrowski |
| 2004/0001008 A1 | 1/2004 | Shuey et al. |
| 2004/0001532 A1 | 1/2004 | Mason, Jr. et al. |
| 2004/0002878 A1 | 1/2004 | Maria Hinton |
| 2004/0003287 A1 | 1/2004 | Zissimopoulos et al. |
| 2004/0008691 A1 | 1/2004 | Winter et al. |
| 2004/0024717 A1 | 2/2004 | Sneeringer |
| 2004/0128383 A1 | 7/2004 | Hinton |
| 2004/0128547 A1 | 7/2004 | Blakley et al. |
| 2004/0133367 A1 | 7/2004 | Hart |
| 2004/0133529 A1 | 7/2004 | Munster |
| 2004/0134690 A1 | 7/2004 | Norris et al. |
| 2004/0138835 A1 | 7/2004 | Ransom et al. |
| 2004/0143652 A1 | 7/2004 | Grannan et al. |
| 2004/0172535 A1 | 9/2004 | Jakobsson et al. |
| 2004/0203380 A1 | 10/2004 | Hamdi et al. |
| 2004/0203868 A1 | 10/2004 | Eidson |
| 2004/0225878 A1 | 11/2004 | Costa-Requena et al. |
| 2004/0227621 A1 | 11/2004 | Coupe et al. |
| 2004/0229578 A1 | 11/2004 | Lightbody et al. |
| 2005/0055432 A1 | 3/2005 | Rodgers |
| 2005/0065742 A1 | 3/2005 | Rodgers |
| 2005/0114701 A1 | 5/2005 | Atkins et al. |
| 2005/0137981 A1 | 6/2005 | Maes |
| 2005/0144452 A1 | 6/2005 | Lynch et al. |
| 2005/0184882 A1 | 8/2005 | Angelis et al. |
| 2005/0188212 A1 | 8/2005 | Lafarriere et al. |
| 2007/0001868 A1 | 1/2007 | Boaz |
| 2007/0013547 A1 | 1/2007 | Boaz |
| 2007/0285227 A1 | 12/2007 | Timothy et al. |
| 2008/0113672 A1 | 5/2008 | Karr et al. |

FOREIGN PATENT DOCUMENTS

| | | |
|---|---|---|
| GB | 2148565 A | 5/1985 |
| WO | WO 00/42731 | 7/2000 |
| WO | WO 01/33801 A2 | 5/2001 |
| WO | WO 01/59965 A1 | 8/2001 |
| WO | WO 02/39242 A1 | 5/2002 |
| WO | WO 02/075565 A1 | 9/2002 |
| WO | WO 02/080483 A1 | 10/2002 |
| WO | WO 03/047175 A1 | 6/2003 |
| WO | WO 03/107153 A2 | 12/2003 |
| WO | WO 03/107296 A2 | 12/2003 |
| WO | WO 03/107585 A1 | 12/2003 |
| WO | WO 2004/017077 A1 | 2/2004 |
| WO | WO 2004/061462 | 7/2004 |
| WO | WO 2005/008181 | 1/2005 |

OTHER PUBLICATIONS

"Powerlogic® Metering and Monitoring Devices," Square D Scheider Electric, brochure, 2000, 4 pages.

"Powerlogic® Power Monitoring and Control System," Square D Schneider Electric, brochure, 1998, 8 pages.

"Powerlogic® Series 4000 Circuit Monitor," Square D Schneider Electric, brochure, 2000, 6 pages.

"Digest," Square D Schneider Electric, product catalog, Mar. 2000, 10 pages.

"Powerlogic® Series 4000 Circuit Monitor Now Available with Ethernet Communications Card," Square D Schneider Electric, News Release, Jul. 20, 2000, 2 pages.

"Powerlogic® Series 4000 Circuit Monitor," Square D Schneider Electric, brochure, Apr. 2000, 6 pages.

"Powerlogic® Ethernet Communication Card," Square D Schneider Electric, brochure, Aug. 2000, 2 pages.

"Powerlogic® Circuit Monitor Series 4000," Square D Schneider Electric, Instruction Bulletin, Feb. 2000, 264 pages; and specifially, "Chapter 6—Communications Connections" (pp. 57–70).

"Powerlogic® Ethernet Communication Card," Square D Schneider Electric, brochure, Nov. 2004, 2 pages.

"Powerlogic® Ethernet Communications Card," Schneider Electric, Instruction Bulletin No. 63230–304–200, Sep. 2000, 70 pages.

"Powerlogic® Circuit Monitor Series 4000 Installation Manual," Schneider Electric, Instruction Bulletin No. 63230–300–209B1, Dec. 2005, 110 pages.

"Powerlogic® Circuit Monitor Series 4000 Installation Manual," Schneider Electric, Instruction Bulletin No. 63230–300–212B1, Dec. 2005, 234 pages.

"Powerlogic® Ethernet Communications Card," Schneider Electric, Instruction Bulletin No. 63230–314–202A4, Jan. 2006, 14 pages.

"Powerlogic® Ethernet Communications Card," Schneider Electric, Instruction Bulletin No. 63230–304–204A4, Jan. 2006, 46 pages.

"8400 ION, 8500 ION Advanced Socket–Mount Meter," 8400 ION, TM 8500 ION.TM, Power Measurement, Datasheet (Nov. 30, 2000).

"A Case Study Review of Technical and Technology Issues for Transition of a Utility Load Management Program to Provide System Reliability Resources in Restructured Electricity Markets" by G.H. Weller of Weller Associates under contract to Southern California Edison, dated Jul. 2001.

"Advanced Utility Meeting, Period of Performance: Apr. 23, 2003–Sep. 22, 202;" Architectural Energy Corp. at Boulder, Colorado, National Renewable Energy Laboratory, published Sep. 2003.

"High–Security SCADA LDRD Final Report", Rolf Carlson, Apr. 2002, pp. 1–20, XP002375457, Albuquerque, New Mexico, Livermore, California, URL: www.sandia.gov/scada/documents/020729.

"ION System Security," Power Measurement, Technical Note (Dec. 15, 2003).

"Security and Encryption for AMR Communications" presentation at Transmission, Distribution and Metering Conference, Apr. 21–24, 2002 at Dallas, Texas by SmartSynch Inc.

AEV Advanced Energy Vision, one page, no date.

Allen–Bradley, Your Solution for Power & Energy Management, Rockwell Automation, 9 pages, © 19xx Rockwell International Corporation, Jan. 2000.

Application Brief, Circadian Information Systems: Circadian Integrates Pi™ With EnterpriseOne™, 6 pages, http://www.circadianinfosystems.com/. © 2000 Circadian Information Systems.

Automated Energy News Brief, 2 pages, Oklahoma, © Automated Energy Inc. 2002.

Bentek Energy, LLC Launch ETA, RateMiner Energy Tariff, Solutions, 8 pages, Jun. 17, 2003.

Byman et al., Using Distributed Power Quality Monitoring for Better Electrical System Management, IEEE Transactions on Industry Applications, vol. 36, No. 5, Sep./Oct. 2000, pp. 1481–1485.

Class 3000, POWERLOGIC® Engineered Solutions Billing Module, http://www.powerlogic.com, 2 pages, Square D, Schneider Electric, Tennessee, © 1999.

Dallas Semiconductor "About Maxim" information sheet, obtained Sep. 16, 2004 from http://www.maxim–iccom/company, 2 pages.

Dallas Semiconductor "DS2432™ 1k–Bit Protected 1–Wire EEPROM with SHA–1 Engine", product specifications, pp. 1–30.

Data Loggers & Profile Loggers Sub–Metering Systems kWh Meters & Multi–Parameter Meters Energy & Power Quality Analysers Power Factor Correction, MeterRing™ 2000 Software. Copyright 2001, 3 pages.

Dave Farber, Interesting–People Message "IP: Ultrawideband Squeezes In", dated Aug. 16, 2002, pp. 1–4, printed Jul. 1, 2004.

David G. Leeper, Scientific American.com, Wireless Data Blaster, dated May 4, 2002, pp. 1–4, obtained from http://www.sciam.com/print_version.cfm?articleID=0002D51D–0A78–1CD4–B4A8809EC5, printed Jul. 1, 2004.

Dr. Fontana, Multispectral Solutions, Inc.—History of UWB Technology—"A Brief History of UWB Communications" pp. 1–10, printed Jul. 1, 2004.

Eka Systems, Inc., Reliable wireless sensor and control networks, Product Specifiction, Energy Insight™, 2 pages, Maryland, Aug. 22, 2002.

Electrex, "New Eco Logger" brochure, 3 pages.

Elster "Elster Electricity Announced New EnergyAxis® System with Intelligent Two–Way Communications" Corporate profile, © 2003 by Elster Electricity, LLC, Raleigh, NC, Aug. 2003, 1 page.

Elster "REX™ Meter ", Specifications, © by Elster Electricity, LLC, Raleigh, NC, Aug. 2003, 2 pages.

Elster Press Release Sep. 8, 2003, "Elster Electricity Introduces EnergyAxis® System for Residential and Small C&I Metering Automation", Elster Electricity, LLC, Raleigh, NC, 2 pages.

Elster, "A3 ALPHA® Meter With Network Collector Capabilities", Specifications, © 2003 by Elster Electricity, LLC, Raleigh, NC, Aug. 2003, 2 pages.

Elster, EnergyAxis® System Architecture, 1 page.

Elster, "EnergyAxis® System Technology to Empower Utilities," brochure, Elster Electricity, LLC, Raleigh, NC, 6 pages.

Energetics Media Kit, www.energetics.com.au, www.envinta.com, 20 pages, Australia, USA, UK, Energetics Pty Ltd—Mar. 2003.

Energy Profiler Online™ Energy Insight for Your Most Valuable Customers, 2 pages, ABB Inc., www.abb.com Califronia, © 2001 ABB Inc.

EnergyView™ "Energy Aggregation & Information System (EAIS) for Monitoring and Analysis of Electric and Gas Demand", selected pages from an EnergyView website http://66.64.38.69/energyview, pp. 1–4, Oct. 30, 2001.

Enerwise Global Technologies—Enerwise Options Alarming & Notification and Cost Estimation, 2 pages, http://www.enerwise.com/docs/, Pennsylvania, Sep. 16, 2002.

Engagenetworks, eBilling [Electronic Billing], 2 pages, www.engagenet.com, Wisconsin, © engagenetworks, copyright 2000, 2001.

Excelergy® Product Overview, 3 pages, Massachusetts, Jun. 20, 2003.

FAQs for Metrix, What does Metrix do? 9 pages, Jun. 17, 2003.

Gale, "The use of GPS for precise time tagging of power system disturbances and in overhead line fault location," Feb. 8, 1994, IEEE, Developments in the Use of Global Positioning Systems; pp. 5/1, 5/2.

Harpham et al, "Time Synchronous end–to–end relay testing," Apr. 11–13, 1989, Fourth International Conference on Developments in Power Protection, pp. 244–249.

Ian Cameron, Electronics Times, "Ultrawideband radio attacks spectrum drought", dated Sep. 26, 2002, 5 pages.

Ilsco 'KUP–L–TAP® brochure, Ilsco, Cincinnati, Ohio, pp. 201–204.

Internet Technology Aids Plant Operations, Power Engineering (Aug. 1998).

Kezunovic et al., "Automated Transmission line fault analysis using synchronized sampling at two ends," May 7–12, 1995, 1995 IEEE Power Industry Computer Application Conference, pp. 407–413.

Kezunovic et al., "Synchronized sampling improves fault location," Apr. 1995, IEEE Computer Applications in Power, vol. 8, issue 2, pp. 30–33.

Kreiss Johnson brochure, "Open advancing substation automation", © 2003 Kreiss Johnson Technologies, Inc., San Diego, CA, 13 pages.

Kreiss, David. Utilities Can Enhance Bottom–Line by Leveraging Non–Operational Data, availabe at http://www.kjt.com/pdf/092003_Non–operational–data.pdf, 4 pages, © 2003 Kreiss Johnson Tech., Inc.

Kreiss, David. Utility Automation, Global Energy Solutions, available at http://www.kjt.com/pdf/092003_Non–operational–data.pdf, 4 pages, © 2003 Kreiss Johnson Tech., Inc.

Lodestar BillingExpert® v3.5, If You Can Sell It, We Can Bill It, www.lodestarcorp.com, 2 pages, United State, United Kingdom, Australia, Copyright © 2003.

Lodestar Financial Management Extension™ v3.5, Accelerate your Cashflow, www.lodestarcorp.com, 2 pages, United States, United Kingdom, Australia, Copyright © 2003.

Lodestar RateExpert® Reduce Cost with Advanced Rate Analysis, www.lodestarcorp.com, 2 pages, United States, United Kingdom, Australia, Copyright © 2003.

Merrian_Webster Online, Retrieved from the Internet: URL:http://www.m–w.com/dictionary/driver, pp. 2.

Meter, monitor, act, real–time decision about your utility purchases, use and costs, Envision™ turn data into decisions, http://envision.opg.com, 14 pages, © 2001 Ontario Power Generation Inc. Mar. 2002.

Motorola Preliminary Information Application Brief, "Electronic Energy Meter with Powerline Modem On DSP56F80x," undatead, 2 pages.

Newsbytes Inc., Tampa, FLA, Apr. 13, 1995 pNEW04130013 "TECO & IBM—The "Smart House" Is Here" Press release, obtained at http://filebox.vt.edu/users/mikemike/smart–house/infotract/article4.txt, Jul. 11, 2002, pp. 1&2.

Oarsman Corporation, Simple Screen Organization, 2 pages, Jun. 17, 2003.

OMRMX product specifications, Landis+Gyr, Lafayette, IN, document date Dec. 5, 2003, 2 pages.

OntarioPower Generation, Energy Solutions, Envision FAQ, 6 pages, Jun. 20, 2003.

Patrick Mannion, CommsDesign EE Times "Ultrawideband facts and fictions", dated Feb. 1, 2002, pp.1–4, printed Jul. 1, 2004.

Paul Daigle, "All–Electronic Power and Energy Meters, " Analog Dialogue 33–2 (1999 Analog Devices).

PCT International Search Report for Application No. PCT/US04/23006.

PCT International Search Report PCT/CA2004/000705.

PCT International Search Report PCT/IB2004/000720.

Product brochure, S4 IDR SmartMeter by Itron, copyright 2003.

Ramar® TransPodIT® product specifications, Ramar, Research Triangle Park, NC, document date Sep. 12, 2002, 2 pages.

RSEnergyMetrix, Technical Data, Rockwell Software, 4 pages, www.software.rockwell.com, www.rockwellautomation.com, Wisconsin, © 2002 Rockwell Software, Inc.

SAIC, News Release, SAIC's Enerlink Division Announces Latest Generation of BillGen®, Complex Billing Engine, http://www.saic.com/, 2 pages, Georgia, May 24, 1999.

Schneider Electric Square D "Web–Enabled Power Management Solutions" brochure, pp. 1–8, Jan. 2002.

Series 5500 Infonode® User's Guide; Dranetz–BMI, Revision D, 1992, 2002, 2004, pp. i–A12.

Sezi, T; Duncan; "New Intelligent Electronic Devices Change the Structure of Power Distribution"; $34^{th}$ Annual IEEE Industry Applications Conference; vol. 2; Oct. 3–7, 1999; pp. 944–952.

Silicon Energy, when it really matters . . . , Cost Analyst, 1 page, Jun. 16, 2003.

Silicon Energy, when it really matters . . . , Rate Engine, 1 page, Jun. 16, 2003.

Stark, Energy Informaton Systems, Products, Audit Trail, 2 pages, Jun. 20, 2003.

Stark, Energy Information Systems, Products, Monitoring & Targeting software for multi–site organizations, Energy Information using directly collected data, Energy Accounting for analysing information on utility bills and manual meter reading SHM Metering systems & high quality data loggers, "Electronic Billing," 3 pages, Jun. 20, 2003.

Stark, Energy Information Systems, Stark Essentials—Entry–level Monitoring & Targeting software for multi–site organisations, Stark RT—Energy information using directly collected data, Stark EA—Energy Accounting for analysing information on utility bills and manual meter readings, Stark SHM—Metering systems & high quality data loggers, Stark Online—Easy Reporting on all your utility supplies; "Stark Essentials 1 of 2," 2 pages, Jun. 20, 2003.

Stark, Energy Information Systems, Stark Essentials—Entry–level Monitoring & Targeting software for multi–site organisations, Startk RT—Energy information using directly collected data, Start EA—Energy Accounting for analysing information on utility bills and manual meter readings, Stark SHM—Metering systems & high quality data loggers, Stark Online—Easy Reporting on all your utility supplies; "Stark Essentials 2 of 2," 2 pages, Jun. 20, 2003.

Stark, Energy Information Systems, Stark Essentials—Entry–level Monitoring & Targeting software for multi–site organisations, Start RT—Energy information using directly collected data, Start EA—Energy Accounting for analysing information on utility bills and manual meter readings, Stark SHM—Metering systems & high quality data loggers, Stark Online—Easy Reporting on all your utility supplies; "Stark Essential Levels 2 and 3," 3 pages, Jun. 20, 2003.

Tatum, Energy Information: The Internet Connection, Building Operating Management, Sep. 2001.

Tele–Service News, dated Aug. 2002, Section: No. 8, vol. 14—"Ultra–Wideband Growth Predicted to Explode", 1 page.

The Institute of Electrical and Electronics Engineers, Inc., "IEEE Standard Requirements for Instrument Transformers," IEEE Std C57 . 13–1993, New York.

United States Patent and Trademark Office final Office Action dated Jun. 5, 2008 for U.S. Appl. No. 10/666,398.

Vykon™ Building "Web Supervisor™" Product Data Sheet, pp. 1–2, Nov. 30, 2001.

Vykon™ By Tridium JACE–512™ JACE–512–UI™ Product Data Sheet, pp. 1–2.

W.J.M. Moore & P.N. Miljanic, "The Current Comparator," IEE Electrical Measurment Series 4, 1988, London.

WebGen Systems, Presentation—WebGen's Intelligent Use of Energy (IUE)™ System, http://www.webgensystems.com/mktportal/index.htm, 3 pages, © WebGen, Inc.

File history of U.S. Appl. No. 09/814,436, filed Mar. 22, 2001.

Abandoned U.S. Appl. No. 08/798,723.

Markman Order, *Square D. Co.* v. *E.I. Elecs.*, No. 06 c 5079 (N.D. III. Feb. 9, 2010).

Gunther et al., "Application of Advanced Algorithms and Internet Communications Technology at the Point of Power Measurements," http:/www.pqmonitoring.com/papers/ieeesm/, IEEE Summer Meeting 1999, Jul. 20, 1999, 23 pages.

"GE kV2 Multifunction Electricity Meter," GE Industrial Systems, GEH–7277, Product Description, Operating Instructions, Maintenance Instrurctions, Upgrading, Site Analysis Guides, Diagrams, Dec. 2000.

"GE kV2 Multifunction Meter," GE Industrial Systems, GEH–7278, Features and Applications.

"PowerPlus Alpha® Meter," *ABB Network Partner*, brochure (May 1997) (6 pages).

QUAD4® Plus/MAXsys™ *Products User's Guide*, Chapter 1 Overview (2 pages).

"Alpha Stars™, National Wireless Communications for Remote Metering," *ABB Information Systems*, Bulletin (24 pages).

"AIN Alpha, High Function Multi–Tariff Solid State Electricity Meter," *ABB Network Partner*, PB 42–280–1b, pp. 1–20.

"Alpha Solid State Polyphase Meter (Watts, VARs, VA), " *ABB Network Partner*, Product Bulletin, Sep. 15, 1995 (12 pages).

"Powerlogic® Series 4000 Circuit Monitor," Square D/Schneider Electric, Bulletin No. 3020HO0001, Apr. 2000 (6 pages).

"Web–Enabled Power Management Solutions," Square D/Schneider Electric, Product Brochure, Jan. 2002 (8 pages).

ABB Alpha Solid State Polyphase Meter, Product Bulletin 420–270–B, Sep. 15, 1995.

Dranetz Power Platform® PP1 & PP1E with TASKCard®–8000 Operator's Manual Revision A, Apr. 15, 1997.

Dranetz Power Platform® 4300 with TASKCard® 808 User's Guide, pps. ii–146, Jul. 1998.

Deposition of Erich W. Gunther, pp. 1–250, Nov. 14, 2008.

Dranetz Brochure, "Total Electrical System Management 8000–2", pp. 1–3.

Dranetz Power Platform® PP1 and PP–1E TASKCard®—PQPlus Operator's Manual Revision A, Apr. 15, 1997.

Dranetz Brochure, "Tomorrow's Technology Working for You Today", pp. 1–11, 1994.

BMI Brochure, "PowerProfiler™ 3030(A)", pp. 1–2, 1994.

BMI 3030/3060 Power Profiler User's Guide, pp. 1–8, 1990.

Dranetz OM–PC–PP1 PC PP1 Communication and Analysis Software Operator's Manual, pp. 1–6, Mar. 15, 1994.

Dranetz Brochure, "Power Platform® PP1–R", pp. 1–2.

Dran–SCAN® 2000 Version3.x, Power Quality Monitoring System Installation and Startup Guide, pp. ii–43, Nov. 1998.

Dranetz Power Platform® PP1–R User's Guide Revision A, Nov. 1998.

Dranetz Brochure, "Power Platform 4300 with TASKCard 808 Demand/Energy and Harmonic Analysis", pp. 1, 1996.

Dranetz Power Platform® Model 4300 TASKCard® PQLite Operator's Manual Revision A, Jan. 15, 1997.

Dranetz Power Platform® 4300 TASKCard® PQLite User's Guide Revision B, May 1, 2002.

7100/7100S PQNode® User's Guide, pp. iii–33, 1998.

8010 PQNode User's Guide, Revision A, pp. iii–33, 1998.

Power Measurement Ltd., 3720 ACM Advanced Power Instrumentation Package, pp. 1–12, Sep. 14, 1992.

Brochure, Model 3600A Power Line Distrubance Monitor, pp. 1–5.

Liebert Brochure, Model 3600A Portable Programmable Power Line Disburbance Monitor, pp. 1–2, 1985.

Franklin Electric Service Manual for Model 3600 Power Line Disturbance Monitor, pp. 1–28.

Brochure, "DataNodes™ EPQ Series, A Clear and Open Window to Enhanced Power Quality, Energy and More", pp. 1.

Melhorn et al., "Accessing Power Quality Information and Monitoring Results Using the World Wide Web or a Private Corporate Web", pp. 1–12.

Dranetz Series 5500 InfoNode® User's Guide Revision D, 1999.

Signature System™ Brochure, "Information. Knowledge. Power.", pp. 1–9, 1999.

Dranetz Series 5500 DualNode User's Guide Revision C, 2002.

Dranetz EPQ DataNode® Series User's Guide Revision D, 2000.

Dranetz Power Platform, PP1 SM–PP1 Service Manual, Feb. 1, 1995.

Dranetz Power Platform 4300 Service Manual, Revision B, May 1, 2002.

kV S–Base Meters, pp. 1–2, Sep. 1999.

GE kV Vector Electricity Meter, Product Description, Option Board Installation Procedures, Operating Instructions, Maintenance Instructions and Cite Analysis Guides, 1997.

Manual "kV Vector Electricity Meter with the Site Genie Monitor".

Gunther et al., "Application of Advanced Characterization Alogrighms, UCA and Internet Communications Technology At the Point of Power Quantity and Quality Measurement", *Presented at EPRI 1999 PQA Conference, Charlotte, NC*, pp. 1–16, 1999.

Dranetz Series 5500 InfoNode User's Guide, Revision D, 2000.

Dranetz Power Evaluation Software User's Guide, Revision H, 2000.

Dranetz Brochure, "Series 626 Universal Disturbance Analyzer", pp. 1–16.

Dranetz 8800 PowerScope® User's Guide, 1992.

Manual, "TM–115000–G1 vol. 2—Service Manual Model 658 Power Quality Analzyer, Revision A," Mar. 1, 1995.

Dranetz 658 PQ Analyzer User's Guide, Revision A, Feb. 15, 1997.

Dranezt Brochure, "Power Platform 4300 Handheld Power Analysis", pp. 1–6, 1995.

"Electronic Energy Meter with Powerline Modem on DSP56F80x", Preliminary Information Application Briefs, pp. 1–2, 2000.

Square D Bulletin, "Powerlogic® Series 4000 Circuit Monitor", pp. 1–6, Apr. 2000.

Square D Bulletin, "Powerlogic Ethernet Communication Card", pp. 1–2, Aug. 2000.

"Powerlogic® Ethernet Communications Card," Square D Schneider Electric, Instruction Bulletin, Sep. 2000, 59 pages.

"Powerlogic® Series 4000 Circuit Monitor," Square D Schneider Electric, brochure, Apr. 2000, 6 pages.

"Powerlogic® Circuit Monitor Series 4000, Instruction Bulletin No. 63230–300–200, Feb. 2000 Now Available with Ethernet Communications Card," Square D Schneider Electric, News Release, Jul. 20, 2000, 282 pages.

Report of Richard Bingham dated Jun. 18, 2009 (pp. 1–56 of 71 (56 pages), and Appendix A (9 pages) (65 pages total)).

Report of Michael O. Warnecke dated May 27, 2009.

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 34-50 are cancelled.

Claims 1, 51, 53, 54 and 59 are determined to be patentable as amended.

Claims 2-33, 52, 55-58 and 60-96, dependent on an amended claim, are determined to be patentable.

1. An electrical power management architecture comprising:
   at least one intelligent electronic device ("IED") coupled with a portion of an electrical power system and further coupled with an internal network;
   the at least one IED further comprising at least one sensor coupled with the portion of the electrical power system and further operative to sense at least one electrical parameter in the portion of the electrical power system and generate first power management data related thereto;
   a firewall, the firewall operative to securely couple an external network with the internal network, *wherein the first power management data is of an unknown machine-to-machine network communications protocol form unable to be communicated via the firewall without reconfiguration thereof;* and
   a network interface operative to couple the at least one IED with the internal network and facilitate a communications, initiated by the at least one IED, of the first power management data through the firewall from the internal network to the external network, *the at least one IED being operative to configure the communications such that no reconfiguration of the firewall is required to communicate via the firewall by encapsulating the first power management data in a protocol intended for human readable communications capable of being communicated via the firewall without reconfiguration thereof.*

51. An electrical power management architecture comprising:
    at least one intelligent electronic device ("IED") coupled with a portion of an electrical power system and further coupled with an internal network;
    the at least one IED further comprising at least one sensor coupled with said electrical power system and further operative to sense at least one electric parameter in said portion of said electrical power system and to generate power management data related thereto;
    a firewall operative to couple an external network with the internal network;
    a mail server coupled with the internal network and operative to facilitate communications of electronic mail messages between the external network and the internal network, *the mail server being operative to configure the communications of electronic mail messages such that no reconfiguration of the firewall is required to communicate via the firewall*;
    a network interface operative to couple the at least one IED with the internal network and further operative to communicate with the mail server, the mail server being operative to communicate through the firewall, and further wherein the mail server is operative to initiate communications of at least one of the electronic mail messages comprising the power management data from the internal network to the external network.

53. An electrical power management architecture for managing an electrical power distribution system comprising:
    [a] *an internal* network;
    at least one intelligent electronic device ("IED") coupled with a portion of said electrical power distribution system and further coupled with said *internal* network, each of said at least one IED operative to implement a power management function in conjunction with said portion of said electrical power distribution system, said power management function operative to respond to at least one power management command and generate power management data, *the power management data being of an unknown machine-to-machine network communications protocol form unable to be communicated via a firewall without reconfiguration thereof,* each of said at least one IED comprising:
       a first network interface operative to couple said at least one IED with said *internal* network and facilitate transmission of said power management data and receipt of said at least one power management comand over said network;
       a security module coupled with said first network interface and operative to prevent unauthorized access to said power management data; and
       a protocol stack, said protocol stack including an application layer comprising at least one application operative to punch through [a] *the* firewall, *operative to securely couple an external network with the internal network,* to facilitate said transmission of said power management data *initiated by the at least one IED through the firewall from the internal network to the external network by encapsulating the power management data in a protocol intended for human readable communications capable of being communicated via the firewall without reconfiguration thereof*;
    at least one sensor coupled with said portion of said electrical power system and further operative to sense at least one electrical parameter in said portion of said electrical power distribution system, said IED being operative to generate said power management data related thereto;
    said architecture further comprising:
       a power management application coupled with said *external* network and operative to receive and process said power management data from said at least one IED and generate said at least one power management command to said at least one IED to implement said power management function.

54. A method of communicating power management data in an electrical power management architecture between an internal network and an external network, the internal network being coupled with the external network by a firewall, the method comprising:

(a) monitoring a portion of an electrical power distribution system with at least one intelligent electronic device ("IED"), the at lest one IED further being coupled with the internal network, the at least one IED further comprising at least one sensor coupled with said portion of said electrical power distribution system and further operative to sense the at least one electrical parameter in said portion of said electrical power distribution system and to generate at least one signal indicative thereof;

(b) generating power management data by the at least one IED based on said at least one signal, *the power management data being of an unknown machine-to-machine network communications protocol form unable to be communicated via the firewall without reconfiguration thereof*;

(c) initiating a first communications of the power management data by the at least one IED to a receiver, the receiver being coupled with the external network; and (d) facilitating the initiated first communications through the firewall to the external network for delivery to the receiver, *the first communications being configured by the at least one IED such that no reconfiguration of the firewall is required to communicate via the firewall by encapsulating the power management data in a protocol intended for human readable communications capable of being communicated via the firewall without reconfiguration thereof.*

59. A method of communicating power management data in an electrical power management architecture between an internal network and an external network, the internal network being coupled with the external network by a firewall through which communications between the internal network and external network must travel, the method comprising:

(a) monitoring a portion of an electrical power distribution system with at least one intelligent electronic device ("IED"), the at least one IED further being coupled with the internal network, the at least one IED further comprising at least one sensor coupled with an electric power system and further operative to sense at least one electrical parameter in said electric power system and to generate at least one signal indicative thereof;

(b) generating power management data by the at least one IED based on the at least one signal, *the power management data being of an unknown machine-to-machine network communications protocol form unable to be communicated via the firewall without reconfiguration thereof*;

(c) initiating a first communications of the power management data by the at least one IED to a receiver, the receiver being coupled with the external network;

(d) configuring the internal network to allow the first communications to be transmitted to the external network via the firewall, *the first communications being configured by the at least one IED such that no reconfiguration of the firewall is required to communicate via the firewall by encapsulating the first communications in a protocol intended for human readable communications capable of being communicated via the firewall without reconfiguration thereof*; and (e) transmitting the initiated first communications thorugh the firewall to the extended network for delivery to the receiver.

\* \* \* \* \*